(12) United States Patent
Ohbayashi et al.

(10) Patent No.: US 7,589,566 B2
(45) Date of Patent: Sep. 15, 2009

(54) SEMICONDUCTOR DEVICE PROVIDED WITH ANTENNA RATIO COUNTERMEASURE CIRCUIT

(75) Inventors: Shigeki Ohbayashi, Tokyo (JP); Hiroaki Suzuki, Tokyo (JP); Koichiro Ishibashi, Tokyo (JP); Hiroshi Makino, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 729 days.

(21) Appl. No.: 11/290,805

(22) Filed: Dec. 1, 2005

(65) Prior Publication Data

US 2006/0119395 A1 Jun. 8, 2006

(30) Foreign Application Priority Data

Dec. 3, 2004 (JP) ............................. 2004-351560
Oct. 18, 2005 (JP) ............................. 2005-303160

(51) Int. Cl.
*H03K 19/00* (2006.01)
*H01L 25/00* (2006.01)
*H01L 23/62* (2006.01)

(52) U.S. Cl. ...................... 326/101; 326/121; 257/356; 257/357

(58) Field of Classification Search ................ 326/101, 326/119, 121; 257/356, 357, 371
See application file for complete search history.

(56) References Cited

U.S. PATENT DOCUMENTS 6,410,964 B1 * 6/2002 Shida ......................... 257/356

FOREIGN PATENT DOCUMENTS

JP 06-061440 B1 3/1994

* cited by examiner

*Primary Examiner*—Daniel D Chang
(74) *Attorney, Agent, or Firm*—McDermott Will & Emery LLP

(57) ABSTRACT

A CMOS LSI includes an inverter including first and second MOS transistors, a relatively long metal interconnection connected to an input node of the inverter, first and second diodes releasing charges born by the metal interconnection during a plasma process to first and second wells, and first and second MOS transistors maintaining a voltage between the first and second wells at a level not higher than a prescribed voltage. Therefore, even when an antenna ratio is high, a gate oxide film in the first and second MOS transistors is not damaged during the plasma process.

29 Claims, 41 Drawing Sheets

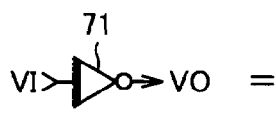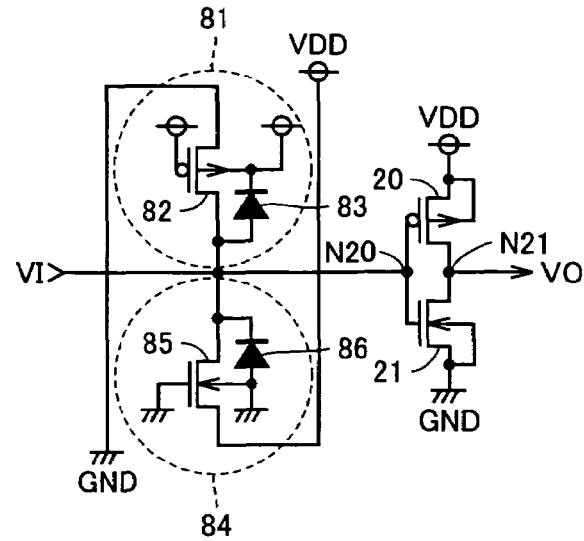
FIG.34A FIG.34B
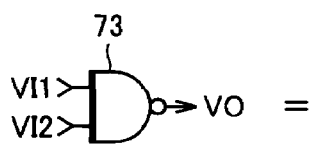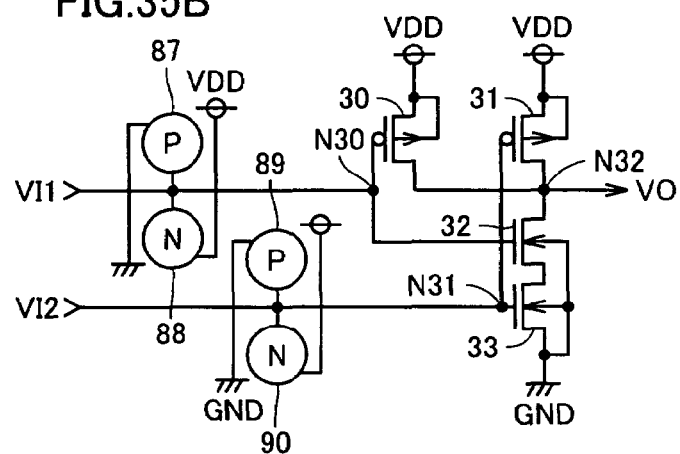
FIG.35A FIG.35B
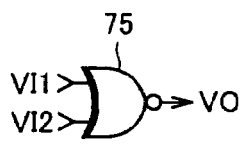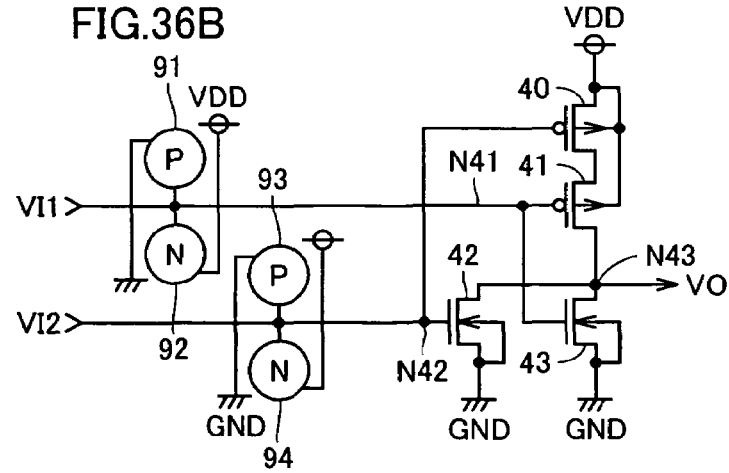
FIG.36A FIG.36B FIG.39A
FIG.39B
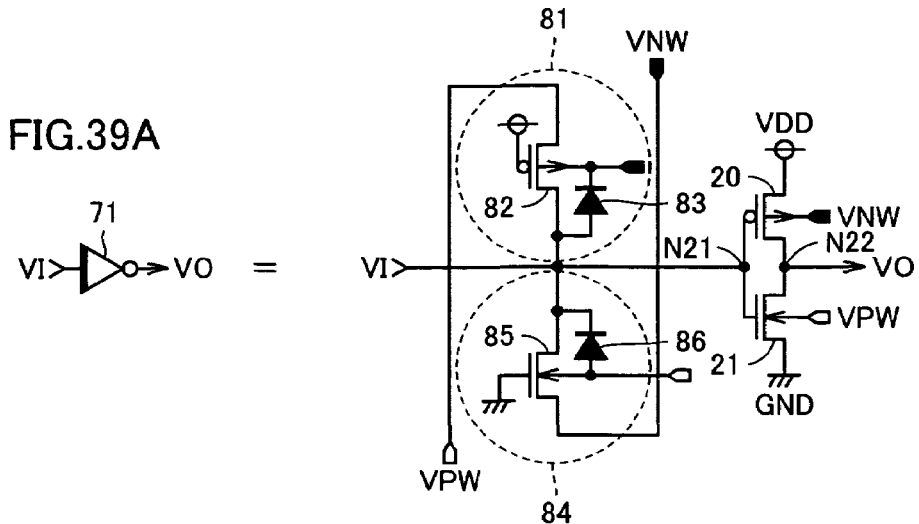
FIG.40A
FIG.40B
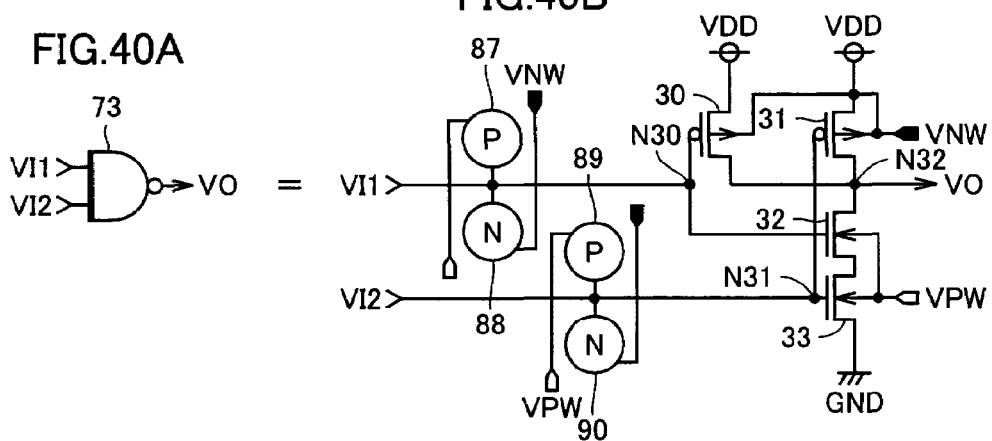
FIG.41A
FIG.41B
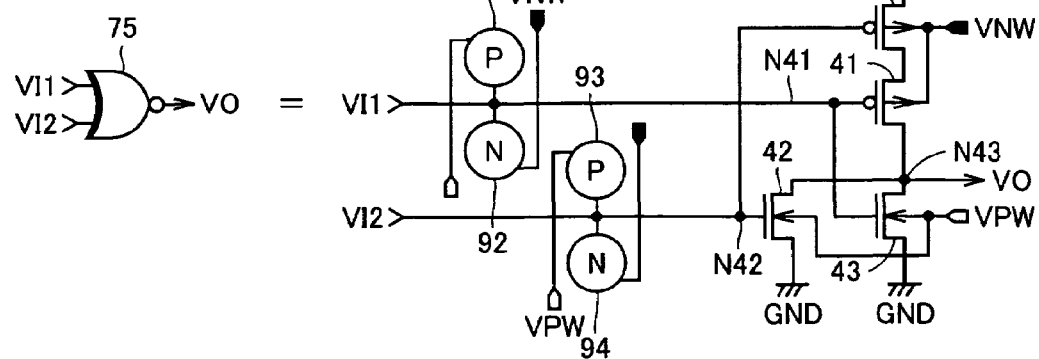

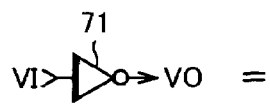
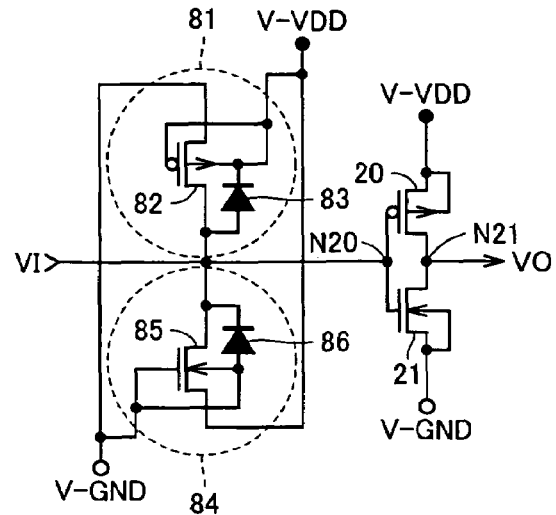
FIG.49A FIG.49B
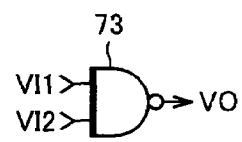
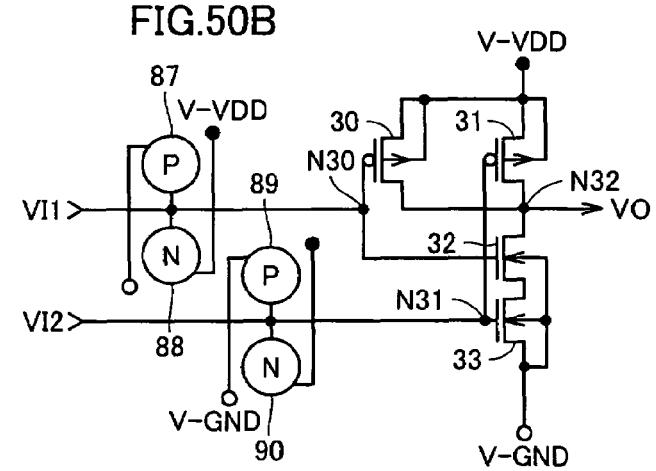
FIG.50A FIG.50B
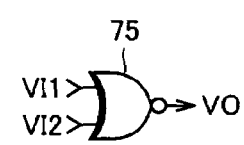
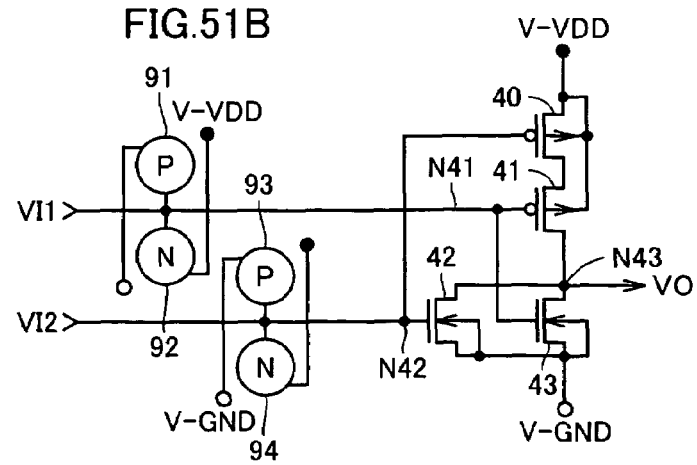
FIG.51A FIG.51B

SEMICONDUCTOR DEVICE PROVIDED WITH ANTENNA RATIO COUNTERMEASURE CIRCUIT

BACKGROUND OF THE INVENTION

1. Field of the Invention

The present invention relates to a semiconductor device, and more particularly to a semiconductor device including an antenna ratio countermeasure circuit.

2. Description of the Background Art

Conventionally, it has been known that, when an antenna ratio exceeds a certain value in a CMOS LSI, a gate oxide film in an MOS transistor is damaged during a plasma process and a characteristic of the MOS transistor is deteriorated. Here, the antenna ratio refers to a ratio between a surface area of a metal interconnection, a via hole and the like that are electrically charged during the plasma process and an area of the gate oxide film connected thereto.

In order to address this problem, a first method, in which a layout of the metal interconnection, the MOS transistor and the like is devised so as to achieve the antenna ratio equal to or smaller than the prescribed value, and a second method, in which a diode is connected between the gate of the MOS transistor and a line of a power supply voltage or a ground voltage so as to release charges born by the gate, are available (see, for example, Japanese Patent Laying-Open No. 06-061440). According to the second method, even when the antenna ratio is infinite, the gate oxide film in the MOS transistor is not damaged.

Even if the second method is adopted, however, the gate oxide film in the MOS transistor is damaged during the plasma process, as the MOS transistor is reduced in size.

If both of the first method and the second method are adopted, damage to the gate oxide film can be prevented. In this case, however, the layout is restricted in order to achieve the antenna ratio not larger than the certain value, and the degree of freedom in process development is lowered due to necessity to consider plasma damage.

SUMMARY OF THE INVENTION

From the foregoing, a primary object of the present invention is to provide a semiconductor device free from plasma damage even when an antenna ratio is high.

A semiconductor device according to the present invention includes: a first well of a first conductivity type formed on a surface of a semiconductor substrate and receiving a first voltage; a second well of a second conductivity type formed on the surface of the semiconductor substrate and receiving a second voltage; a logic circuit including a first transistor of the second conductivity type formed on a surface of the first well and receiving an input signal at its gate and a second transistor of the first conductivity type formed on a surface of the second well and having its gate connected to the gate of the first transistor; a first diode formed on the surface of the first well and connected between the gates of the first and second transistors and the first well; a second diode formed on the surface of the second well and connected between the second well and the gates of the first and second transistors; and a switching element connected between the first and second wells and rendered conductive in response to a voltage between the first and second wells exceeding a predetermined voltage. Therefore, as the voltage between the first and second wells is maintained at a level not higher than the predetermined voltage, the excessive voltage between the first and second wells during the plasma process can be prevented and damage to the gate oxide film in the first and second transistors can be prevented, even if the antenna ratio is high.

Another semiconductor device according to the present invention includes: a first well of a first conductivity type formed on a surface of a semiconductor substrate and receiving a first voltage; a second well of a second conductivity type formed on the surface of the semiconductor substrate and receiving a second voltage; a logic circuit including a first transistor of the second conductivity type formed on a surface of the first well and receiving an input signal at its gate and a second transistor of the first conductivity type formed on a surface of the second well and having its gate connected to the gate of the first transistor; a third transistor formed on the surface of the first well, having its first electrode connected to the gates of the first and second transistors, receiving a third voltage equal to or lower than the first voltage at its gate, having its back gate connected to the first well, and having its second electrode connected to the second well; a first diode formed on the surface of the first well and connected between the first electrode and the back gate of the third transistor; a fourth transistor formed on the surface of the second well, having its first electrode connected to the gates of the first and second transistors, receiving a fourth voltage equal to or higher than the second voltage at its gate, having its back gate connected to the second well, and having its second electrode connected to the first well; and a second diode formed on the surface of the second well and connected between the back gate and the second electrode of the fourth transistor. Therefore, as positive charges and negative charges are released to the first and second wells, the excessive voltage between the first and second wells during the plasma process can be prevented and damage to the gate oxide film in the first and second transistors can be prevented, even if the antenna ratio is high.

Yet another semiconductor device according to the present invention includes: a first well of a first conductivity type formed on a surface of a semiconductor substrate and receiving a first voltage; a second well of a second conductivity type formed on the surface of the semiconductor substrate and receiving a second voltage; a third well of the first conductivity type formed on the surface of the semiconductor substrate and receiving the first voltage; a logic circuit including a first transistor of the second conductivity type formed on a surface of the first well and receiving an input signal at its gate and a second transistor of the first conductivity type formed on a surface of the second well and having its gate connected to the gate of the first transistor; a first diode formed on the surface of the first well and connected between the gates of the first and second transistors and the first well; a second diode formed on the surface of the second well and connected between the second well and the gates of the first and second transistors; a third transistor formed on a surface of the third well, having its first electrode connected to the first well, having its gate and back gate connected to the third well, and having its second electrode connected to the second well; and a third diode formed on the surface of the third well and connected between the first electrode and the back gate of the third transistor. Therefore, as the voltage between the first and the second wells is maintained at a level not higher than a voltage obtained as a result of addition of the first voltage and the threshold voltage of the third diode, the excessive voltage between the first and second wells during the plasma process can be prevented and damage to the gate oxide film in the first and second transistors can be prevented, even if the antenna ratio is high.

Yet another semiconductor device according to the present invention includes: a first well of a first conductivity type formed on a surface of a semiconductor substrate and receiving a first voltage; a second well of a second conductivity type formed on the surface of the semiconductor substrate and receiving a second voltage; a third well of the second conductivity type formed on the surface of the semiconductor substrate and receiving the second voltage; a logic circuit including a first transistor of the second conductivity type formed on a surface of the first well and receiving an input signal at its gate and a second transistor of the first conductivity type formed on a surface of the second well and having its gate connected to the gate of the first transistor; a first diode formed on the surface of the first well and connected between the gates of the first and second transistors and the first well; a second diode formed on the surface of the second well and connected between the second well and the gates of the first and second transistors; a third transistor formed on a surface of the third well, having its first electrode connected to the first well, having its gate and back gate connected to the third well, and having its second electrode connected to the second well; and a third diode formed on the surface of the third well and connected between the back gate and the second electrode of the third transistor. Therefore, as the voltage between the first and the second wells is maintained at a level not higher than the voltage obtained as a result of addition of the first voltage and the threshold voltage of the third diode, the excessive voltage between the first and second wells during the plasma process can be prevented and damage to the gate oxide film in the first and second transistors can be prevented, even if the antenna ratio is high.

As described above, according to the present invention, a semiconductor device free from plasma damage even when the antenna ratio is high can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 34A and 34B illustrate a configuration of an inverter provided with a diode serving as antenna ratio countermeasure shown in FIG. 33.

FIGS. 35A and 35B illustrate a configuration of an NAND gate provided with a diode serving as antenna ratio countermeasure shown in FIG. 33.

FIGS. 36A and 36B illustrate a configuration of an NOR gate provided with a diode serving as antenna ratio countermeasure shown in FIG. 33.

FIGS. 39A and 39B illustrate a configuration of an inverter provided with a diode serving as antenna ratio countermeasure shown in FIG. 38.

FIGS. 40A and 40B illustrate a configuration of an NAND gate provided with a diode serving as antenna ratio countermeasure shown in FIG. 38.

FIGS. 41A and 41B illustrate a configuration of an NOR gate provided with a diode serving as antenna ratio countermeasure shown in FIG. 38.

FIGS. 49A and 49B illustrate a configuration of an inverter provided with a diode serving as antenna ratio countermeasure shown in FIG. 48.

FIGS. 50A and 50B illustrate a configuration of an NAND gate provided with a diode serving as antenna ratio countermeasure shown in FIG. 48.

FIGS. 51A and 51B illustrate a configuration of an NOR gate provided with a diode serving as antenna ratio countermeasure shown in FIG. 48.

DESCRIPTION OF THE PREFERRED EMBODIMENTS

Embodiment 1

Figure 1:
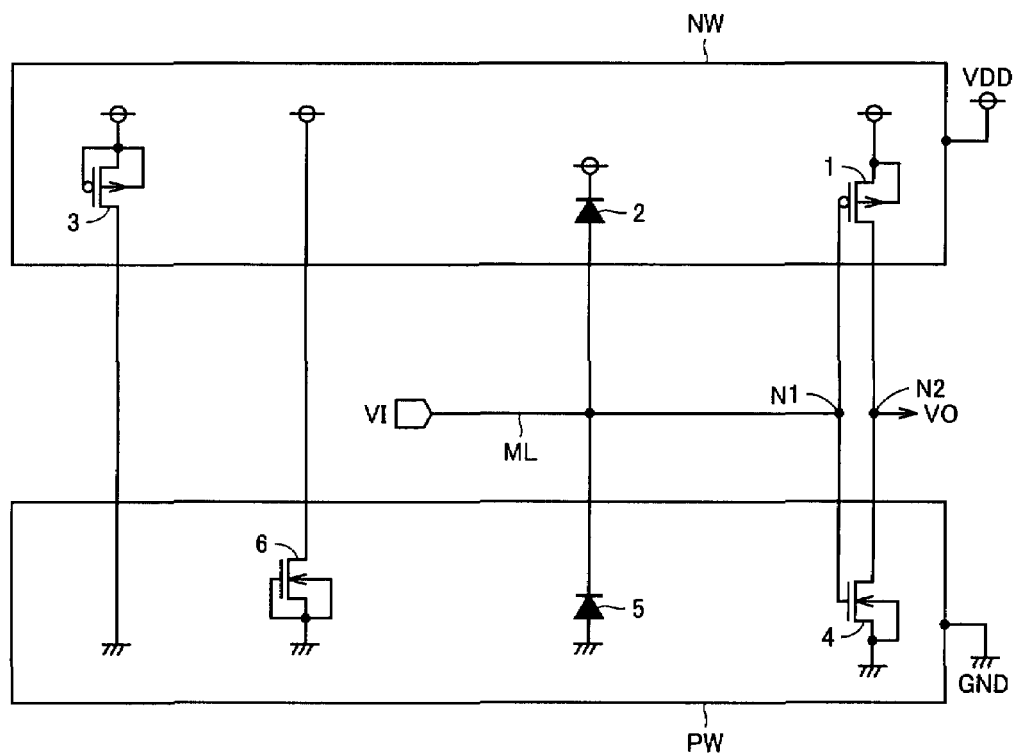
FIG. 1 illustrates a configuration of a CMOS LSI according to Embodiment 1 of the present invention.

FIG. 1 illustrates a configuration of a CMOS LSI according to Embodiment 1 of the present invention. In FIG. 1, the CMOS LSI is formed on a surface of a semiconductor substrate. An N type well NW and a P type well PW are formed on the surface of the semiconductor substrate, P channel MOS transistors 1, 3 and a diode 2 are formed on a surface of N type well NW, N-channel MOS transistors 4, 6 and a diode 5 are formed on a surface of P type well PW, and a relatively long metal interconnection ML is formed in a region between P type well PW and N type well NW. A power supply voltage VDD is applied to N type well NW, while a ground voltage GND is applied to P type well PW.

P-channel MOS transistor 1 and N-channel MOS transistor 4 constitute an inverter. P-channel MOS transistor 1 has the gate connected to an input node N1 of the inverter, has the source and the back gate connected to N type well NW, and has the drain connected to an output node N2 of the inverter. N-channel MOS transistor 4 has the gate connected to input node N1 of the inverter, has the source and the back gate connected to P type well PW, and has the drain connected to output node N2 of the inverter. Input node N1 of the inverter is connected to one end of metal interconnection ML, and the other end of metal interconnection ML receives an input signal VI.

When input signal VI is at "H" level, P-channel MOS transistor 1 is rendered non-conductive and N-channel MOS transistor 4 is rendered conductive, and an output signal VO is set to "L" level. When input signal VI is at "L" level, N-channel MOS transistor 4 is rendered non-conductive and P-channel MOS transistor 1 is rendered conductive, and output signal VO is set to "H" level.

In the CMOS LSI, the gates of MOS transistors 1, 4 are connected to relatively long metal interconnection ML and therefore the antenna ratio is high. Accordingly, if no measure is taken, metal interconnection ML is electrically charged during the plasma process and gate oxide films in MOS transistors 1, 4 are damaged, which results in deterioration in a characteristic of MOS transistors 1, 4.

Accordingly, in the CMOS LSI, as a first antenna ratio countermeasure, diodes 2, 5 are provided. Diode 2 is connected between metal interconnection ML and N type well NW, while diode 5 is connected between P type well PW and metal interconnection ML.

Figure 2A:
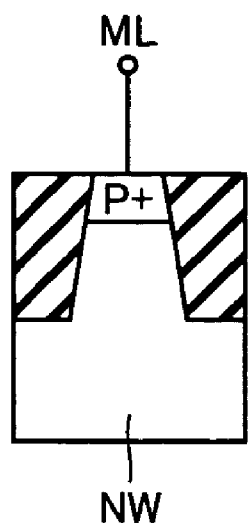
FIGS. 2A and 2B are cross-sectional views illustrating a configuration of a diode 2 shown in FIG. 1.
Figure 2B:
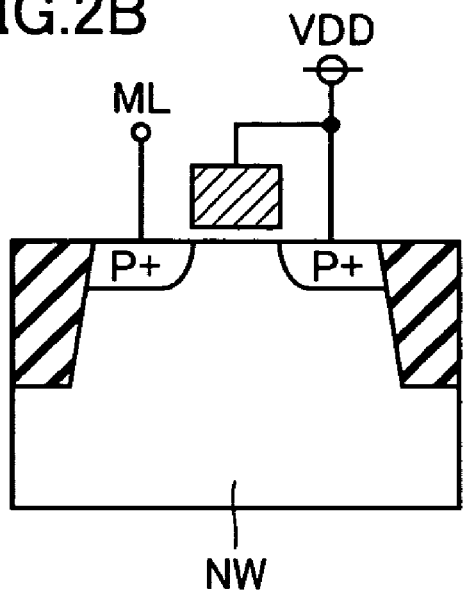

As shown in FIG. 2A, diode 2 may be formed by forming a P+ type diffusion layer on the surface of N type well NW and connecting the P+ type diffusion layer to metal interconnection ML. Alternatively, as shown in FIG. 2B, diode 2 may be formed by forming a P-channel MOS transistor on the surface of N type well NW, applying a power supply voltage to the gate and the drain of the P-channel MOS transistor, and connecting the source to metal interconnection ML.

Figure 3A:
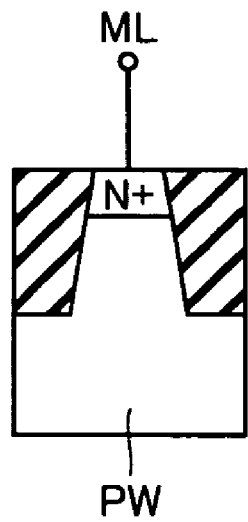
FIGS. 3A and 3B are cross-sectional views illustrating a configuration of a diode 5 shown in FIG. 1.
Figure 3B:
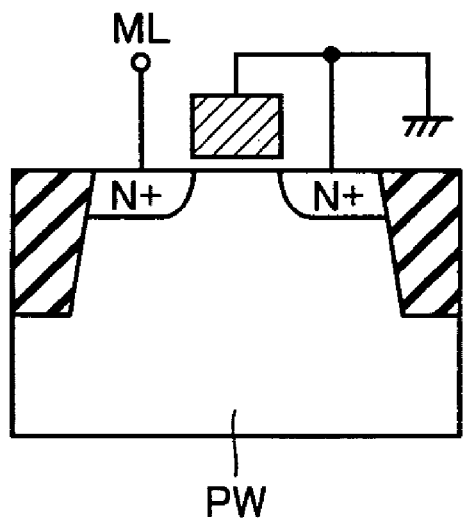

As shown in FIG. 3A, diode 5 may be formed by forming an N+ type diffusion layer on the surface of P type well PW and connecting the N+ type diffusion layer to metal interconnection ML. Alternatively, as shown in FIG. 3B, diode 5 may be formed by forming an N-channel MOS transistor on the surface of P type well PW, applying a ground voltage to the gate and the drain of the N-channel MOS transistor, and connecting the source to metal interconnection ML.

Referring back to FIG. 1, it is assumed that each threshold voltage of diodes 2, 5 is set to VT. When metal interconnection ML is positively charged by plasma and the voltage of metal interconnection ML becomes higher than VDD+VT, diode 2 is rendered conductive and positive charges born by metal interconnection ML are released to N type well NW. On the other hand, when metal interconnection ML is negatively charged by the plasma and the voltage of metal interconnection ML becomes lower than –VT, diode 5 is rendered conductive and negative charges born by metal interconnection ML are released to P type well PW.

Therefore, the voltage of metal interconnection ML is maintained at a level between –VT and VDD+VTR. Namely, damage to the gate oxide film in MOS transistors 1, 4 due to excessive voltage of metal interconnection ML can be prevented. When input signal VI is at "H" level (power supply voltage VDD) or "L" level (ground voltage GND), diodes 2, 5 are maintained in a non-conductive state and an operation of the inverter is not adversely affected.

Conventionally, with provision of diodes 2, 5, there has been no deterioration in the gate oxide film in MOS transistors 1, 4 even if the antenna ratio is infinite. As the size of a CMOS circuit is reduced and the CMOS circuit is formed under a rule not larger than 100 nm rule, a resistance value of wells NW, PW is increased, and wells NW, PW are electrically charged with charges released from metal interconnection ML through diodes 2, 5. Then, the voltage of N type well NW becomes higher than power supply voltage VDD and the voltage of P type well PW becomes lower than ground voltage GND. In addition, the voltage between wells NW, PW becomes higher, and the gate oxide film in MOS transistors 1, 4 is damaged.

In the CMOS LSI, as a second antenna ratio countermeasure, P-channel MOS transistor 3 and N-channel MOS transistor 6 are provided. P-channel MOS transistor 3 has the source, the gate and the back gate connected to N type well NW, and has the drain connected to P type well PW. N-channel MOS transistor 6 has the source, the gate and the back gate connected to P type well PW, and has the drain connected to N type well NW.

When wells NW, PW are electrically charged during the plasma process and the voltage between wells NW, PW exceeds a prescribed voltage, MOS transistors 3, 6 serving as pull-down off transistors are rendered conductive by punchthrough or breakdown. Accordingly, the voltage between wells NW, PW is lowered, and damage to the gate oxide film in MOS transistors 1, 4 is prevented.

In Embodiment 1, pull-down off transistors 3, 6 are connected between N type well NW and P type well PW, and the voltage between wells NW, PW during the plasma process is suppressed to a small value. Therefore, even if the antenna ratio is high and the CMOS circuit is formed under a rule not larger than 100 nm, deterioration of MOS transistors 1, 4 can be prevented. Therefore, as it is not necessary to set the antenna ratio to a value not higher than a certain value, the layout is not restricted. In addition, as it is not necessary to consider the plasma damage, the degree of freedom in process development is higher.

(Variation 1)

Figure 4:
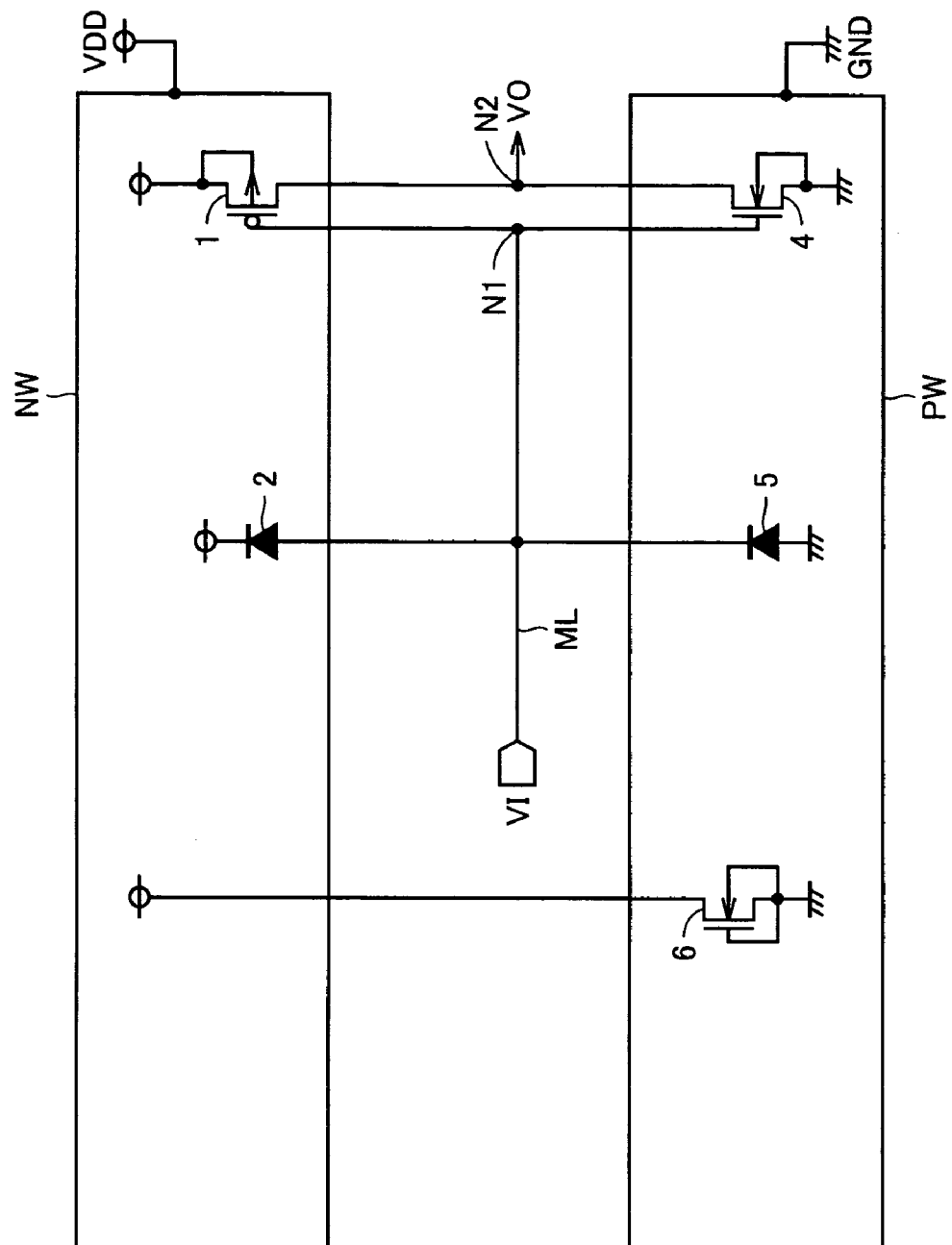
FIG. 4 illustrates Variation 1 of Embodiment 1.

FIG. 4 illustrates a configuration in Variation 1 of Embodiment 1. In Variation 1, solely N-channel MOS transistor 6 is provided as a pull-down off transistor. In Variation 1, the number of pull-down off transistors can be small.

(Variation 2)

Figure 5:
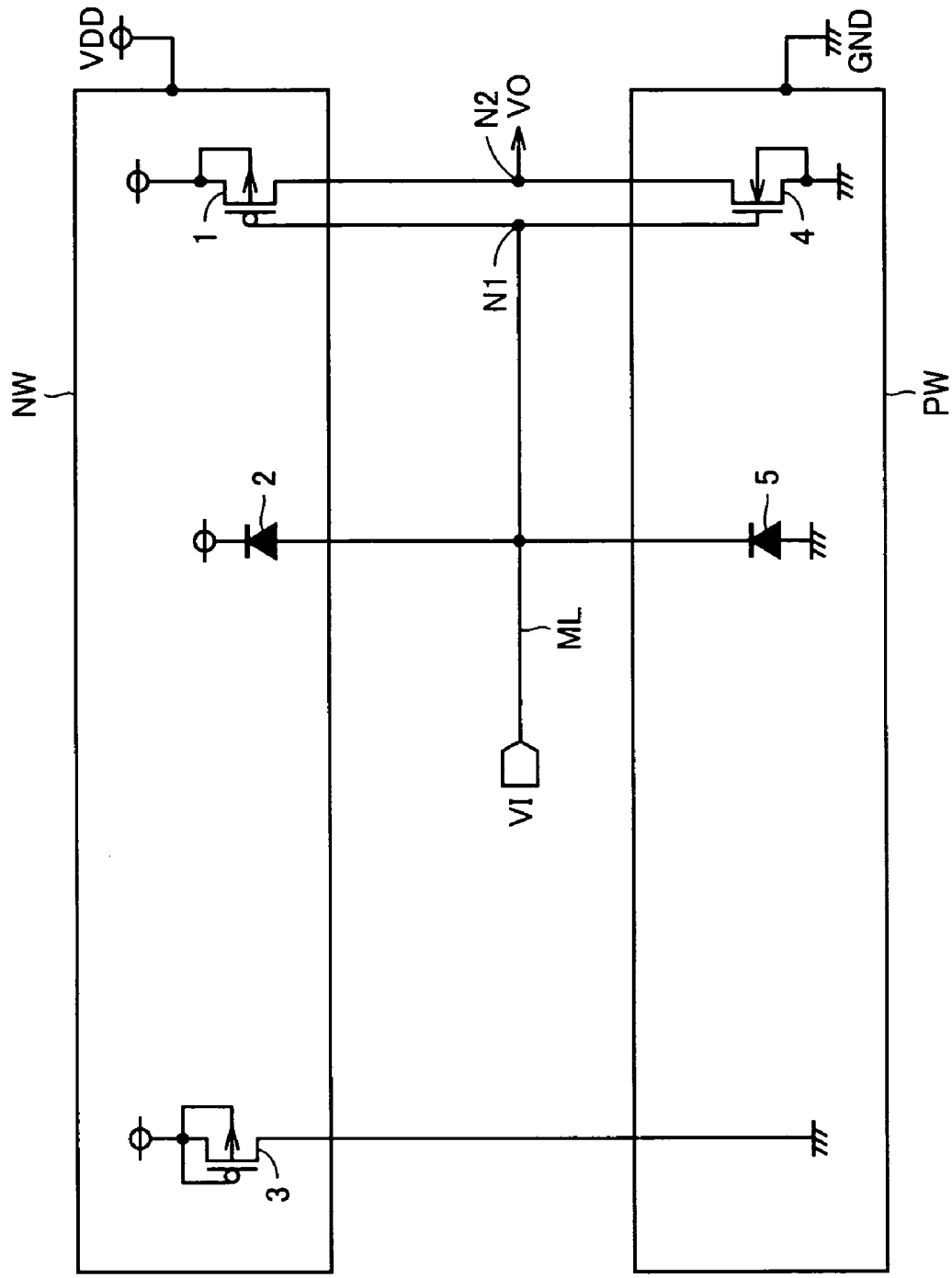
FIG. 5 illustrates Variation 2 of Embodiment 1.

FIG. 5 illustrates a configuration in Variation 2 of Embodiment 1. In Variation 2, solely P-channel MOS transistor 3 is provided as a pull-down off transistor. In Variation 2, the number of pull-down off transistors can be small.

(Variation 3)

Figure 6:
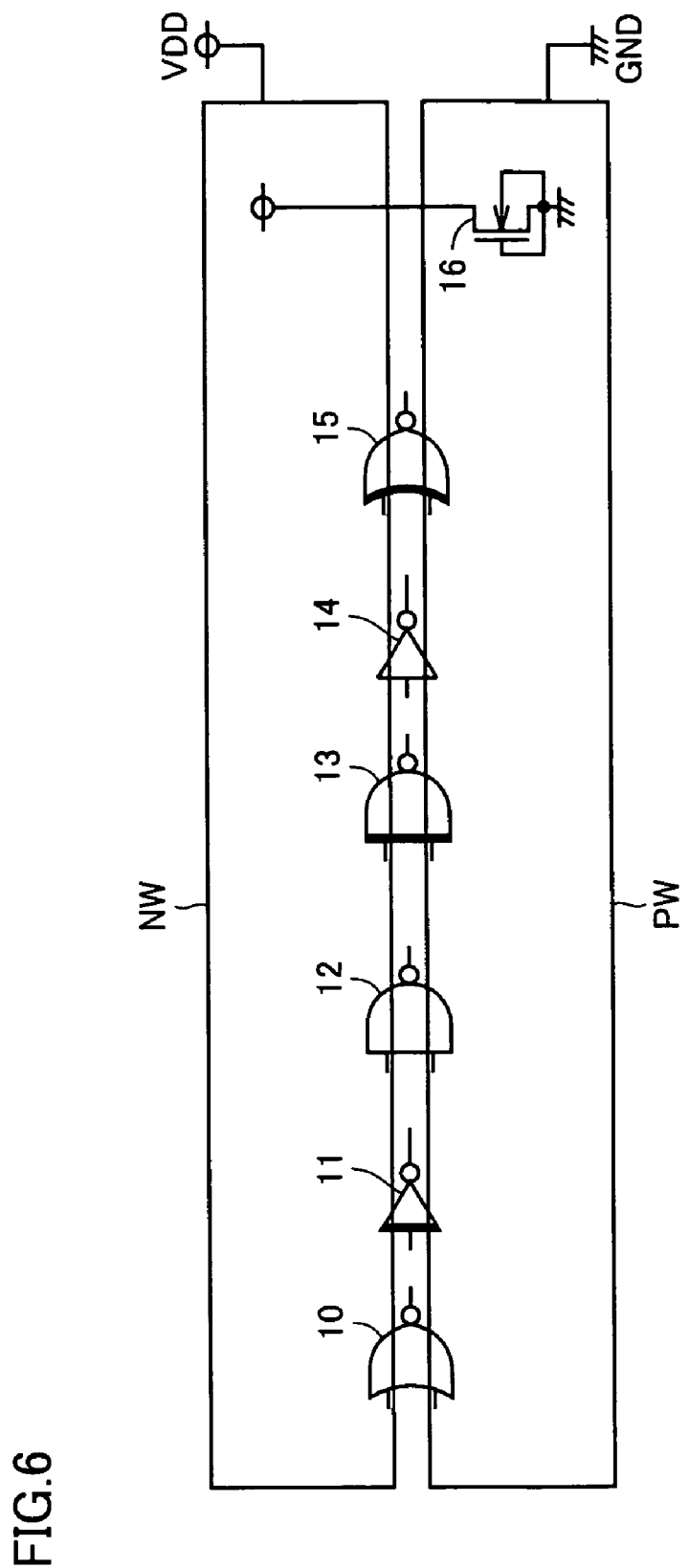
FIG. 6 illustrates Variation 3 of Embodiment 1.

FIG. 6 illustrates a configuration in Variation 3 of Embodiment 1. In Variation 3, a plurality of logic circuits 10 to 15 and one pull-down off transistor 16 are provided for one set of N type well NW and P type well PW. Logic circuits 10 to 15 include logic circuits 10, 12, 14 connected to a relatively short metal interconnection and logic circuits 11, 13, 15 connected to a relatively long metal interconnection. Logic circuits 10, 12, 14 implement, for example, a normal NOR gate, an NAND gate, and an inverter, respectively. Logic circuits 11, 13, 15 implement, for example, an inverter, an NAND gate, and an NOR gate provided with a diode serving as antenna ratio countermeasure.

Figure 7A:
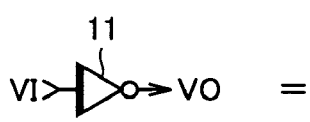
FIGS. 7A and 7B illustrate a configuration of an inverter provided with a diode serving as antenna ratio countermeasure shown in FIG. 6.
Figure 7B:
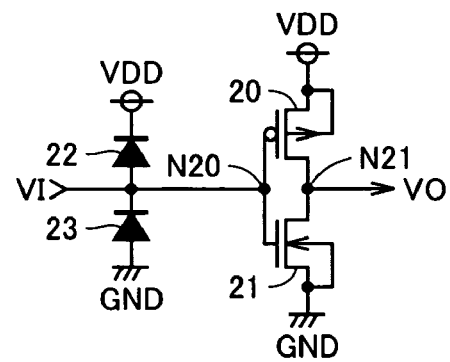

As shown in FIGS. 7A and 7B, inverter 11 provided with the diode serving as antenna ratio countermeasure includes a P-channel MOS transistor 20 and an N-channel MOS transistor 21 implementing an inverter and diodes 22, 23 serving as antenna ratio countermeasure. P-channel MOS transistor 20 and diode 22 are formed on the surface of N type well NW, while N-channel MOS transistor 21 and diode 23 are formed on the surface of P type well PW.

P-channel MOS transistor 20 has the source and the back gate connected to N type well NW, has the gate connected to an input node N20, and has the drain connected to an output node N21. N-channel MOS transistor 21 has the source and the back gate connected to P type well PW, has the gate connected to input node N20, and has the drain connected to output node N21. Diode 22 is connected between input node N20 and N type well NW, while diode 23 is connected between P type well PW and input node N20. An inverted signal of input signal VI is output signal VO. Charges born by input node N20 are released to wells NW, PW through diodes 22, 23.

Figure 8A:
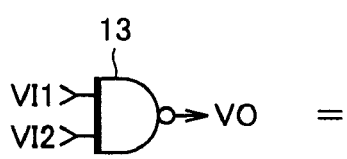
FIGS. 8A and 8B illustrate a configuration of an NAND gate provided with a diode serving as antenna ratio countermeasure shown in FIG. 6.
Figure 8B:
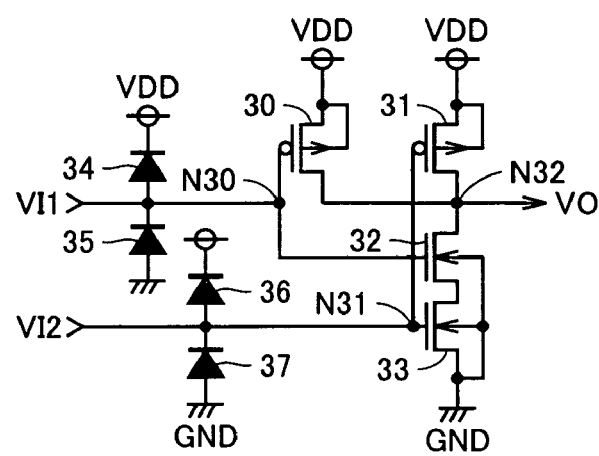

As shown in FIGS. 8A and 8B, NAND gate 13 provided with the diode serving as antenna ratio countermeasure includes P-channel MOS transistors 30, 31 and N-channel MOS transistors 32, 33 implementing the NAND gate and diodes 34 to 37 serving as antenna ratio countermeasure. P-channel MOS transistors 30, 31 and diodes 34, 36 are formed on the surface of N type well NW, while N-channel MOS transistors 32, 33 and diodes 35, 37 are formed on the surface of P type well PW.

P-channel MOS transistors 30, 31 have the sources and the back gates connected to N type well NW, have the gates connected to input nodes N30, N31 respectively, and have the drains both connected to an output node N32. N-channel MOS transistors 32, 33 are connected in series between output node N32 and P type well PW, have the gates connected to input nodes N30, N31 respectively, and have the back gates both connected to P type well PW.

Diode 34 is connected between input node N30 and N type well NW, while diode 35 is connected between P type well PW and input node N30. Diode 36 is connected between input node N31 and N type well NW, while diode 37 is connected between P type well PW and input node N31. Solely when input signals VI1, VI2 are both at "H" level, output signal VO is set to "L" level, and otherwise output signal VO is set to "H" level. Charges born by input nodes N30, N31 are released to wells NW, PW through diodes 34 to 37.

Figure 9A:
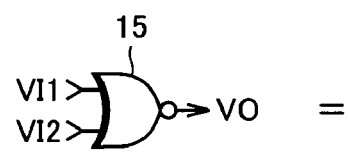
FIGS. 9A and 9B illustrate a configuration of an NOR gate provided with a diode serving as antenna ratio countermeasure shown in FIG. 6.
Figure 9B:
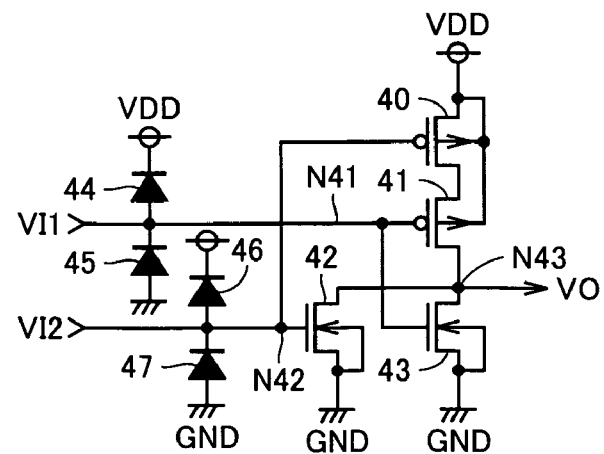

As shown in FIGS. 9A and 9B, NOR gate 15 provided with the diode serving as antenna ratio countermeasure includes P-channel MOS transistors 40, 41 and N-channel MOS transistors 42, 43 implementing the NOR gate and diodes 44 to 47 serving as antenna ratio countermeasure. P-channel MOS transistors 40, 41 and diodes 44, 46 are formed on the surface of N type well NW, while N-channel MOS transistors 42, 43 and diodes 45, 47 are formed on the surface of P type well PW.

P-channel MOS transistors 40, 41 are connected in series between N type well NW and an output node N43, have the gates connected to input nodes N42, N41 respectively, and have the back gates both connected to N type well NW. N-channel MOS transistors 42, 43 have the sources and the back gates connected to P type well PW, have the gates connected to input nodes N42, N41 respectively, and have the drains both connected to output node N43.

Diode 44 is connected between input node N41 and N type well NW, while diode 45 is connected between P type well PW and input node N41. Diode 46 is connected between input node N42 and N type well NW, while diode 47 is connected between P type well PW and input node N42. Solely when input signals VI1, VI2 are both at "L" level, output signal VO is set to "H" level, and otherwise output signal VO is set to "L" level. Charges born by input nodes N41, N42 are released to wells NW, PW through diodes 44 to 47.

Referring back to FIG. 6, N-channel MOS transistor 16 serving as the pull-down off transistor is formed on the surface of P type well PW. N-channel MOS transistor 16 has the drain connected to N type well NW, and has the gate, the back gate and the source connected to P type well PW.

When wells NW, PW are electrically charged during the plasma process and the voltage between wells NW, PW exceeds a prescribed voltage, N-channel MOS transistor 16 serving as the pull-down off transistor is rendered conductive by punchthrough or breakdown. Accordingly, the voltage between wells NW, PW is lowered, and damage to the gate oxide film in MOS transistors 20, 21, 30 to 33, and 40 to 43 is prevented.

(Variation 4)

Figure 10:
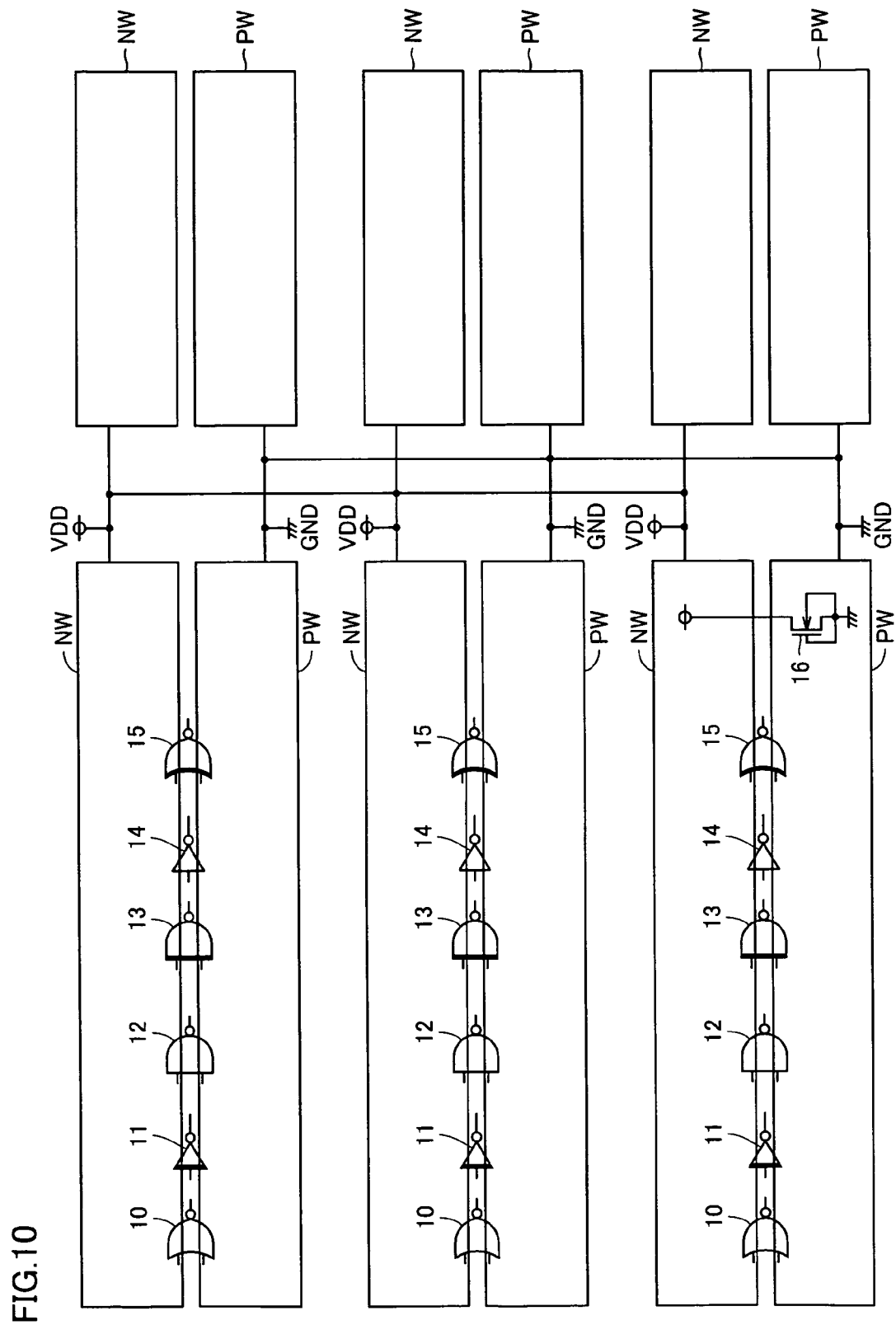
FIG. 10 illustrates Variation 4 of Embodiment 1.

FIG. 10 illustrates a configuration in Variation 4 of Embodiment 1. In Variation 4, a plurality of sets of N type well NW and P type well PW are provided, a plurality of N type wells NW are connected to each other and a plurality of P type wells PW are connected to each other, and pull-down off transistor 16 is provided for only one set of N type well NW and P type well PW. In Variation 4, the number of pull-down off transistors 16 can be small.

Embodiment 2

Figure 11:
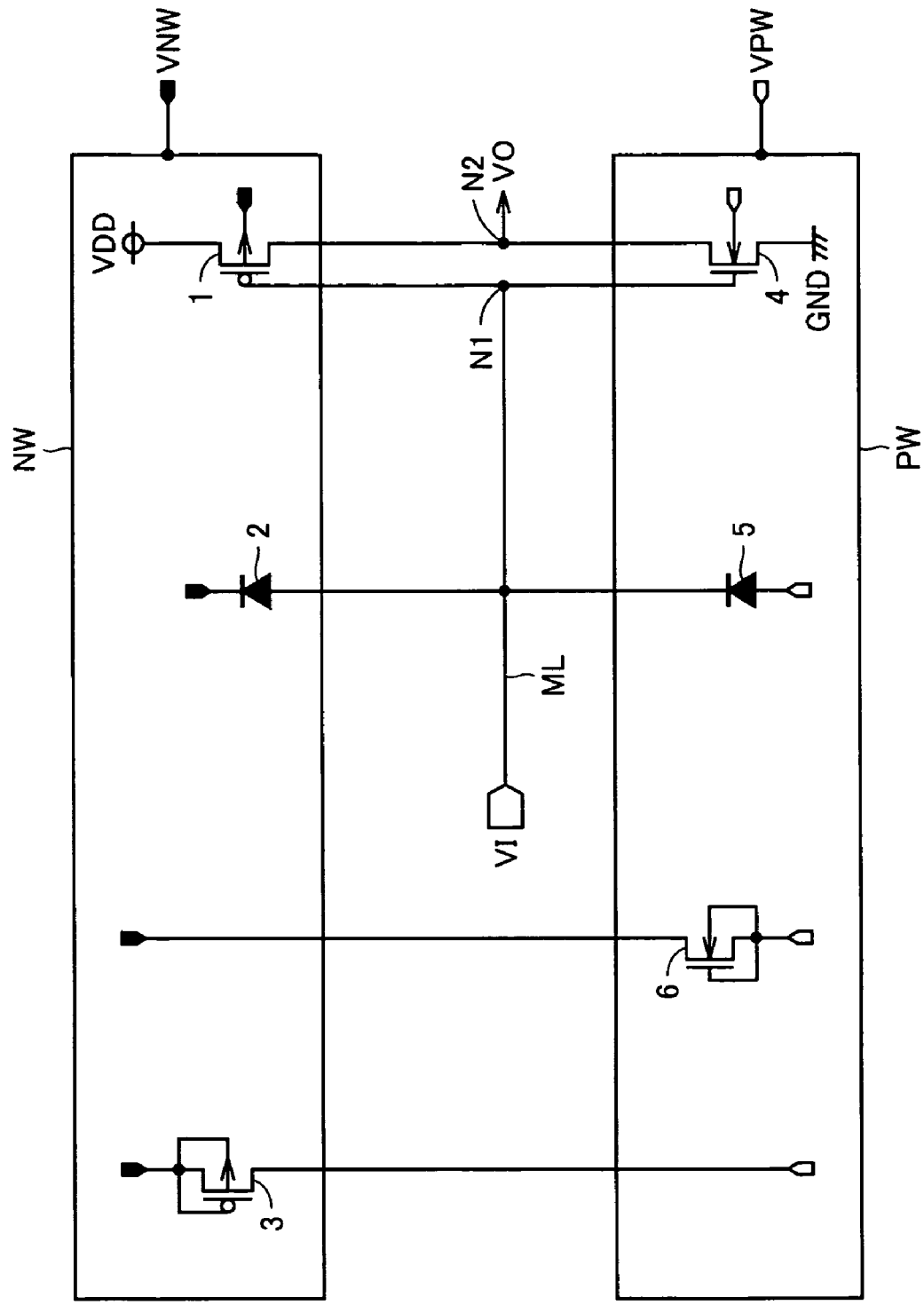
FIG. 11 illustrates a configuration of a CMOS LSI according to Embodiment 2 of the present invention.
Figure 12A:
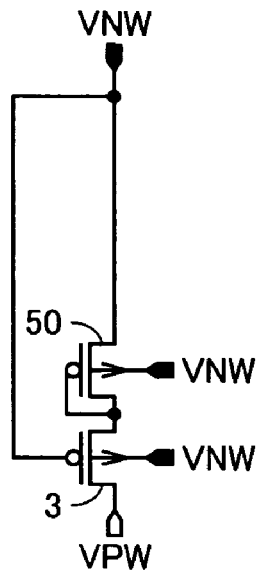
FIGS. 12A and 12B are diagrams illustrating Variation 1 of Embodiment 2.
Figure 12B:
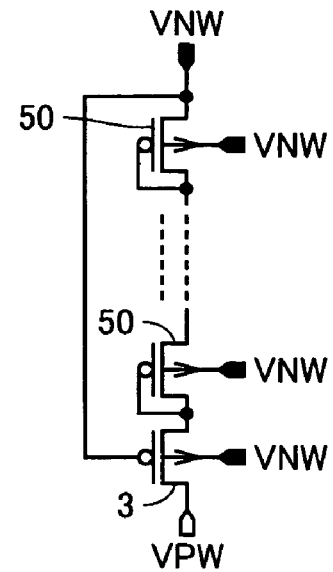
Figure 13A:
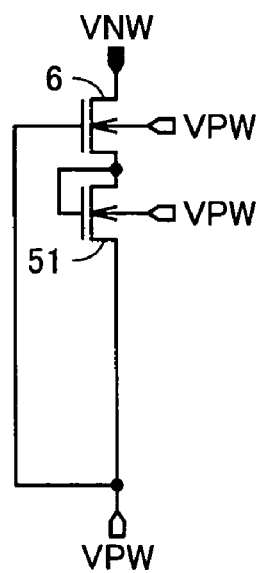
FIGS. 13A and 13B are other diagrams illustrating Variation 1 of Embodiment 2.
Figure 13B:
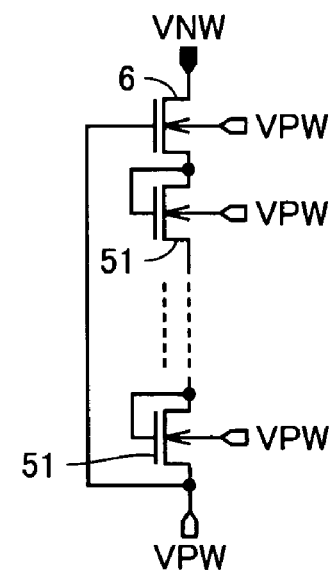

FIG. 11 illustrates a configuration of a CMOS LSI according to Embodiment 2 of the present invention. The CMOS LSI is different from the CMOS LSI in FIG. 1 in that a substrate voltage VNW higher than power supply voltage VDD is applied to N type well NW, a substrate voltage VPW lower than ground voltage GND is applied to P type well PW, the source of P-channel MOS transistor 1 is disconnected from N type well NW and instead connected to a line of power supply voltage VDD, and the source of N-channel MOS transistor 4 is disconnected from P type well PW and instead connected to a line of ground voltage GND.

Embodiment 2 not only achieves the effect the same as in Embodiment 1 but also achieves reduction in current consumption in the CMOS LSI, because substrate voltages VNW, VPW are applied to the back gates of MOS transistors 1, 4 respectively so that absolute values of the threshold voltages of MOS transistors 1, 4 are increased and leakage current in MOS transistors 1, 4 is decreased.

(Variation 1)

FIGS. 12A and 12B and FIGS. 13A and 13B are circuit diagrams illustrating Variation 1 of Embodiment 2. In Variation 1, one diode-connected P-channel MOS transistor 50 or two or more diode-connected P-channel MOS transistors 50 is/are connected in series between N type well NW and the source of P-channel MOS transistor 3, and one diode-connected N-channel MOS transistor 51 or two or more diode-connected N-channel MOS transistors 51 is/are connected in series between the source of N-channel MOS transistor 6 and P type well PW. In Variation 1, leakage current that flows in pull-down off transistors 3, 6 can be decreased.

(Variation 2)

Figure 14:
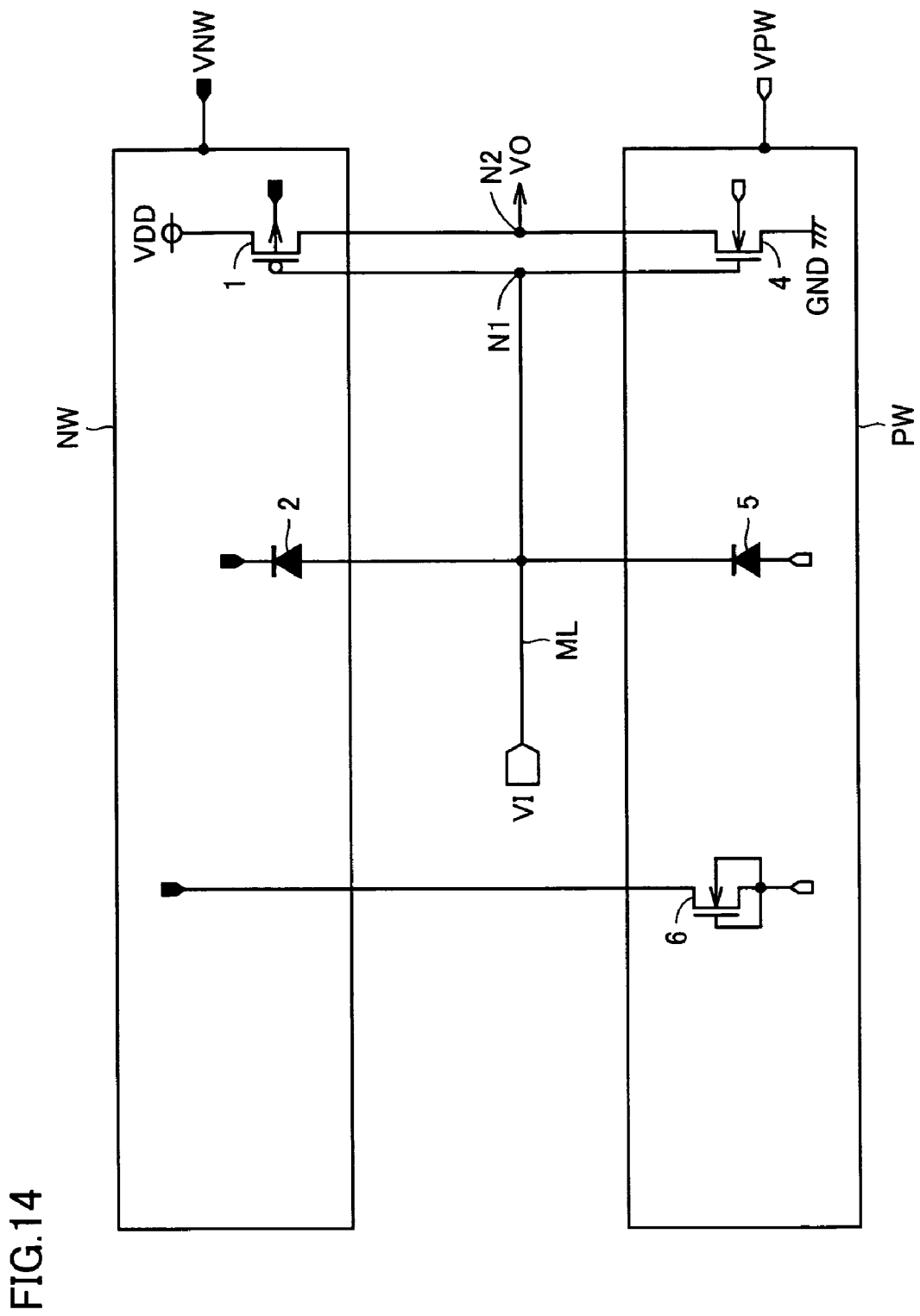
FIG. 14 illustrates Variation 2 of Embodiment 2.

FIG. 14 illustrates a configuration in Variation 2 of Embodiment 2. In Variation 2, solely N-channel MOS transistor 6 is provided as a pull-down off transistor. In Variation 2, the number of pull-down off transistors can be small.

(Variation 3)

Figure 15:
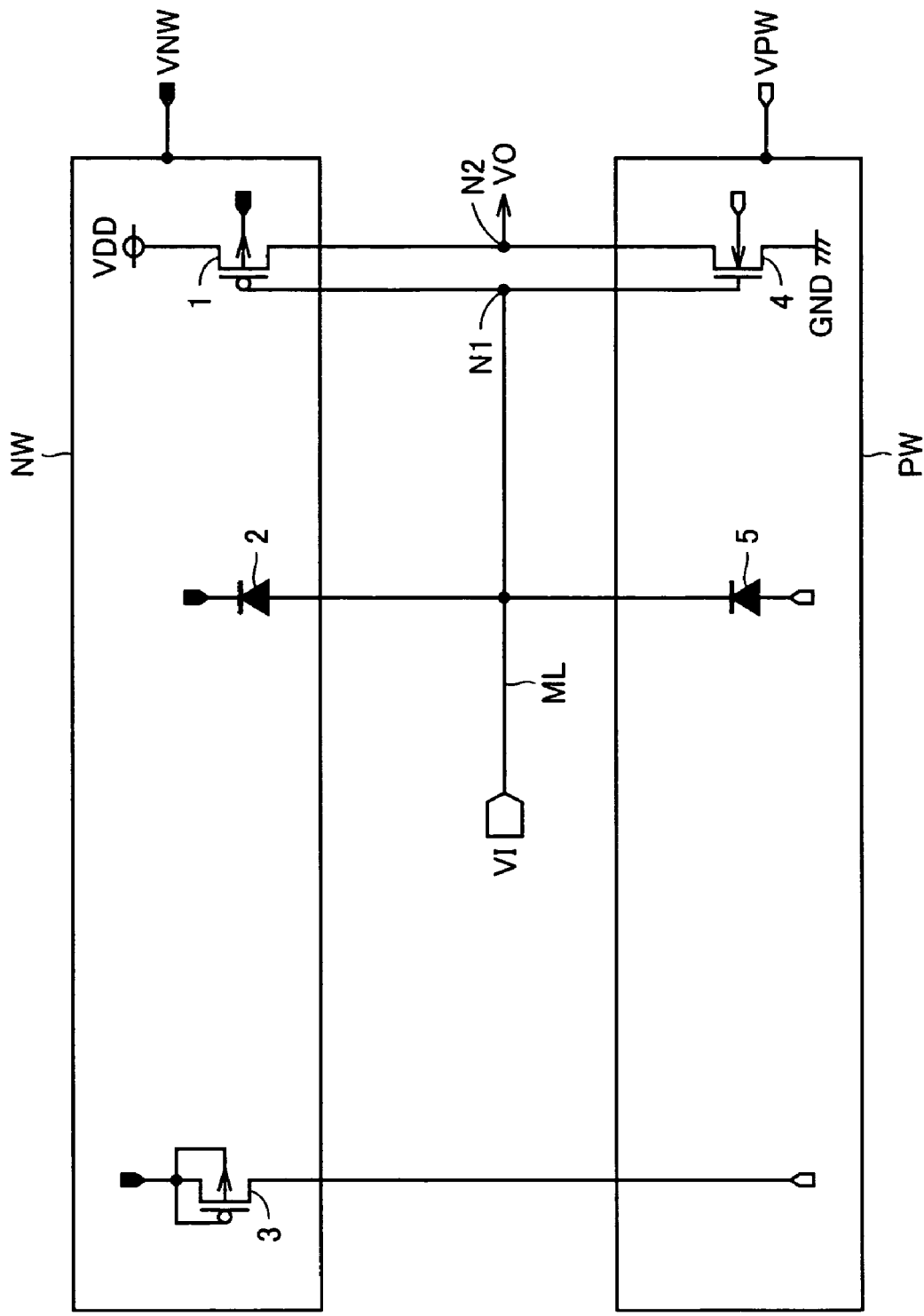
FIG. 15 illustrates Variation 3 of Embodiment 2.

FIG. 15 illustrates a configuration of Variation 3 of Embodiment 2. In Variation 3, solely P-channel MOS transistor 3 is provided as a pull-down off transistor. In Variation 3, the number of pull-down off transistors can be small.

(Variation 4)

Figure 16:
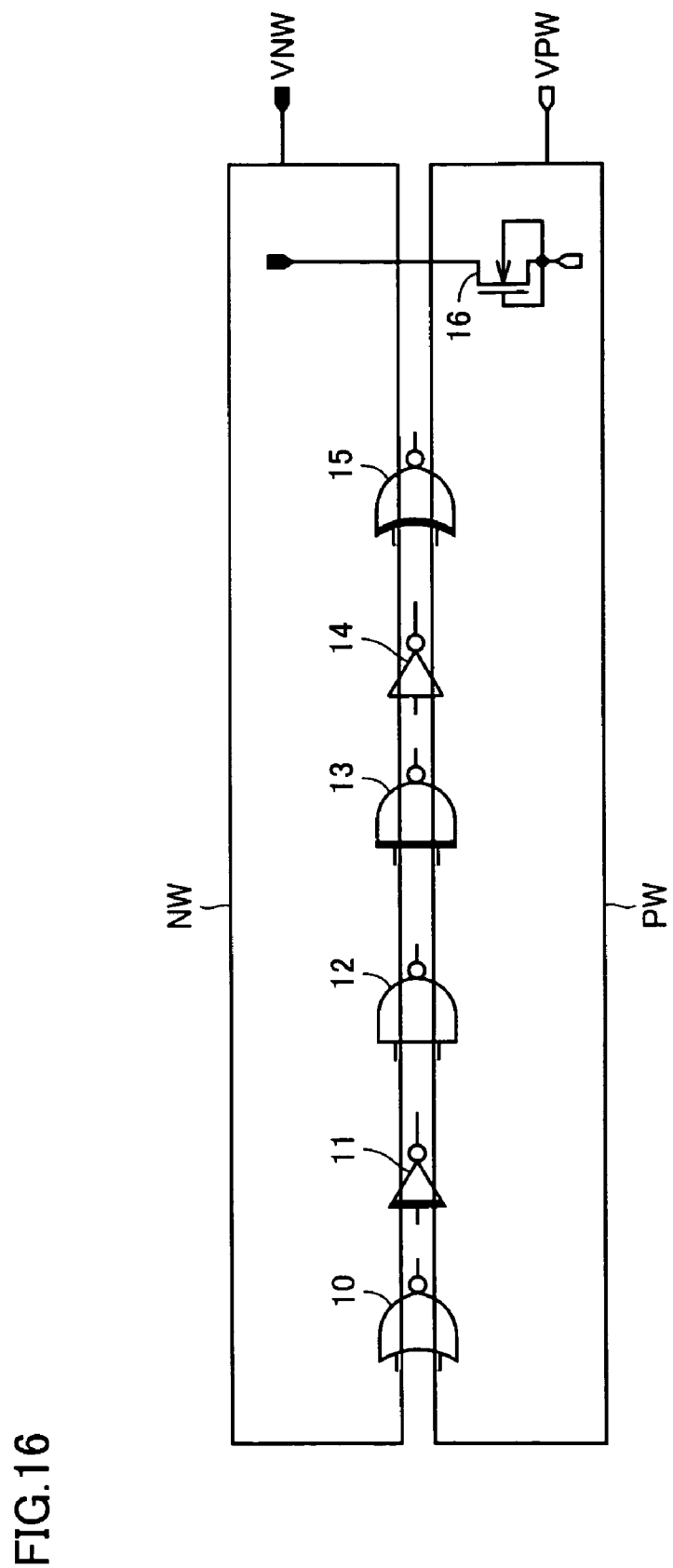
FIG. 16 illustrates Variation 4 of Embodiment 2.
Figure 17A:
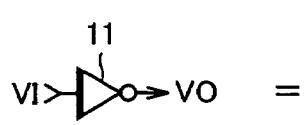
FIGS. 17A and 17B illustrate a configuration of an inverter provided with a diode serving as antenna ratio countermeasure shown in FIG. 16.
Figure 17B:
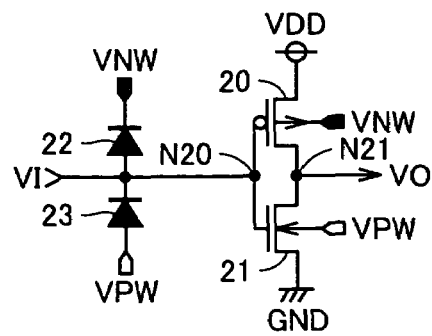
Figure 18A:
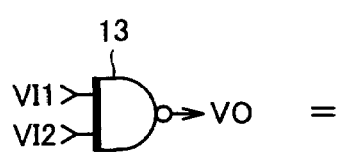
FIGS. 18A and 18B illustrate a configuration of an NAND gate provided with a diode serving as antenna ratio countermeasure shown in FIG. 16.
Figure 18B:
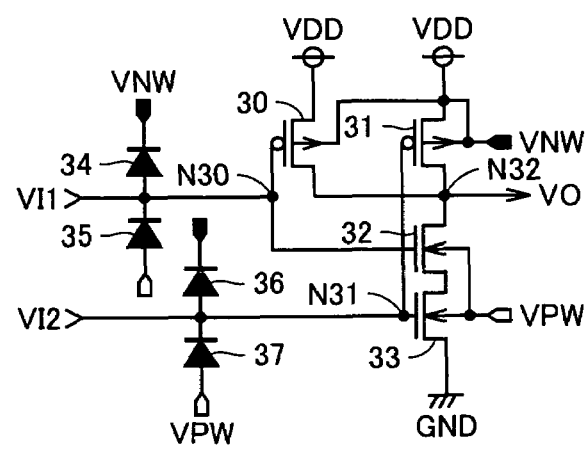
Figure 19A:
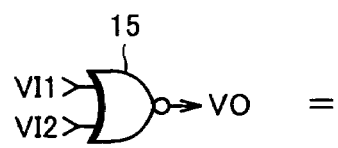
FIGS. 19A and 19B illustrate a configuration of an NOR gate provided with a diode serving as antenna ratio countermeasure shown in FIG. 16.
Figure 19B:
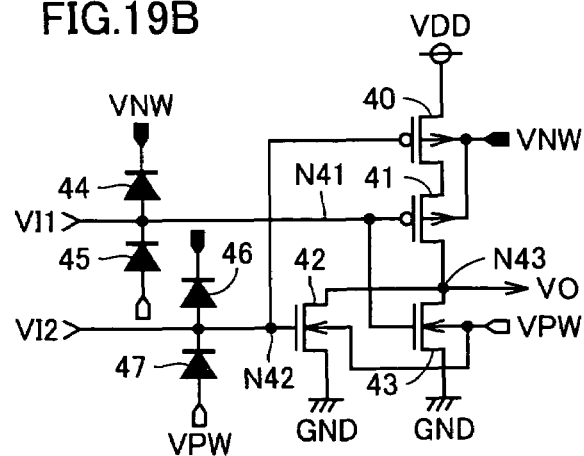

FIG. 16 illustrates a configuration in Variation 4 of Embodiment 2. Variation 4 is different from the CMOS LSI in FIG. 6 in that substrate voltage VNW higher than power supply voltage VDD is applied to N type well NW and substrate voltage VPW lower than ground voltage GND is applied to P type well PW. It is noted that, as shown in FIGS. 17A and 17B, power supply voltage VDD and ground voltage GND are applied to the sources of MOS transistors 20, 21 of inverter 11, respectively. In addition, as shown in FIGS. 18A and 18B, power supply voltage VDD is applied to the sources of P-channel MOS transistors 30, 31 of NAND gate 13, and ground voltage GND is applied to the source of N-channel MOS transistor 33 thereof. As shown in FIGS. 19A and 19B, power supply voltage VDD is applied to the source of P-channel MOS transistor 40 of NOR gate 15 and ground voltage GND is applied to the sources of N-channel MOS transistors 42, 43 thereof. In Variation 4, as one pull-down off transistor 16 is provided in common to a plurality of logic circuits 10 to 15, the number of pull-down off transistors 16 can be small.

(Variation 5)

Figure 20:
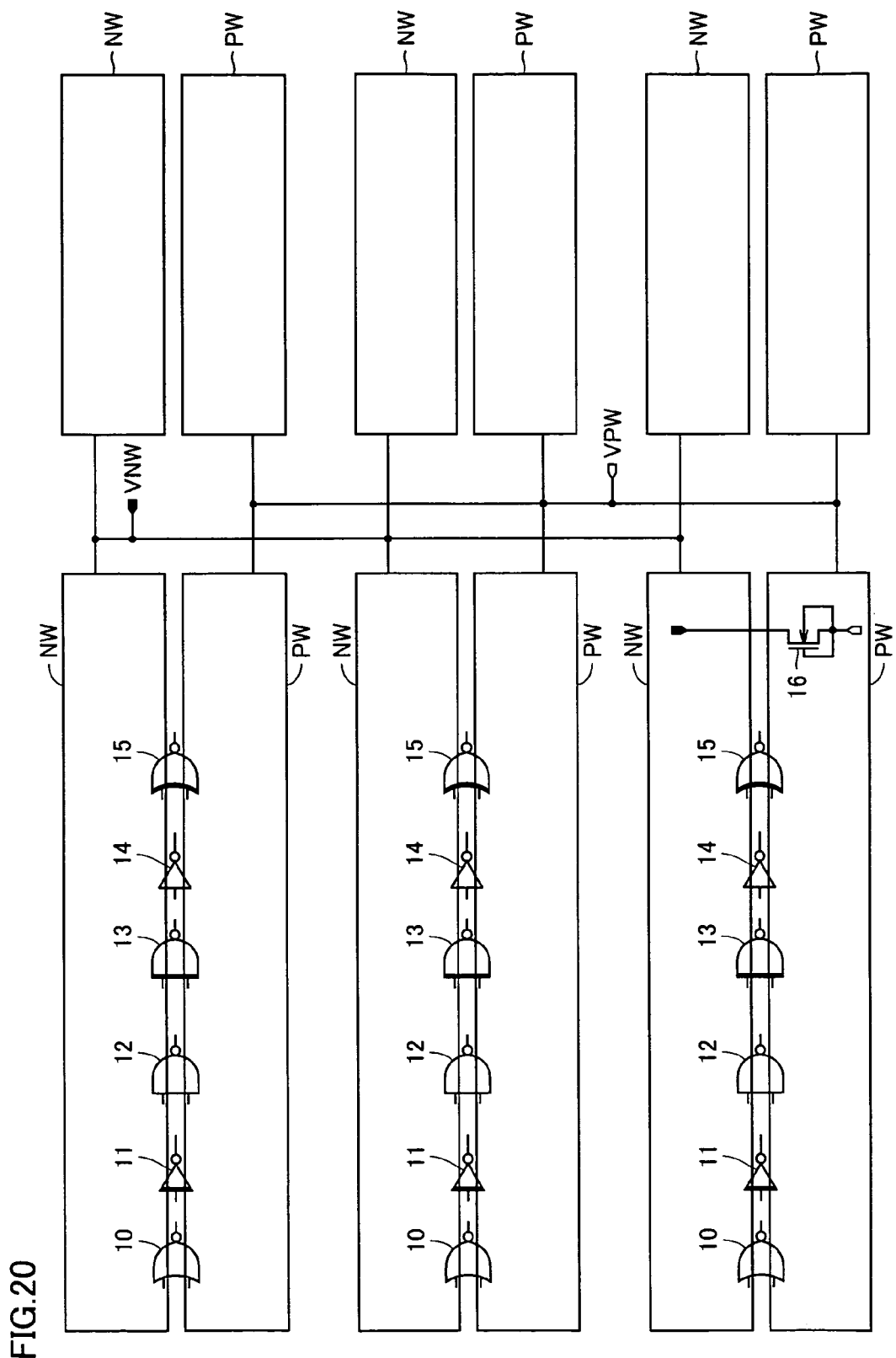
FIG. 20 illustrates Variation 5 of Embodiment 2.

FIG. 20 illustrates a configuration in Variation 5 of Embodiment 2. In Variation 5, a plurality of sets of N type well NW and P type well PW are provided, a plurality of N type wells NW are connected to each other and a plurality of P type wells PW are connected to each other, and pull-down off transistor 16 is provided for only one set of N type well NW and P type well PW. In Variation 5, the number of pull-down off transistors 16 can be small.

Embodiment 3

Figure 21:
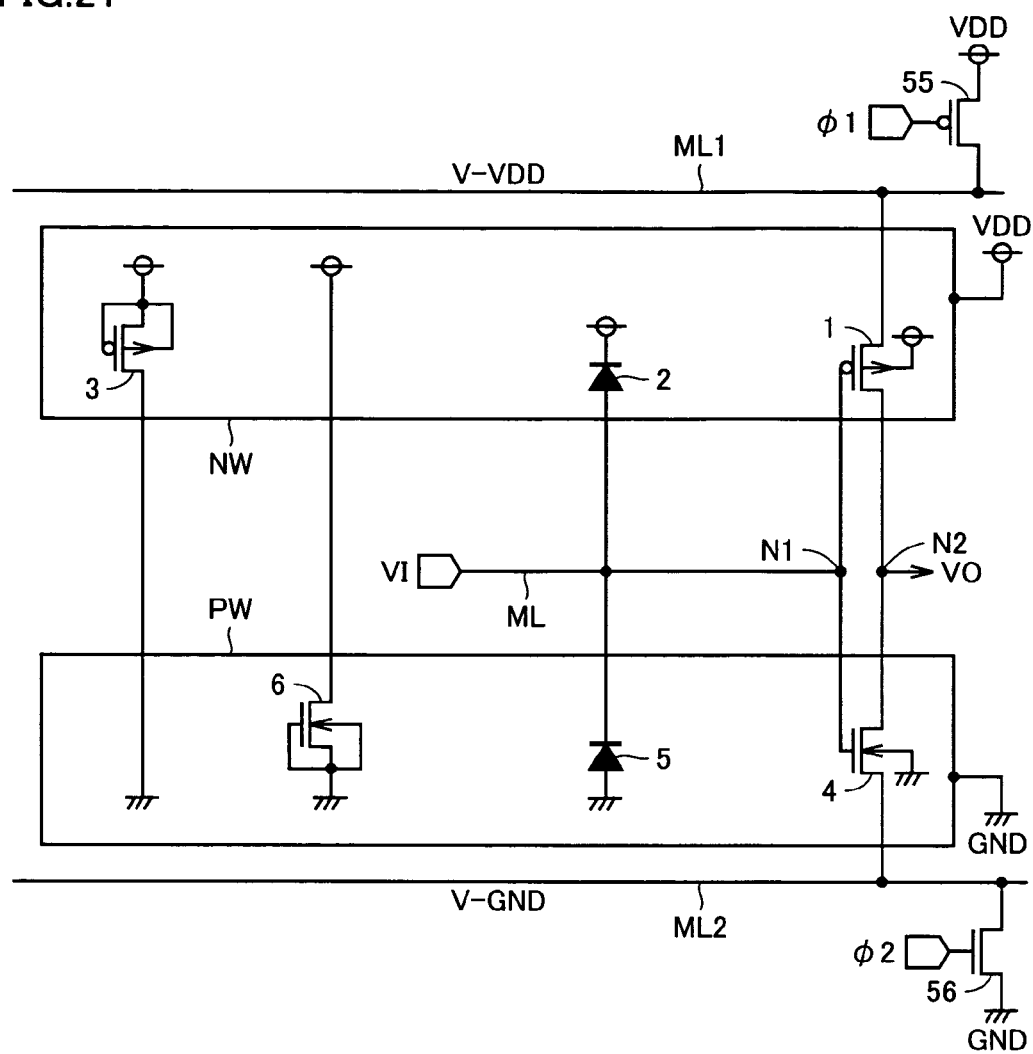
FIG. 21 illustrates a configuration of a CMOS LSI according to Embodiment 3 of the present invention.

FIG. 21 illustrates a configuration of a CMOS LSI according to Embodiment 3 of the present invention. The CMOS LSI is different from the CMOS LSI in FIG. 1 in that a P-channel MOS transistor 55, an N-channel MOS transistor 56 and metal interconnections ML1, ML2 are added.

P-channel MOS transistor 55 is connected between the line of power supply voltage VDD and metal interconnection ML1 and receives a control signal φ1 at its gate. P-channel MOS transistor 1 has the source connected to metal interconnection ML1. The voltage of metal interconnection ML1 is detected by a voltage detection circuit (not shown), and P-channel MOS transistor 55 is on/off-controlled by control signal φ1 such that the detected voltage is set to a prescribed pseudo power supply voltage V-VDD lower than power supply voltage VDD.

N-channel MOS transistor 56 is connected between metal interconnection ML2 and the line of ground voltage GND and receives a control signal φ2 at its gate. N-channel MOS transistor 4 has the source connected to metal interconnection ML2. The voltage of metal interconnection ML2 is detected by a voltage detection circuit (not shown), and N-channel MOS transistor 56 is on/off-controlled by control signal φ2 such that the detected voltage is set to a prescribed pseudo ground voltage V-GND higher than ground voltage GND.

Embodiment 3 not only achieves the effect the same as in Embodiment 1 but also achieves reduction in current consumption in the CMOS LSI, because pseudo power supply voltage V-VDD and pseudo ground voltage V-GND are applied to the sources of MOS transistors 1, 4 respectively so that leakage current in MOS transistors 1, 4 is decreased. During a period in which the inverter implemented by MOS transistors 1, 4 is not operated, control signals φ1 and φ2 are controlled so as to turn off at least one of MOS transistors 55, 56, thereby cutting off the leakage current.

(Variation 1)

Figure 22:
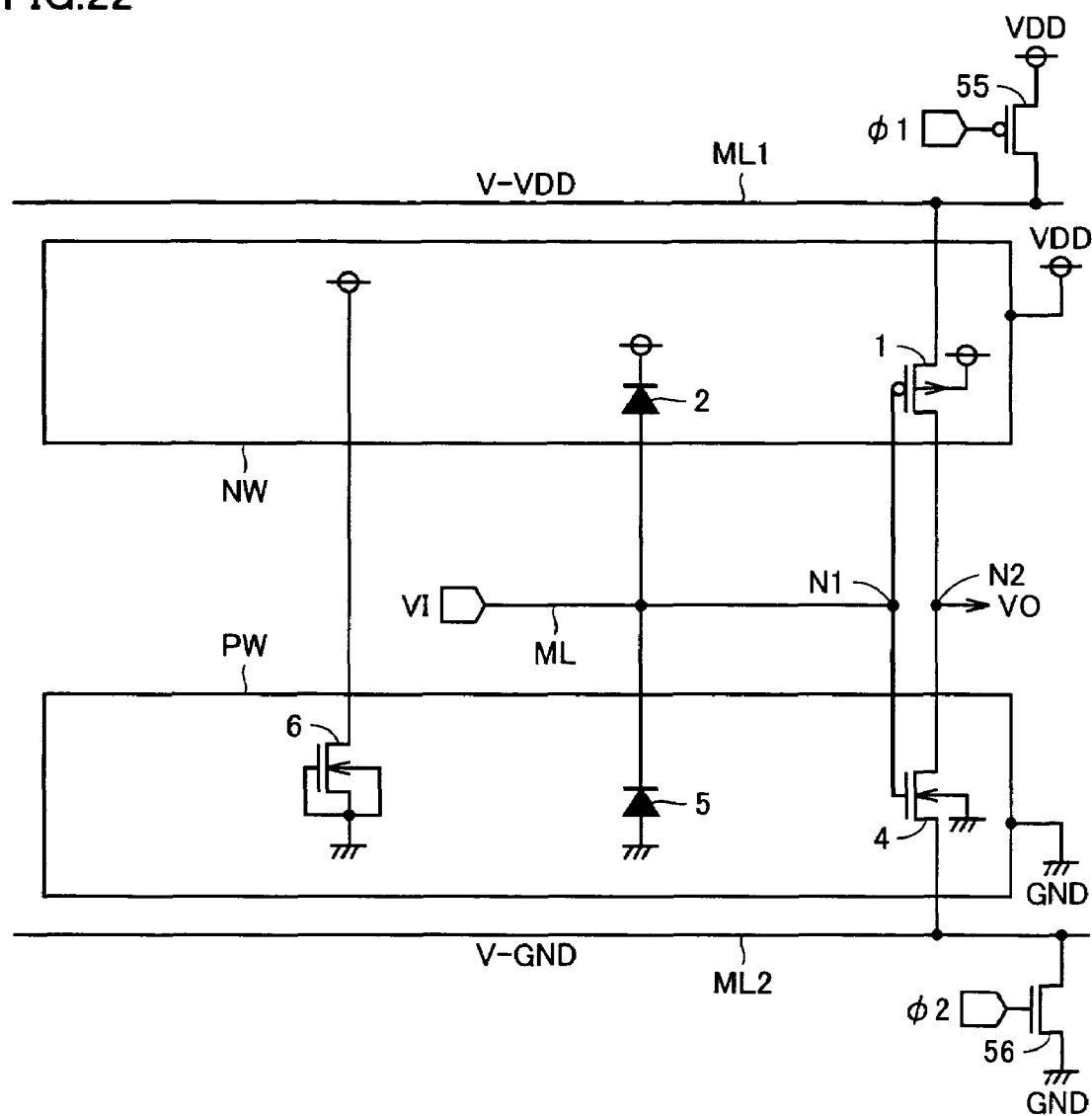
FIG. 22 illustrates Variation 1 of Embodiment 3.

FIG. 22 illustrates a configuration in Variation 1 of Embodiment 3. In Variation 1, solely N-channel MOS transistor 6 is provided as a pull-down off transistor. In Variation 1, the number of pull-down off transistors can be small.

(Variation 2)

Figure 23:
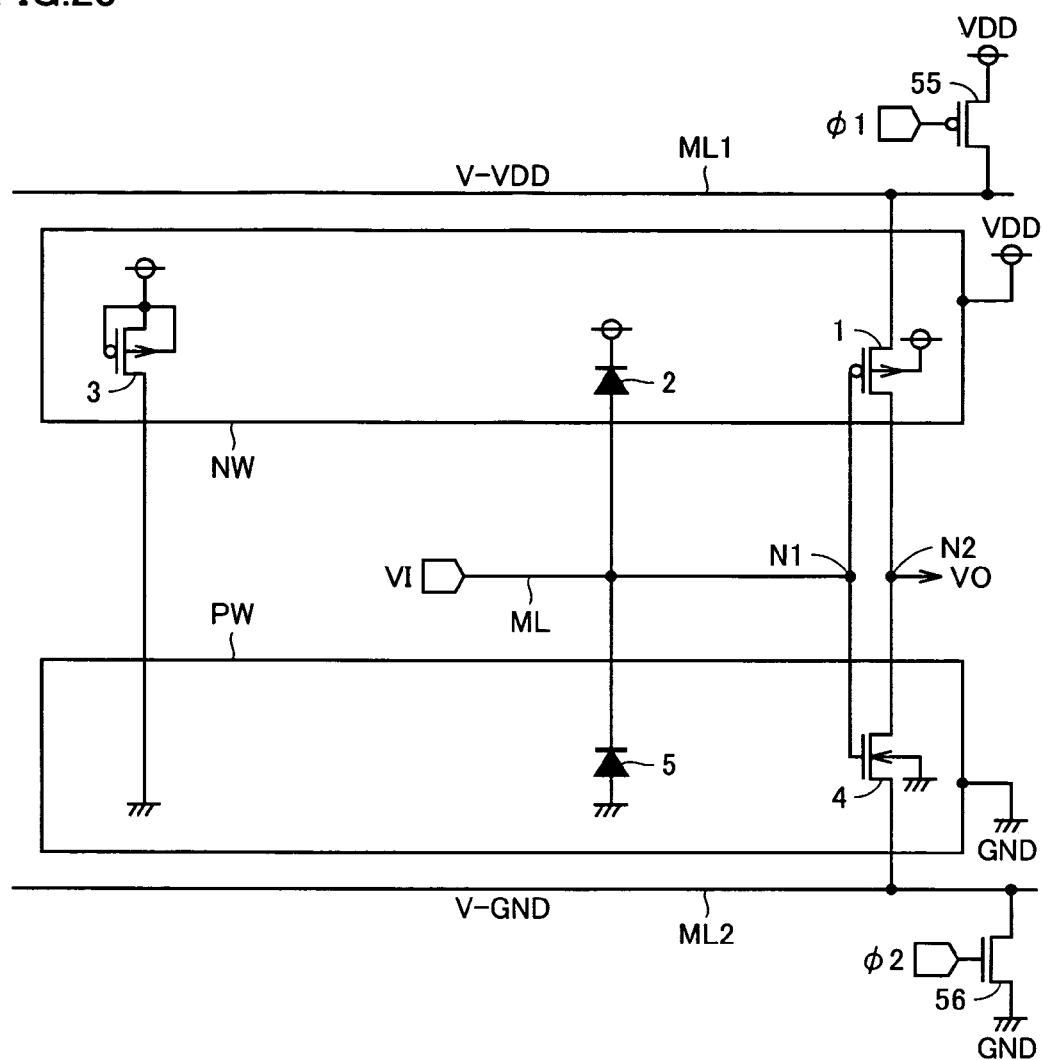
FIG. 23 illustrates Variation 2 of Embodiment 3.

FIG. 23 illustrates a configuration in Variation 2 of Embodiment 3. In Variation 2, solely P-channel MOS transistor 3 is provided as a pull-down off transistor. In Variation 2, the number of pull-down off transistors can be small.

(Variation 3)

Figure 24:
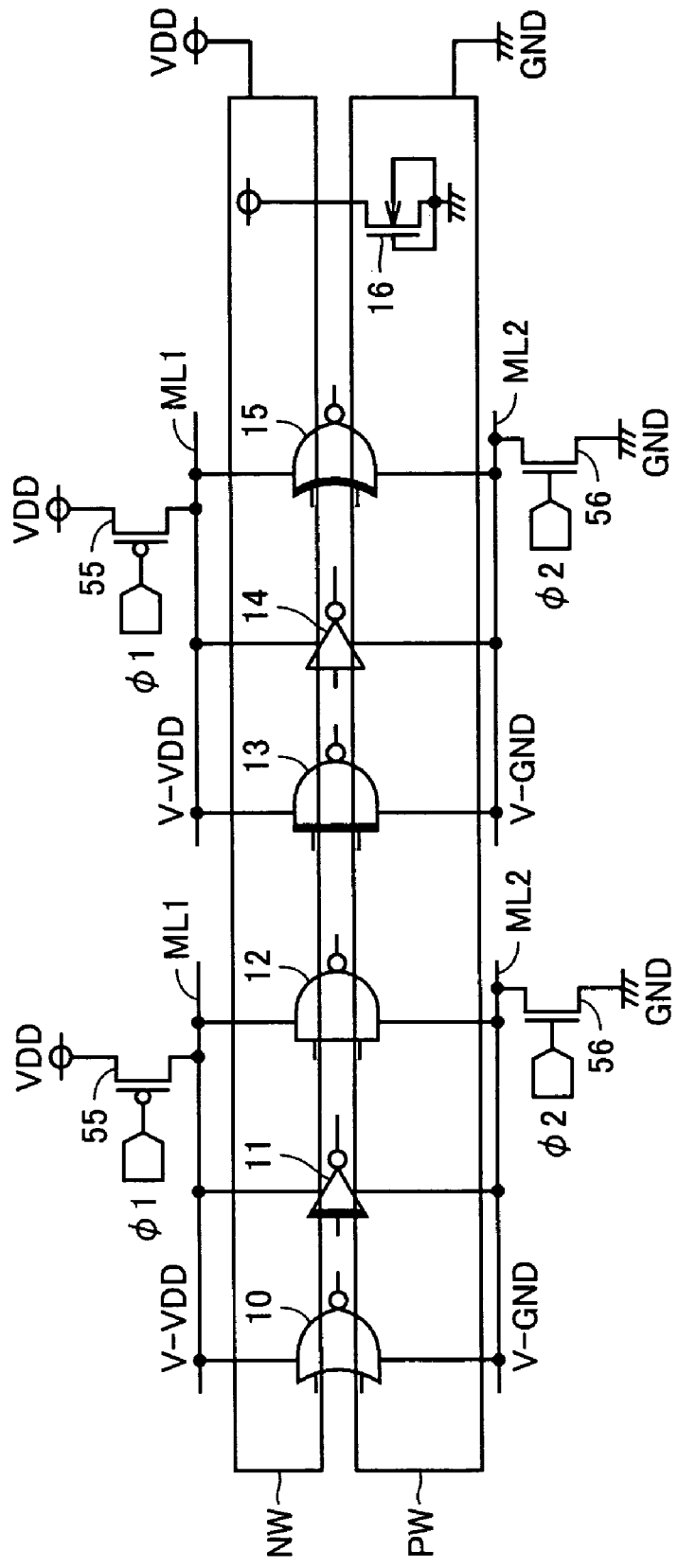
FIG. 24 illustrates Variation 3 of Embodiment 3.
Figure 25A:
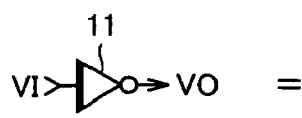
FIGS. 25A and 25B illustrate a configuration of an inverter provided with a diode serving as antenna ratio countermeasure shown in FIG. 24.
Figure 25B:
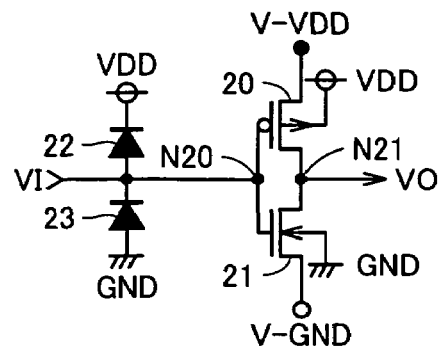
Figure 26A:
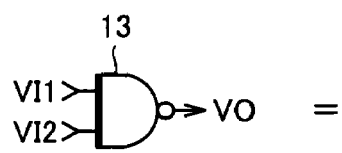
FIGS. 26A and 26B illustrate a configuration of an NAND gate provided with a diode serving as antenna ratio countermeasure shown in FIG. 24.
Figure 26B:
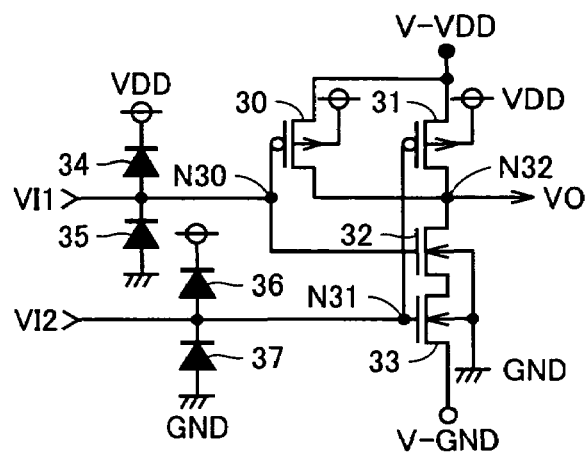
Figure 27A:
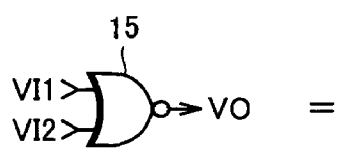
FIGS. 27A and 27B illustrate a configuration of an NOR gate provided with a diode serving as antenna ratio countermeasure shown in FIG. 24.
Figure 27B:
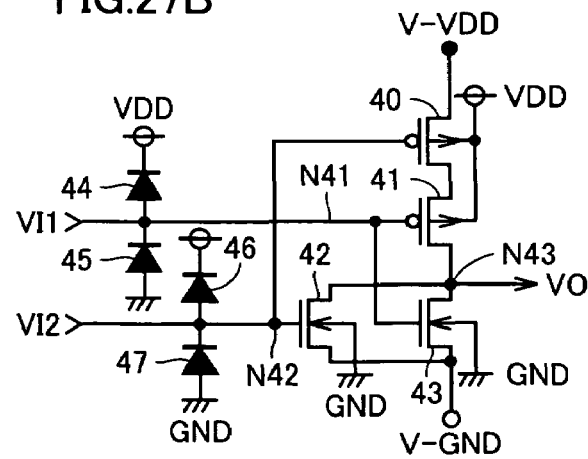

FIG. 24 illustrates a configuration in Variation 3 of Embodiment 3. Variation 3 is different from the CMOS LSI in FIG. 6 in that pseudo power supply voltage V-VDD and pseudo ground voltage V-GND are applied to logic circuits 10 to 15. Specifically, as shown in FIGS. 25A and 25B, pseudo power supply voltage V-VDD and pseudo ground voltage V-GND are applied to the sources of MOS transistors 20, 21 of inverter 11, respectively. In addition, as shown in FIGS. 26A and 26B, pseudo power supply voltage V-VDD is applied to the sources of P-channel MOS transistors 30, 31 of NAND gate 13, and pseudo ground voltage V-GND is applied to the source of N-channel MOS transistor 33 thereof. Moreover, as shown in FIGS. 27A and 27B, pseudo power supply voltage V-VDD is applied to the source of P-channel MOS transistor 40 of NOR gate 15, and pseudo ground voltage V-GND is applied to the sources of N-channel MOS transistors 42, 43 thereof. In Variation 3, as one pull-down off transistor 16 is provided in common to the plurality of logic circuits 10 to 15, the number of pull-down off transistors 16 can be small. During a period in which logic circuits 10 to 15 are not operated, control signals φ1 and φ2 are controlled so as to turn off at least one of MOS transistors 55, 56, thereby cutting off the leakage current.

(Variation 4)

Figure 28:
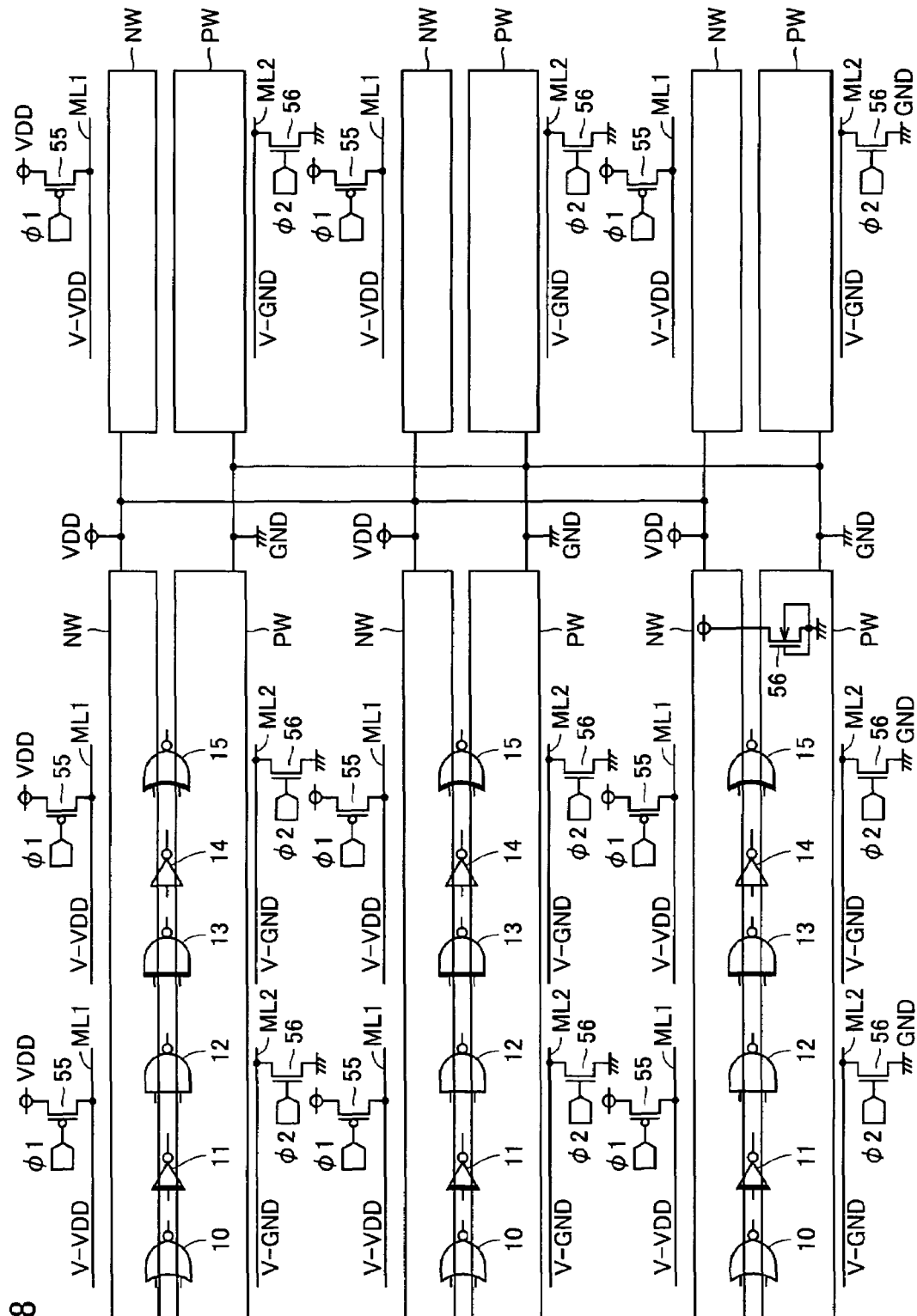
FIG. 28 illustrates Variation 4 of Embodiment 3.

FIG. 28 illustrates a configuration in Variation 4 of Embodiment 3. In Variation 4, a plurality of sets of N type well NW and P type well PW are provided, a plurality of N type wells NW are connected to each other and a plurality of P type wells PW are connected to each other, and pull-down off transistor 16 is provided for only one set of N type well NW and P type well PW. In Variation 4, the number of pull-down off transistors 16 can be small. During a period in which logic circuits 10 to 15 within prescribed wells NW, PW out of logic circuits 10 to 15 within the plurality of sets of wells NW, PW are not operated, control signals φ1 and φ2 corresponding to prescribed wells NW, PW are controlled so as to turn off at least one of MOS transistors 55, 56, thereby cutting off the leakage current in logic circuits 10 to 15 in prescribed wells NW, PW and the like.

Embodiment 4

Figure 29:
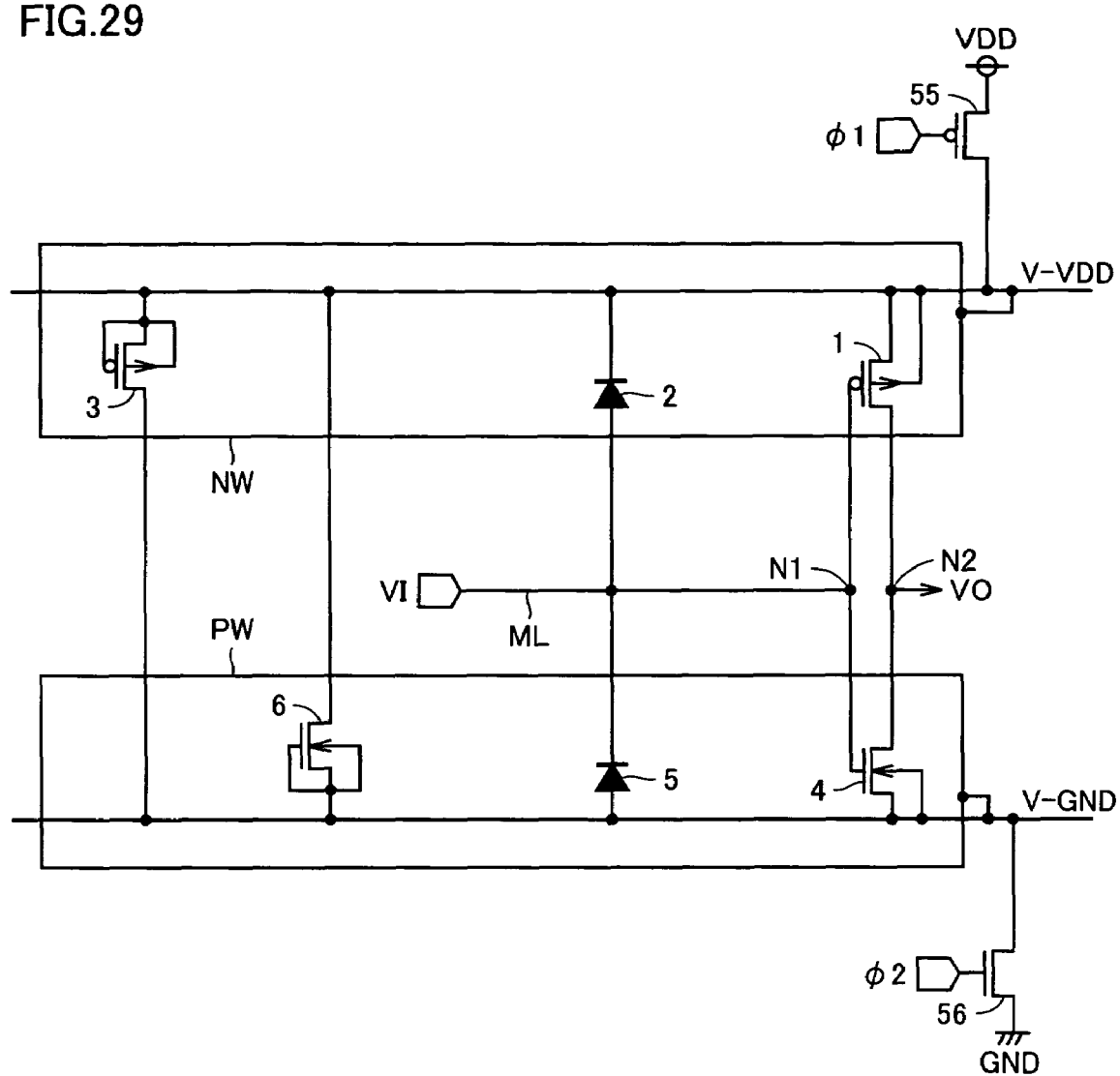
FIG. 29 illustrates a configuration of a CMOS LSI according to Embodiment 4 of the present invention.

FIG. 29 illustrates a configuration of a CMOS LSI according to Embodiment 4 of the present invention. The CMOS LSI is different from the CMOS LSI in FIG. 1 in that P-channel MOS transistor 55 and N-channel MOS transistor 56 are added.

P-channel MOS transistor 55 is connected between the line of power supply voltage VDD and N type well NW and receives control signal φ1 at its gate. The voltage of N type well NW is detected by a voltage detection circuit (not shown), and P-channel MOS transistor 55 is on/off-controlled by control signal φ1 such that the detected voltage is set to prescribed pseudo power supply voltage V-VDD lower than power supply voltage VDD.

N-channel MOS transistor 56 is connected between P type well PW and the line of ground voltage GND and receives control signal φ2 at its gate. The voltage of P type well PW is detected by a voltage detection circuit (not shown), and N-channel MOS transistor 56 is on/off-controlled by control signal φ2 such that the detected voltage is set to prescribed pseudo ground voltage V-GND higher than ground voltage GND.

Embodiment 4 not only achieves the effect the same as in Embodiment 1 but also achieves reduction in current consumption, because pseudo power supply voltage V-VDD and pseudo ground voltage V-GND are applied to wells NW, PW respectively so that leakage current in the CMOS LSI is decreased. During a period in which the inverter implemented by MOS transistors 1, 4 is not operated, control signals φ1 and φ2 are controlled so as to turn off at least one of MOS transistors 55, 56, thereby cutting off the leakage current.

As Embodiment 4 is susceptible of variations similar to Variations 1 to 4 of Embodiment 3, description thereof will not be repeated.

Embodiment 5

Figure 30:
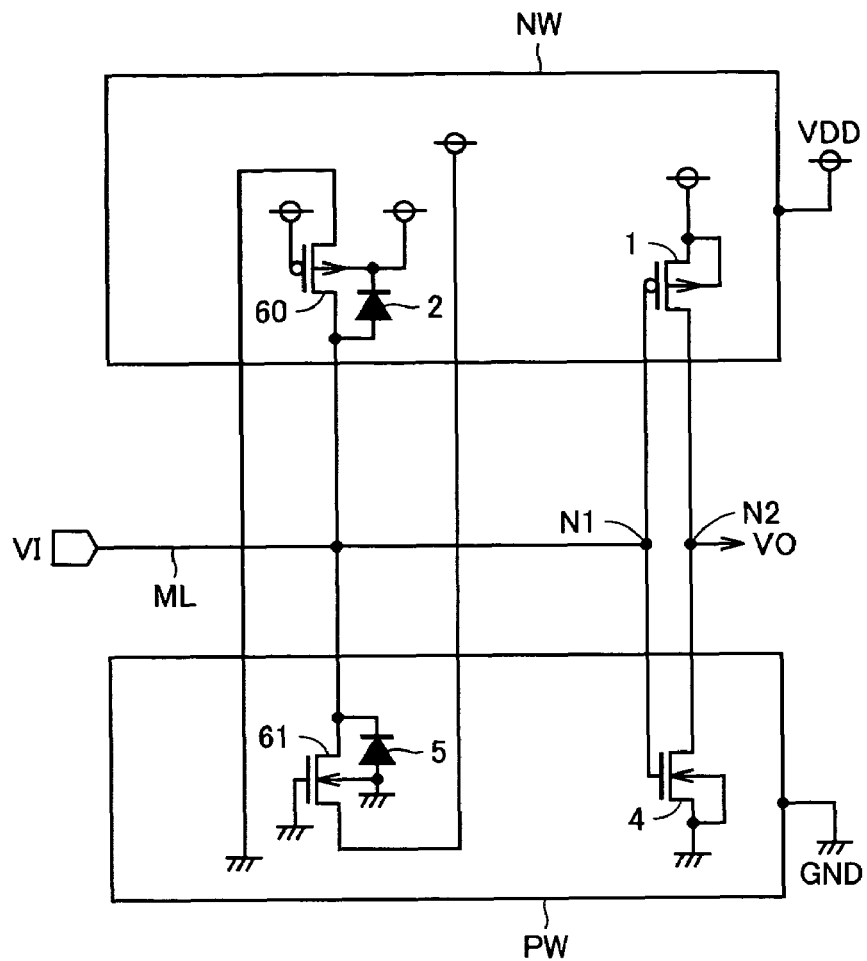
FIG. 30 illustrates a configuration of a CMOS LSI according to Embodiment 5 of the present invention.

FIG. 30 illustrates a configuration of a CMOS LSI according to Embodiment 5 of the present invention, in comparison with FIG. 1. The CMOS LSI in FIG. 30 is different from the CMOS LSI in FIG. 1 in that P-channel MOS transistor 3 and N-channel MOS transistor 6 are replaced with a P-channel MOS transistor 60 and an N-channel MOS transistor 61 respectively. Specifically, in the CMOS LSI, in addition to diodes 2, 5 serving as the first antenna ratio countermeasure, P-channel MOS transistor 60 and N-channel MOS transistor 61 are provided as a second antenna ratio countermeasure.

P-channel MOS transistor 60 is formed on the surface of N type well NW, has the gate and the back gate connected to N type well NW, has the source connected to metal interconnection ML, and has the drain connected to P type well PW. Diode 2 is connected between the source and the back gate of P-channel MOS transistor 60. N-channel MOS transistor 61 is formed on the surface of P type well PW, has the gate and the back gate connected to P type well PW, has the source connected to metal interconnection ML, and has the drain connected to N type well NW. Diode 5 is connected between the back gate and the source of N-channel MOS transistor 61.

Figure 31A:
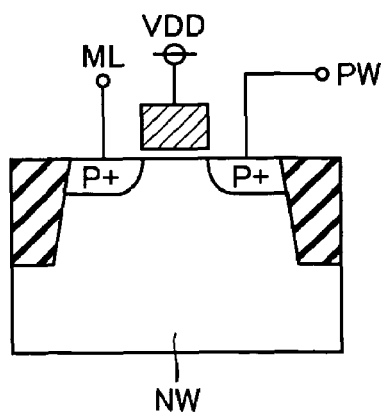
FIGS. 31A and 31B are cross-sectional views illustrating a configuration of an antenna ratio countermeasure circuit constituted of an MOS transistor and a diode shown in FIG. 30.

Turning to diode 2 and P-channel MOS transistor 60 as shown in FIG. 31A, P-channel MOS transistor 60 is formed on the surface of N type well NW. P-channel MOS transistor 60 has the source connected to metal interconnection ML, has the gate connected to N type well NW, and has the drain connected to P type well PW. N type well NW serves as the back gate of P-channel MOS transistor 60. Diode 2 is formed by a PN junction between the source connected to metal interconnection ML (P+ type impurity diffusion region) and N type well NW.

Figure 31B:
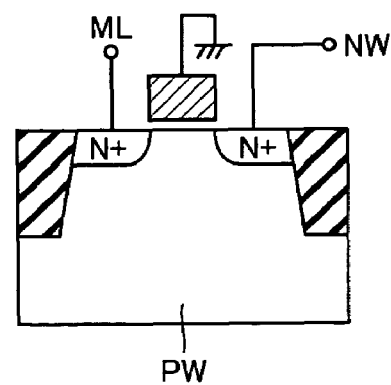

Turning to diode 5 and P-channel MOS transistor 61 as shown in FIG. 31B, N-channel MOS transistor 61 is formed on the surface of P type well PW. N-channel MOS transistor 61 has the source connected to metal interconnection ML, has the gate connected to P type well PW, and has the drain connected to N type well NW. P type well PW serves as the back gate of N-channel MOS transistor 61. Diode 5 is formed by a PN junction between P type well PW and the source connected to metal interconnection ML (N+ type impurity diffusion region).

Figure 32A:
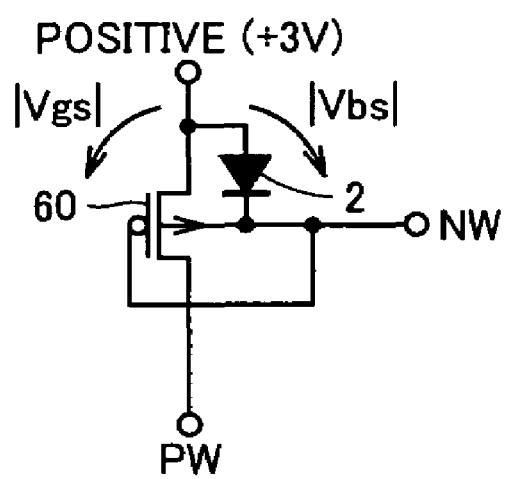
FIGS. 32A and 32B illustrate an operation of the antenna ratio countermeasure circuit constituted of the MOS transistor and the diode shown in FIG. 30.

An operation of the CMOS LSI during the plasma process will now be described. As shown in FIG. 32A, it is assumed that metal interconnection ML is charged to a positive voltage (for example, +3V) during the plasma process. If a forward bias voltage of the PN junction is set to 0.7V, an absolute value |Vgs| of a gate-source voltage of P-channel MOS transistor 60 is set to 0.7V, an absolute value |Vbs| of a back gate-source voltage thereof is set to 0.7V, and an absolute value |Vds| of a drain-source voltage thereof is set to 3V. As the back gate is thus forward-biased, the threshold voltage of P-channel MOS transistor 60 is lowered and P-channel MOS transistor 60 is rendered conductive. In addition, a bipolar action is also performed.

The positive charges born by metal interconnection ML are released to N type well NW through diode 2 as well as to P type well PW through P-channel MOS transistor 60. Accordingly, the voltage of metal interconnection ML is maintained at a level not higher than power supply voltage VDD+0.7V and the voltage between wells NW, PW can also be suppressed to a small value, whereby deterioration of the characteristic of MOS transistors 1, 4 connected to metal interconnection ML is prevented.

Figure 32B:
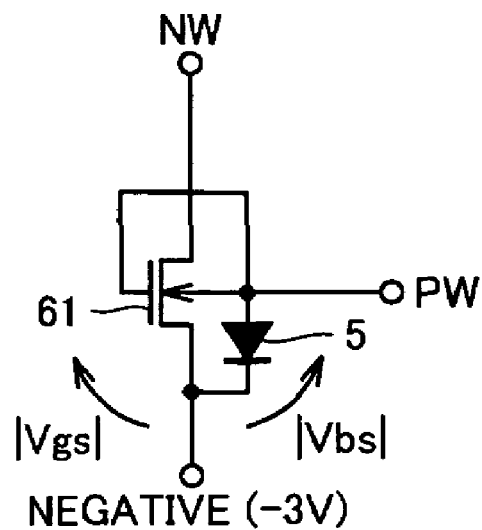

Alternatively, as shown in FIG. 32B, it is assumed that metal interconnection ML is charged to a negative voltage (for example, −3V) during the plasma process. Then, the absolute value |Vgs| of the gate-source voltage of N-channel MOS transistor 61 is set to 0.7V, the absolute value |Vbs| of the back gate-source voltage thereof is set to 0.7V, and the absolute value |Vds| of the drain-source voltage thereof is set to 3V. As the back gate is thus forward-biased, the threshold voltage of N-channel MOS transistor 61 is lowered and N-channel MOS transistor 61 is rendered conductive. In addition, a bipolar action is also performed.

The negative charges born by metal interconnection ML are released to P type well PW through diode 5 as well as to N type well NW through N-channel MOS transistor 61. Accordingly, the voltage of metal interconnection ML is maintained at a level not lower than ground voltage GND− 0.7V and the voltage between wells NW, PW can also be suppressed to a small value, whereby deterioration of the characteristic of MOS transistors 1, 4 connected to metal interconnection ML is prevented.

When input signal VI is at "H" level (power supply voltage VDD) or "L" level (ground voltage GND), diodes 2, 5 and MOS transistors 60, 61 are maintained in a non-conductive state, and an operation of the inverter is not adversely affected.

In Embodiment 5, pull-down MOS transistors 60, 61 are connected between metal interconnection ML and respective ones of wells PW, NW, and the voltage of metal interconnection ML and the voltage between wells NW, PW during the plasma process are suppressed to a small value. Therefore, even if the antenna ratio is high and the CMOS circuit is formed under a rule not larger than 100 nm, deterioration of MOS transistors 1, 4 can be prevented. Therefore, as it is not necessary to set the antenna ratio to a value not higher than a certain value, the layout is not restricted. In addition, as it is not necessary to consider the plasma damage, the degree of freedom in process development is higher.

(Variation 1)

Figure 33:
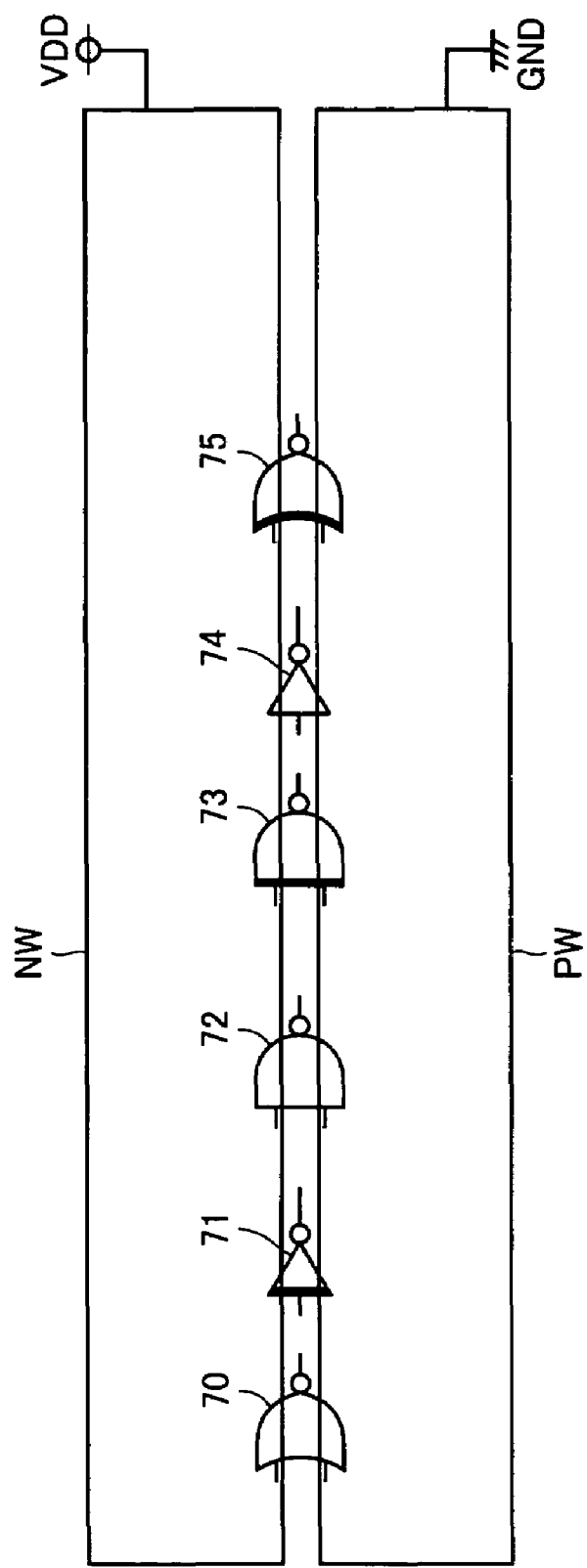
FIG. 33 illustrates Variation 1 of Embodiment 5.

FIG. 33 illustrates a configuration in Variation 1 of Embodiment 5. In Variation 1, a plurality of logic circuits 70 to 75 are provided for one set of N type well NW and P type well PW. Logic circuits 70 to 75 include logic circuits 70, 72, 74 connected to a relatively short metal interconnection and logic circuits 71, 73, 75 connected to a relatively long metal interconnection. Logic circuits 70, 72, 74 implement, for example, a normal NOR gate, an NAND gate and an inverter, respectively. Logic circuits 71, 73, 75 implement, for example, an inverter, an NAND gate and an NOR gate provided with an antenna ratio countermeasure circuit. N type well NW receives power supply voltage VDD, while P type well PW receives ground voltage GND.

As shown in FIGS. 34A and 34B, inverter 71 provided with the antenna ratio countermeasure circuit includes P-channel MOS transistor 20 and N-channel MOS transistor 21 implementing the inverter, a P-channel MOS transistor 82 and a diode 83 implementing an antenna ratio countermeasure circuit 81, and an N-channel MOS transistor 85 and a diode 86 implementing an antenna ratio countermeasure circuit 84. P-channel MOS transistors 20, 82 and diode 83 are formed on the surface of N type well NW, while N-channel MOS transistors 21, 85 and diode 86 are formed on the surface of P type well PW. P-channel MOS transistor 20 and N-channel MOS transistor 21 are connected in a manner as described in connection with FIGS. 7A and 7B. An inverted signal of input signal VI is output signal VO.

P-channel MOS transistor 82 has the gate and the back gate connected to N type well NW, has the source connected to input node N20 of the inverter, and has the drain connected to P type well PW. N-channel MOS transistor 85 has the gate and the back gate connected to P type well PW, has the source connected to input node N20 of the inverter, and has the drain connected to N type well NW. Diode 83 is connected between input node N20 and N type well NW, while diode 86 is connected between P type well PW and input node N20. Charges born at input node N20 are released to wells NW, PW through antenna ratio countermeasure circuits 81, 84. Damage to the gate oxide film in MOS transistors 20, 21 is thus prevented.

As shown in FIGS. 35A and 35B, NAND gate 73 with the antenna ratio countermeasure circuit includes P-channel MOS transistors 30, 31 and N-channel MOS transistors 32, 33 implementing the NAND gate and antenna ratio countermeasure circuits 87 to 90. Antenna ratio countermeasure circuits 87, 89 are configured similarly to antenna ratio countermeasure circuit 81 in FIG. 34B, while antenna ratio countermeasure circuits 88, 90 are configured similarly to antenna ratio countermeasure circuit 84 in FIG. 34B. P-channel MOS transistors 30, 31 and antenna ratio countermeasure circuits 87, 89 are formed on the surface of N type well NW, while N-channel MOS transistors 32, 33 and antenna ratio countermeasure circuits 88, 90 are formed on the surface of P type well PW.

P-channel MOS transistors 30, 31 and N-channel MOS transistors 32, 33 are connected in a manner as described in connection with FIG. 8B. Solely when input signals VI1, VI2 are both at "H" level, output signal VO is set to "L" level, and otherwise output signal VO is set to "H" level.

P-channel MOS transistor 82 in antenna ratio countermeasure circuit 87 is connected between input node N30 and P type well PW, while N-channel MOS transistor 85 in antenna ratio countermeasure circuit 88 is connected between input node N30 and N type well NW. P-channel MOS transistor 82 in antenna ratio countermeasure circuit 89 is connected between input node N31 and P type well PW, while N-channel MOS transistor 85 in antenna ratio countermeasure circuit 90 is connected between input node N31 and N type well NW. Charges born at input nodes N30, N31 are released to wells NW, PW through antenna ratio countermeasure circuits 87 to 90. Damage to the gate oxide film in MOS transistors 30 to 33 is thus prevented.

As shown in FIGS. 36A and 36B, NOR gate 75 provided with the antenna ratio countermeasure circuit includes P-channel MOS transistors 40, 41 and N-channel MOS transistors 42, 43 implementing the NOR gate and antenna ratio countermeasure circuits 91 to 94. Antenna ratio countermeasure circuits 91, 93 are configured similarly to antenna ratio countermeasure circuit 81 in FIG. 34B, while antenna ratio countermeasure circuits 92, 94 are configured similarly to antenna ratio countermeasure circuit 84 in FIG. 34B. P-channel MOS transistors 40, 41 and antenna ratio countermeasure circuits 91, 93 are formed on the surface of N type well NW, while N-channel MOS transistors 42, 43 and antenna ratio countermeasure circuits 92, 94 are formed on the surface of P type well PW.

P-channel MOS transistors 40, 41 and N-channel MOS transistors 42, 43 are connected in a manner as described in connection with FIG. 9B. Solely when input signals VI1, VI2 are both at "L" level, output signal VO is set to "H" level, and otherwise output signal VO is set to "L" level.

P-channel MOS transistor 82 in antenna ratio countermeasure circuit 91 is connected between input node N41 and P type well PW, while N-channel MOS transistor 85 in antenna ratio countermeasure circuit 92 is connected between input node N41 and N type well NW. P-channel MOS transistor 82 in antenna ratio countermeasure circuit 93 is connected between input node N42 and P type well PW, while N-channel MOS transistor 85 in antenna ratio countermeasure circuit 94 is connected between input node N42 and N type well NW. Charges born by input nodes N41, N42 are released to wells NW, PW through antenna ratio countermeasure circuits 91 to 94. Damage to the gate oxide films in MOS transistors 40 to 43 is thus prevented.

As shown in FIGS. 6 and 10, off transistor 16 may further be connected between N type well NW and P type well PW so as to lower the voltage between wells NW, PW.

Embodiment 6

Figure 37:
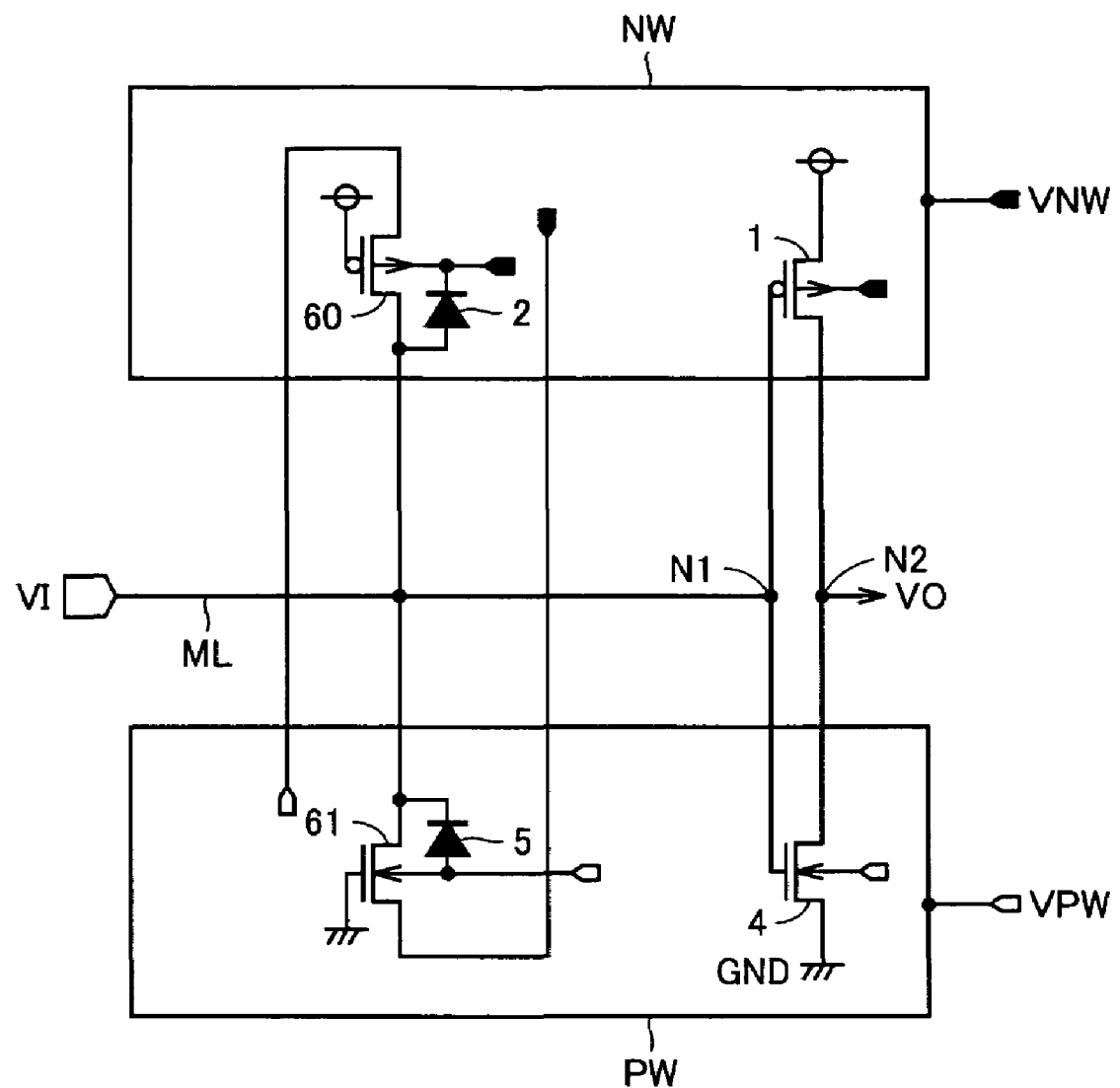
FIG. 37 illustrates a configuration of a CMOS LSI according to Embodiment 6 of the present invention.

FIG. 37 illustrates a configuration of a CMOS LSI according to Embodiment 6 of the present invention. The CMOS LSI is different from the CMOS LSI in FIG. 30 in that substrate voltage VNW higher than power supply voltage VDD is applied to N type well NW, substrate voltage VPW lower than ground voltage GND is applied to P type well PW, the source of P-channel MOS transistor 1 is disconnected from N type well NW and instead connected to the line of power supply voltage VDD, and the source of N-channel MOS transistor 4 is disconnected from P type well PW and instead connected to the line of ground voltage GND.

Embodiment 6 not only achieves the effect the same as in Embodiment 5 but also achieves reduction in current consumption in the CMOS LSI, because substrate voltages VNW, VPW are applied to the back gates of MOS transistors 1, 4 respectively so that absolute values of the threshold voltages of MOS transistors 1, 4 are increased and leakage current in MOS transistors 1, 4 is decreased.

(Variation 1)

Figure 38:
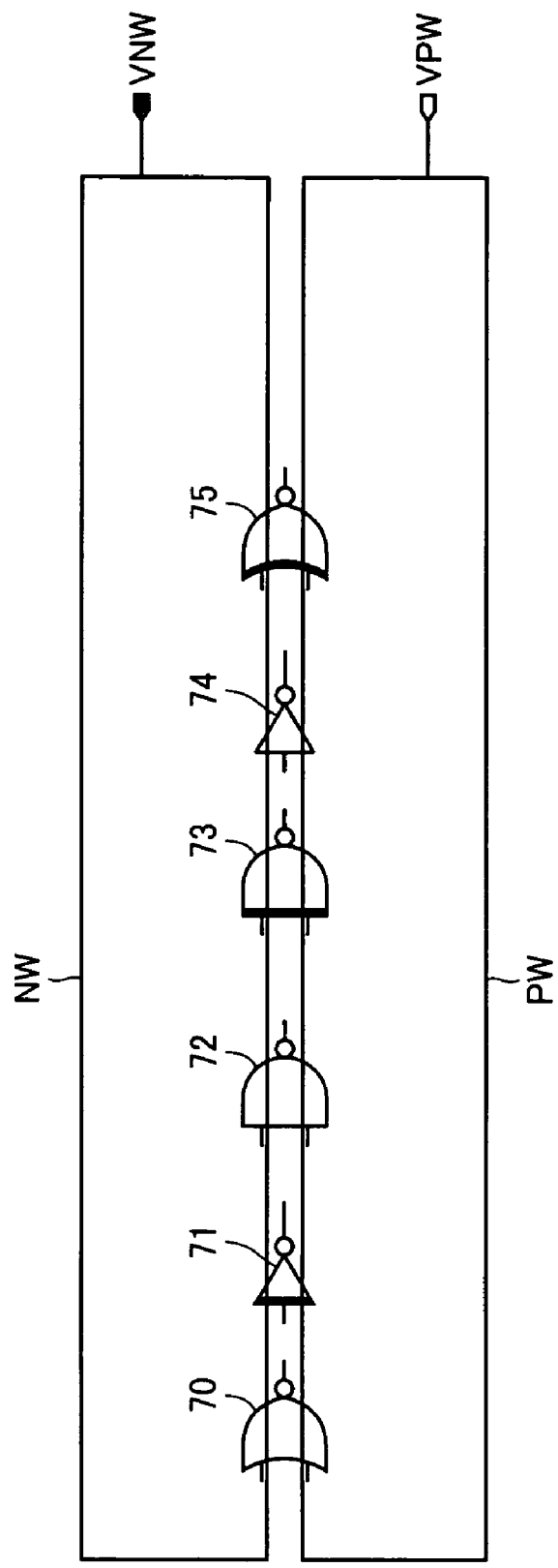
FIG. 38 illustrates Variation 1 of Embodiment 6.

FIG. 38 illustrates a configuration in Variation 1 of Embodiment 6. Variation 1 is different from the CMOS LSI in FIG. 33 in that substrate voltage VNW instead of power supply voltage VDD is applied to N type well NW and substrate voltage VPW instead of ground voltage GND is applied to P type well PW. It is noted that, as shown in FIGS. 39A and 39B, power supply voltage VDD is applied to the source of P-channel MOS transistor 20 of inverter 71 and ground voltage GND is applied to the source of N-channel MOS transistor 21 thereof. In addition, power supply voltage VDD is applied to the gate of P-channel MOS transistor 82, and ground voltage GND is applied to the gate of N-channel MOS transistor 85. Moreover, as shown in FIGS. 40A and 40B, power supply voltage VDD is applied to the sources of P-channel MOS transistors 30, 31 of NAND gate 73, and ground voltage is applied to the source of N-channel MOS transistor 33 thereof. As shown in FIGS. 41A and 41B, power supply voltage VDD is applied to the source of P-channel MOS transistor 40 of NOR gate 75 and ground voltage GND is applied to the sources of N-channel MOS transistors 42, 43 thereof. Variation 1 also achieves an effect the same as in Embodiment 6.

Embodiment 7

Figure 42:
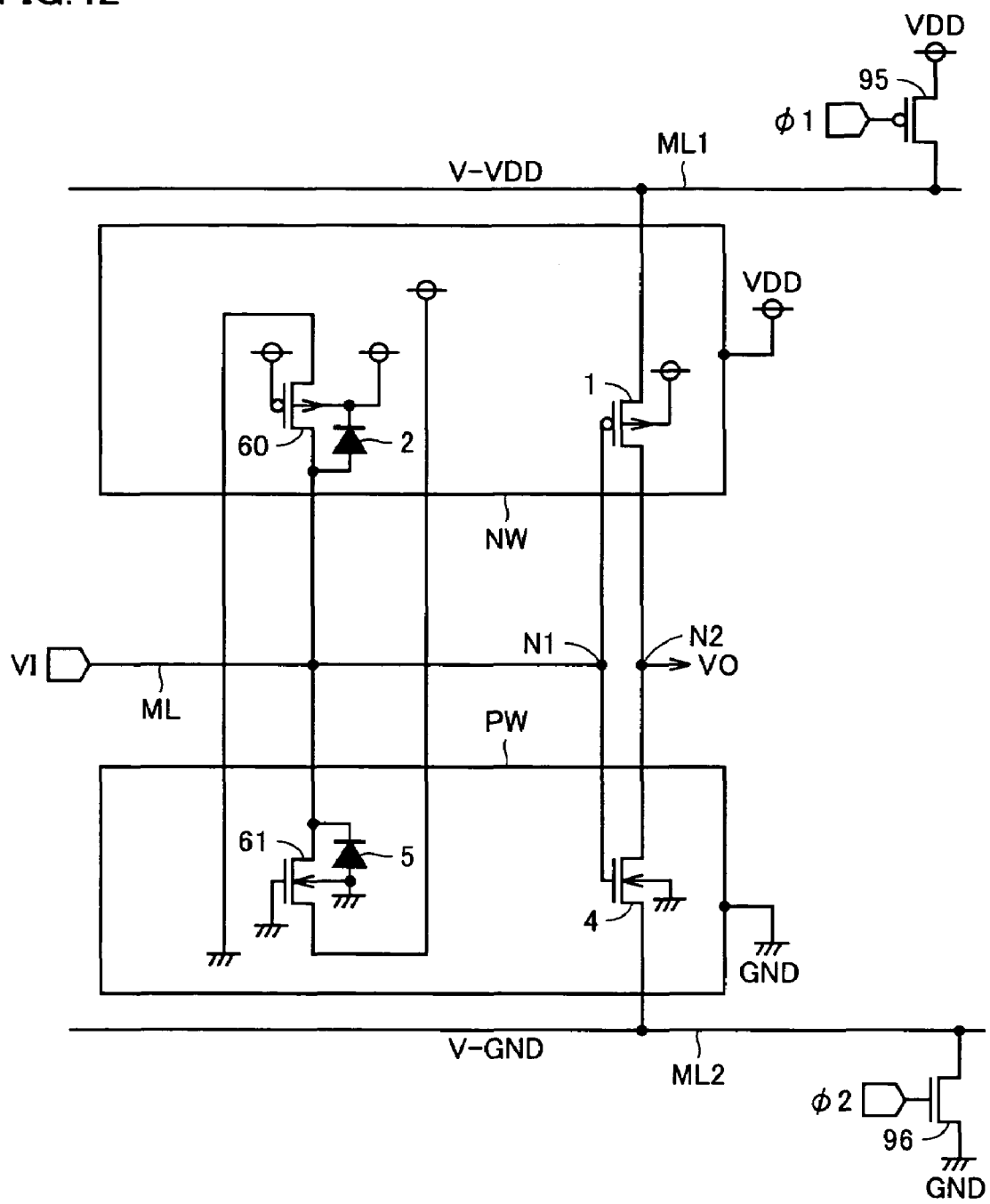
FIG. 42 illustrates a configuration of a CMOS LSI according to Embodiment 7 of the present invention.

FIG. 42 illustrates a configuration of a CMOS LSI according to Embodiment 7 of the present invention. The CMOS LSI is different from the CMOS LSI in FIG. 5 in that a P-channel MOS transistor 95, an N-channel MOS transistor 96 and metal interconnections ML1, ML2 are added.

P-channel MOS transistor 95 is connected between the line of power supply voltage VDD and metal interconnection ML1 and receives control signal φ1 at its gate. P-channel MOS transistor 1 has the source connected to metal interconnection ML1. The voltage of metal interconnection ML1 is detected by a voltage detection circuit (not shown), and P-channel MOS transistor 95 is on/off-controlled by control signal φ1 such that the detected voltage is set to prescribed pseudo power supply voltage V-VDD lower than power supply voltage VDD.

N-channel MOS transistor 96 is connected between metal interconnection ML2 and the line of ground voltage GND and receives control signal φ2 at its gate. N-channel MOS transistor 4 has the source connected to metal interconnection ML2. The voltage of metal interconnection ML2 is detected by a voltage detection circuit (not shown), and N-channel MOS transistor 96 is on/off-controlled by control signal φ2 such that the detected voltage is set to prescribed pseudo ground voltage V-GND higher than ground voltage GND.

Embodiment 7 not only achieves the effect the same as in Embodiment 5 but also achieves reduction in current consumption in the CMOS LSI, because pseudo power supply voltage V-VDD and pseudo ground voltage V-GND are applied to the sources of MOS transistors 1, 4 respectively so that leakage current in MOS transistors 1, 4 is decreased. During a period in which the inverter implemented by MOS transistors 1, 4 is not operated, control signals φ1 and φ2 are controlled so as to turn off at least one of MOS transistors 95, 96, thereby cutting off the leakage current.

(Variation 1)

Figure 43:
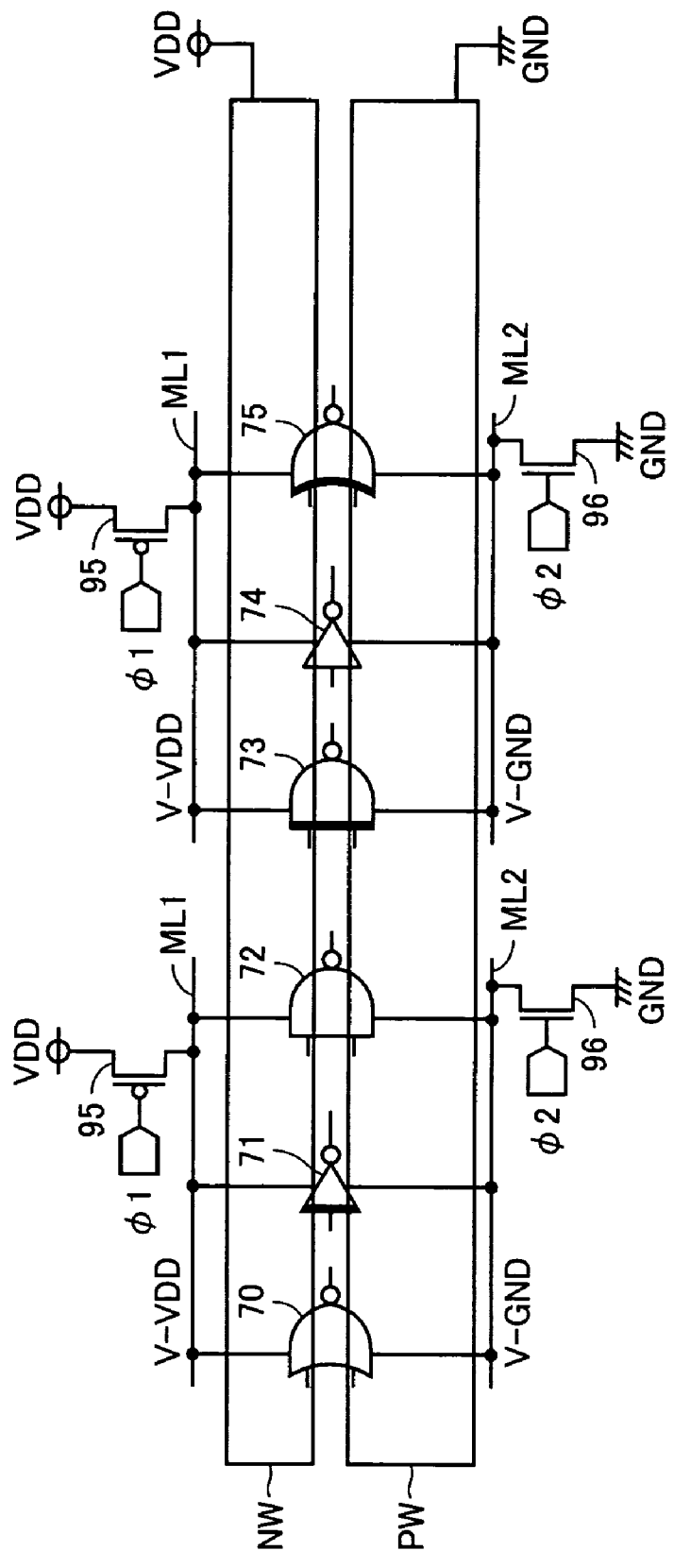
FIG. 43 illustrates Variation 1 of Embodiment 7.
Figure 44A:
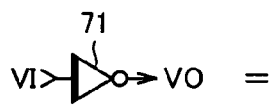
FIGS. 44A and 44B illustrate a configuration of an inverter provided with a diode serving as antenna ratio countermeasure shown in FIG. 43.
Figure 44B:
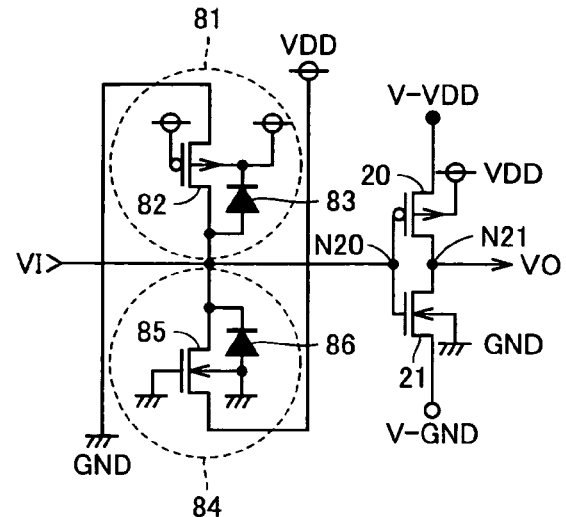
Figure 45A:
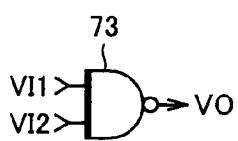
FIGS. 45A and 45B illustrate a configuration of an NAND gate provided with a diode serving as antenna ratio countermeasure shown in FIG. 43.
Figure 45B:
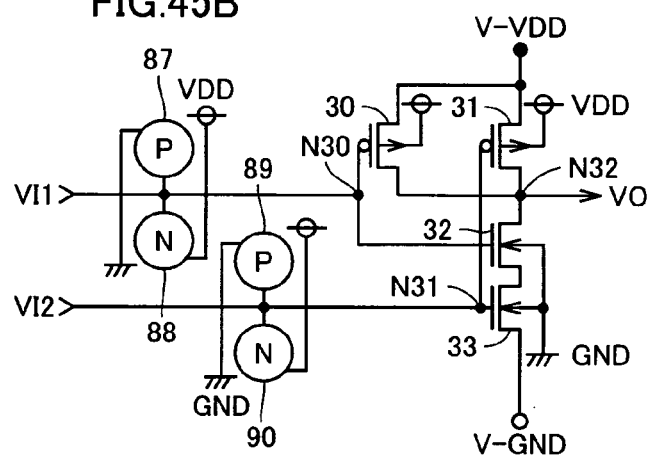
Figure 46A:
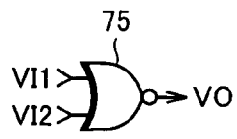
FIGS. 46A and 46B illustrate a configuration of an NOR gate provided with a diode serving as antenna ratio countermeasure shown in FIG. 43.
Figure 46B:
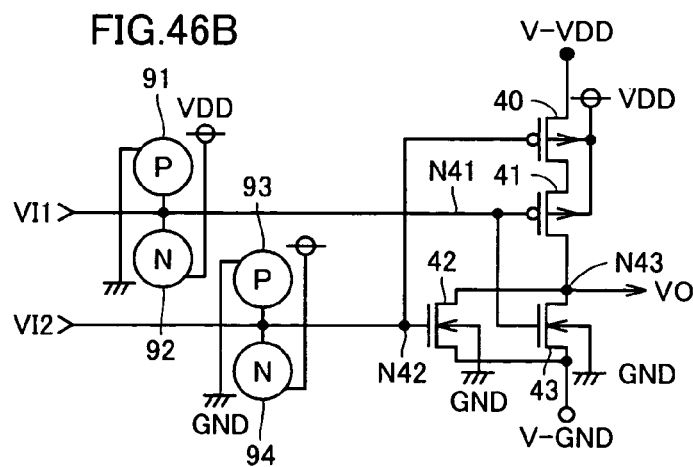

FIG. 43 illustrates a configuration in Variation 1 of Embodiment 7. Variation 1 is different from the CMOS LSI in FIG. 33 in that pseudo power supply voltage V-VDD and pseudo ground voltage V-GND are applied to logic circuits 70 to 75. Specifically, as shown in FIGS. 44A and 44B, pseudo power supply voltage V-VDD and pseudo ground voltage V-GND are applied to the sources of MOS transistors 20, 21 of inverter 71 respectively. In addition, as shown in FIGS. 45A and 45B, pseudo power supply voltage V-VDD is applied to the sources of P-channel MOS transistors 30, 31 of NAND gate 73, and pseudo ground voltage V-GND is applied to the source of N-channel MOS transistor 33 thereof. Moreover, as shown in FIGS. 46A and 46B, pseudo power supply voltage V-VDD is applied to the source of P-channel MOS transistor 40 of NOR gate 75, and pseudo ground voltage V-GND is applied to the sources of N-channel MOS transistors 42, 43 thereof. Variation 1 also achieves an effect the same as in Embodiment 7. During a period in which logic circuits 70 to 75 are not operated, control signals φ1 and φ2 are controlled so as to turn off at least one of MOS transistors 95, 96, thereby cutting off the leakage current.

Embodiment 8

Figure 47:
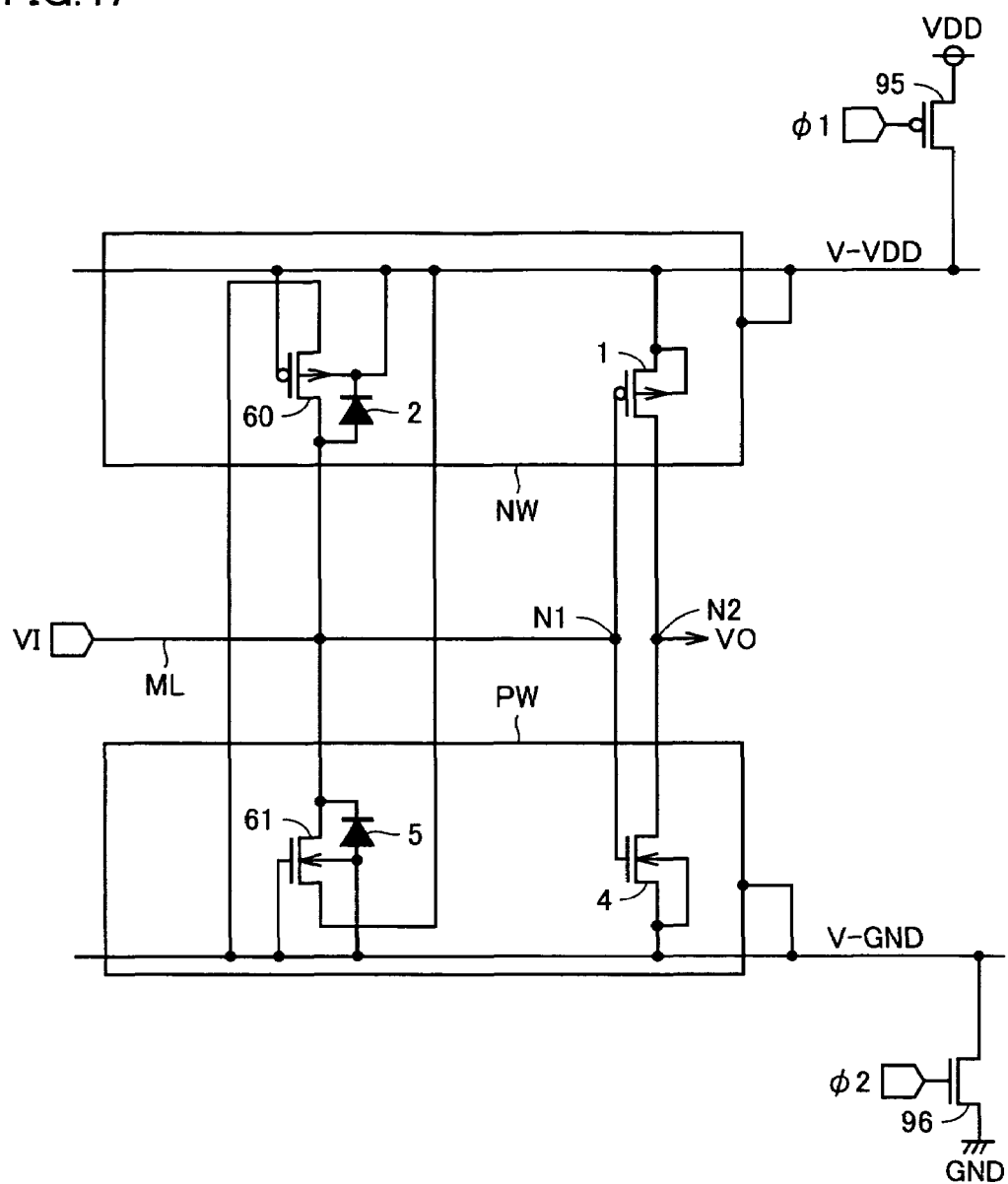
FIG. 47 illustrates a configuration of a CMOS LSI according to Embodiment 8 of the present invention.

FIG. 47 illustrates a configuration of a CMOS LSI according to Embodiment 8 of the present invention. The CMOS LSI is different from the CMOS LSI in FIG. 1 in that P-channel MOS transistor 95 and N-channel MOS transistor 96 are added.

P-channel MOS transistor 95 is connected between the line of power supply voltage VDD and N type well NW and receives control signal φ1 at its gate. The voltage of N type well NW is detected by a voltage detection circuit (not shown), and P-channel MOS transistor 95 is on/off-controlled by control signal φ1 such that the detected voltage is set to prescribed pseudo power supply voltage V-VDD lower than power supply voltage VDD.

N-channel MOS transistor 96 is connected between P type well PW and the line of ground voltage GND and receives control signal φ2 at its gate. The voltage of P type well PW is detected by a voltage detection circuit (not shown), and N-channel MOS transistor 96 is on/off-controlled by control signal φ2 such that the detected voltage is set to prescribed pseudo ground voltage V-GND higher than ground voltage GND.

Embodiment 8 not only achieves the effect the same as in Embodiment 5 but also achieves reduction in current consumption, because pseudo power supply voltage V-VDD and pseudo ground voltage V-GND are applied to wells NW, PW respectively so that leakage current in the CMOS LSI is decreased. During a period in which the inverter implemented by MOS transistors 1, 4 is not operated, control signals φ1 and φ2 are controlled so as to turn off at least one of MOS transistors 95, 96, thereby cutting off the leakage current.

(Variation 1)

Figure 48:
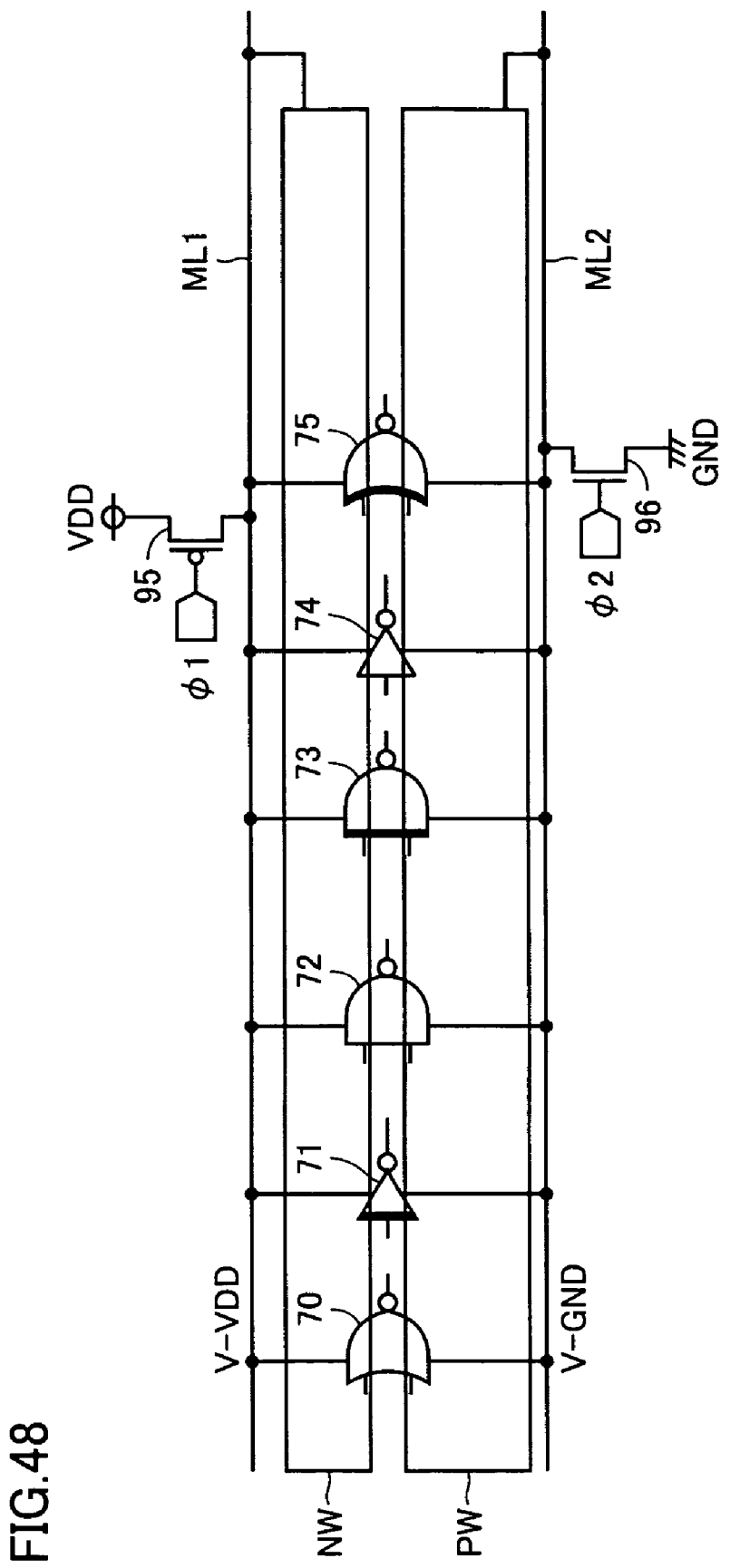
FIG. 48 illustrates Variation 1 of Embodiment 8.

FIG. 48 illustrates a configuration in Variation 1 of Embodiment 8. Variation 1 is different from the CMOS LSI in FIG. 33 in that pseudo power supply voltage V-VDD and pseudo ground voltage V-GND are applied to wells NW, PW respectively and pseudo power supply voltage V-VDD and pseudo ground voltage V-GND are applied to logic circuits 70 to 75. Specifically, as shown in FIGS. 49A and 49B, pseudo power supply voltage V-VDD is applied to the source and the back gate of MOS transistor 20 of inverter 71, and pseudo ground voltage V-GND is applied to the source and the back gate of MOS transistor 21 of inverter 71.

In addition, pseudo ground voltage V-GND is applied to the drain of P-channel MOS transistor 82 in antenna ratio countermeasure circuit 81, and pseudo power supply voltage V-VDD is applied to the gate and the back gate thereof. Pseudo power supply voltage V-VDD is applied to the cathode of diode 83. In addition, pseudo power supply voltage V-VDD is applied to the drain of P-channel MOS transistor 85 in antenna ratio countermeasure circuit 84, and pseudo ground voltage V-GND is applied to the gate and the back gate thereof. Pseudo ground voltage V-GND is applied to the anode of diode 86.

As shown in FIGS. 50A and 50B, pseudo power supply voltage V-VDD is applied to the sources of P-channel MOS transistors 30, 31 of NAND gate 73, and pseudo ground voltage V-GND is applied to the source of N-channel MOS transistor 33 thereof. Pseudo power supply voltage V-VDD and pseudo ground voltage V-GND are applied to antenna ratio countermeasure circuits 87, 89 respectively, as in the case of antenna ratio countermeasure circuit 81. Pseudo power supply voltage V-VDD and pseudo ground voltage V-GND are applied to antenna ratio countermeasure circuits 88, 90 respectively, as in the case of antenna ratio countermeasure circuit 84.

As shown in FIGS. 51A and 51B, pseudo power supply voltage V-VDD is applied to the source and the back gate of P-channel MOS transistor 40 of NOR gate 75, pseudo power supply voltage V-VDD is applied to the back gate of P-channel MOS transistor 41 thereof, and pseudo ground voltage V-GND is applied to the sources and the back gates of N-channel MOS transistors 42, 43 thereof. Pseudo power supply voltage V-VDD and pseudo ground voltage V-GND are applied to antenna ratio countermeasure circuits 91, 93 respectively, as in the case of antenna ratio countermeasure circuit 81. Pseudo power supply voltage V-VDD and pseudo ground voltage V-GND are applied to antenna ratio countermeasure circuits 92, 94 respectively, as in the case of antenna ratio countermeasure circuit 84. Variation 1 also achieves an effect the same as in Embodiment 8. During a period in which logic circuits 70 to 75 are not operated, control signals φ1 and φ2 are controlled so as to turn off at least one of MOS transistors 95, 96, thereby cutting off the leakage current.

Embodiment 9

Figure 52:
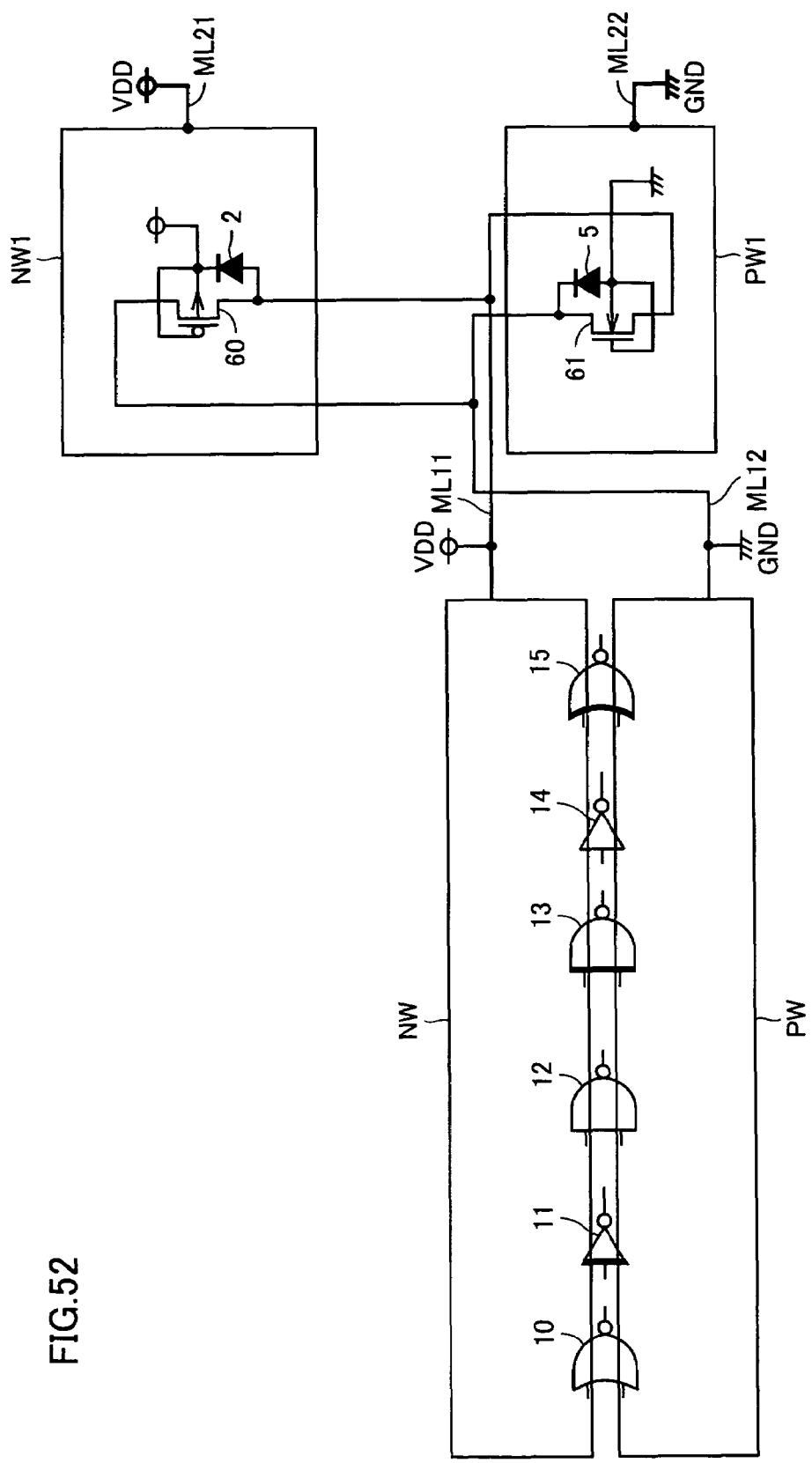
FIG. 52 illustrates a configuration of a CMOS LSI according to Embodiment 9 of the present invention.

FIG. 52 illustrates a configuration of a CMOS LSI according to Embodiment 9 of the present invention. In FIG. 52, the CMOS LSI includes N type wells NW, NW1 and P type wells PW, PW1 formed on the semiconductor substrate. A pair of wells NW, PW and a pair of wells NW1, PW1 are isolated from each other until a metal layer is stacked.

A plurality of logic circuits 10 to 15 are provided on the surface of wells NW, PW. Logic circuits 10 to 15 include logic circuits 10, 12, 14 connected to a relatively short metal interconnection and logic circuits 11, 13, 15 connected to a relatively long metal interconnection. Logic circuits 10, 12, 14 implement, for example, a normal NOR gate, an NAND gate and an inverter, respectively. Logic circuits 11, 13, 15 implement, for example, an inverter, an NAND gate and an NOR gate provided with a diode serving as an antenna ratio countermeasure. The configuration and the operation of inverter 11, NAND gate 13 and NOR gate 15 with the diode serving as antenna ratio countermeasure are as described in connection with FIGS. 7A, 7B to 9A, 9B. N type well NW receives power supply voltage VDD through a lower metal interconnection ML11. P type well PW receives ground voltage GND through a lower metal interconnection ML12.

An antenna ratio countermeasure circuit constituted of P-channel MOS transistor 60 and diode 2 shown in FIG. 30 is formed on the surface of N type well NW1. The source of P-channel MOS transistor 60 and the anode of diode 2 are connected to N type well NW through lower metal interconnection ML11. The drain of P-channel MOS transistor 60 is connected to P type well PW through lower metal interconnection ML12. N type well NW1 receives power supply voltage VDD through an upper metal interconnection ML21. When the voltage between N type well NW and P type well PW exceeds VDD+0.7V, P-channel MOS transistor 60 and diode 2 are rendered conductive, and therefore, the voltage between wells NW, PW is maintained at a level not higher than VDD+0.7V.

An antenna ratio countermeasure circuit constituted of N-channel MOS transistor 61 and diode 5 shown in FIG. 30 is formed on the surface of P type well PW1. The drain of N-channel MOS transistor 61 is connected to N type well NW through lower metal interconnection ML11. The source of N-channel MOS transistor 61 and the cathode of diode 5 are connected to P type well PW through lower metal interconnection ML12. P type well PW1 receives ground voltage GND through an upper metal interconnection ML22. When the voltage between N type well NW and P type well PW exceeds VDD+0.7V, N-channel MOS transistor 61 and diode 5 are rendered conductive, and therefore, the voltage between wells NW, PW is maintained at a level not higher than VDD+0.7V.

As the voltage between wells NW, PW is maintained at a level not higher than VDD+0.7V in Embodiment 9, damage to the gate oxide film in the MOS transistor within logic circuits 10 to 15 is prevented.

It is noted that solely one of the antenna ratio countermeasure circuit constituted of P-channel MOS transistor 60 and diode 2 and the antenna ratio countermeasure circuit constituted of N-channel MOS transistor 61 and diode 5 may be provided. Alternatively, one set of antenna ratio countermeasure circuits may be provided in common to a plurality of sets of N type well NW and P type well PW.

(Variation 1)

Figure 53:
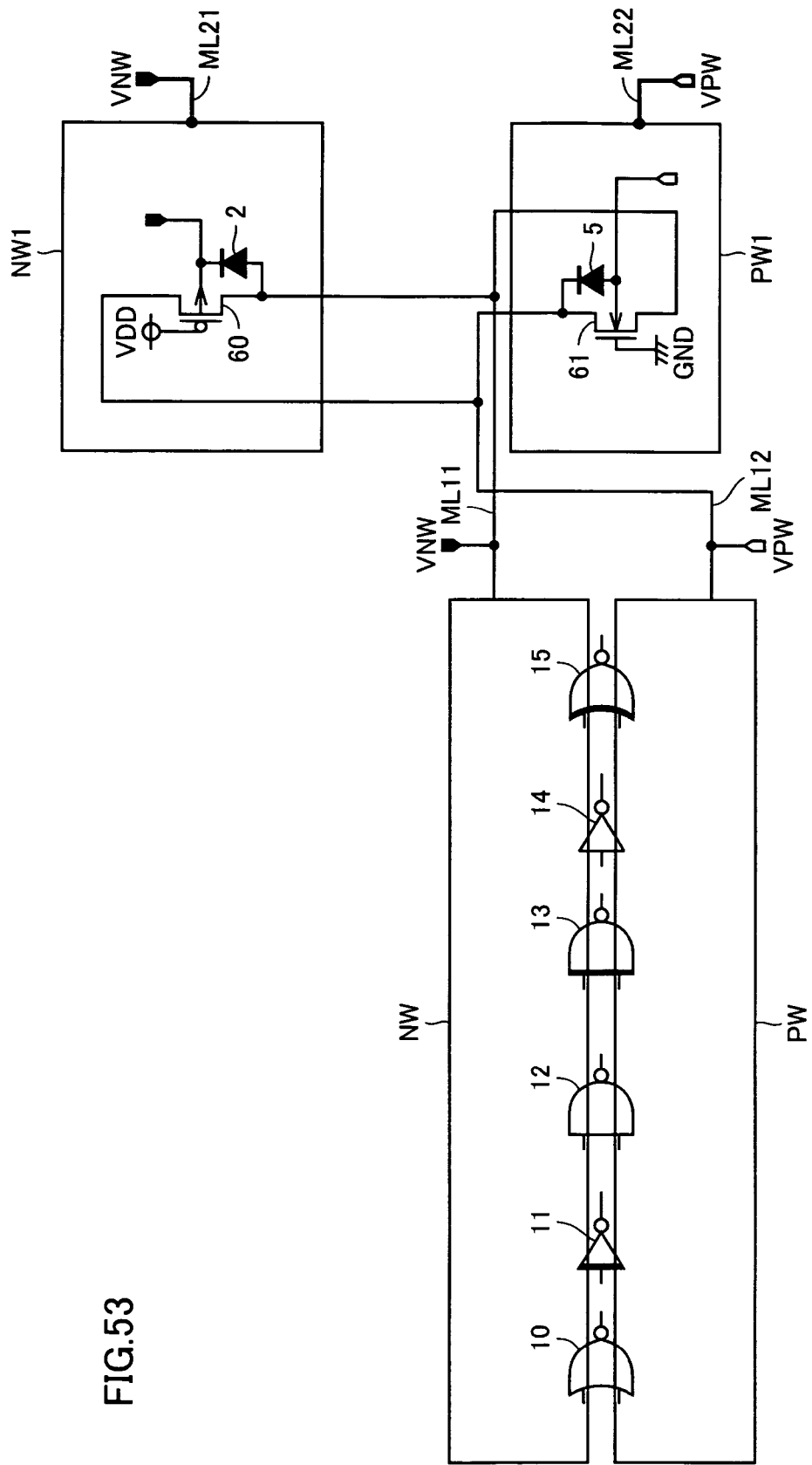
FIG. 53 illustrates Variation 1 of Embodiment 9.

FIG. 53 illustrates Variation 1 of Embodiment 9. In Variation 1 shown in FIG. 53, substrate voltages VNW, VPW are applied to lower metal interconnections ML11, ML12 respectively, while substrate voltages VNW, VPW are applied to upper metal interconnections ML21, ML22 respectively. The configuration and the operation of inverter 11, NAND gate 13 and NOR gate 15 with the diode serving as antenna ratio countermeasure are as described in connection with FIGS. 17A, 17B to 19A, 19B. Power supply voltage VDD is applied to the gate of P-channel MOS transistor 60, and ground voltage GND is applied to the gate of N-channel MOS transistor 61. Variation 1 not only achieves the effect the same as in Embodiment 9 but also achieves reduction in current consumption, because substrate voltage VNW higher than power supply voltage VDD and substrate voltage VPW lower than ground voltage GND are employed so that leakage current in the MOS transistor is decreased.

(Variation 2)

Figure 54:
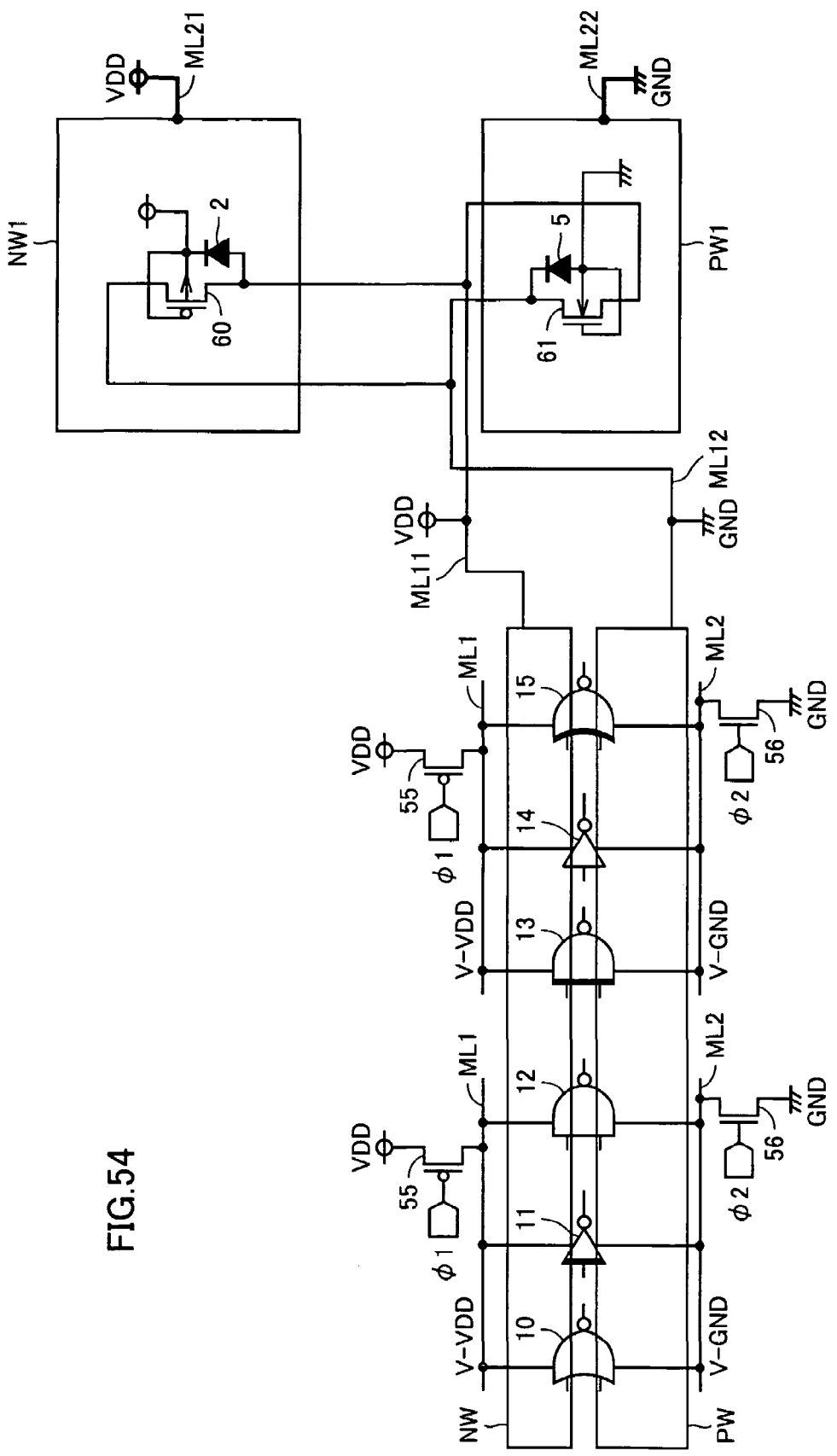
FIG. 54 illustrates Variation 2 of Embodiment 9.

FIG. 54 illustrates Variation 2 of Embodiment 9. In Variation 2 shown in FIG. 54, pseudo power supply voltage V-VDD and pseudo ground voltage V-GND are applied to each of logic circuits 10 to 15. The configuration and the operation of inverter 11, NAND gate 13 and NOR gate 15 with the diode serving as antenna ratio countermeasure are as described in connection with FIGS. 25A, 25B to 27A, 27B. Variation 2 not only achieves the effect the same as in Embodiment 9 but also achieves reduction in current consumption, because pseudo power supply voltage V-VDD lower than power supply voltage VDD and pseudo ground voltage V-GND higher than ground voltage GND are employed so that leakage current in the MOS transistor is decreased. During a period in which logic circuits 10 to 15 are not operated, control signals φ1 and φ2 are controlled so as to turn off at least one of MOS transistors 55, 56, thereby cutting off the leakage current.

Embodiment 10

Figure 55:
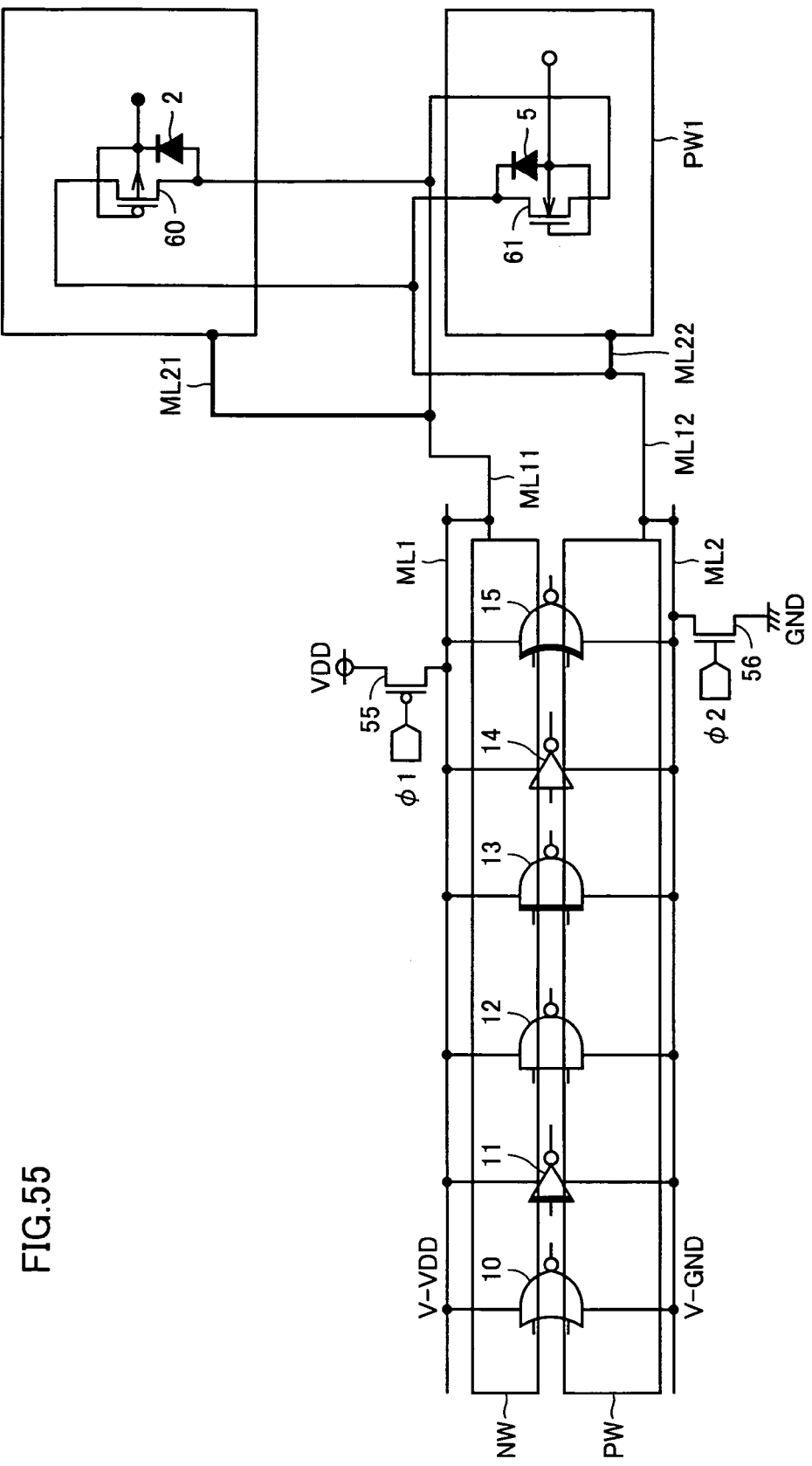
FIG. 55 illustrates a configuration of a CMOS LSI according to Embodiment 10 of the present invention.

FIG. 55 illustrates a configuration of a CMOS LSI according to Embodiment 10 of the present invention. In FIG. 55, the CMOS LSI includes N type wells NW, NW1 and P type wells PW, PW1 formed on the semiconductor substrate. A pair of wells NW, PW and a pair of wells NW1, PW1 are isolated from each other until a metal layer is stacked. N type well NW receives pseudo power supply voltage V-VDD through lower metal interconnection ML11. P type well PW receives pseudo ground voltage V-GND through lower metal interconnection ML12.

A plurality of logic circuits 10 to 15 are provided on the surface of wells NW, PW. Logic circuits 10 to 15 include logic circuits 10, 12, 14 connected to a relatively short metal interconnection and logic circuits 11, 13, 15 connected to a relatively long metal interconnection. Logic circuits 10, 12, 14 implement, for example, a normal NOR gate, an NAND gate and an inverter, respectively. Logic circuits 11, 13, 15 implement, for example, an inverter, an NAND gate and an NOR gate provided with a diode serving as an antenna ratio countermeasure. The configuration and the operation of inverter 11, NAND gate 13 and NOR gate 15 with the diode serving as antenna ratio countermeasure are as described in connection with FIGS. 7A, 7B to 9A, 9B. It is noted, however, that pseudo power supply voltage V-VDD instead of power supply voltage VDD is applied and pseudo ground voltage V-GND instead of ground voltage GND is applied.

An antenna ratio countermeasure circuit constituted of P-channel MOS transistor 60 and diode 2 shown in FIG. 30 is formed on the surface of N type well NW1. The source of P-channel MOS transistor 60 and the anode of diode 2 are connected to N type well NW through lower metal interconnection ML11. The drain of P-channel MOS transistor 60 is connected to P type well PW through lower metal interconnection ML12. N type well NW1 receives pseudo power supply voltage V-VDD through lower metal interconnection ML11 and upper metal interconnection ML21. When the voltage between N type well NW and P type well PW exceeds (V-VDD)−(V-GND)+0.7V, P-channel MOS transistor 60 and diode 2 are rendered conductive, and therefore, the voltage between wells NW, PW is maintained at a level not higher than (V-VDD)−(V-GND)+0.7V.

An antenna ratio countermeasure circuit constituted of N-channel MOS transistor 61 and diode 5 shown in FIG. 30 is formed on the surface of P type well PW1. The drain of N-channel MOS transistor 61 is connected to N type well NW through lower metal interconnection ML11. The source of N-channel MOS transistor 61 and the cathode of diode 5 are connected to P type well PW through lower metal interconnection ML12. P type well PW1 receives pseudo ground voltage V-GND through lower metal interconnection ML12 and upper metal interconnection ML22. When the voltage between N type well NW and P type well PW exceeds (V-VDD)−(V-GND)+0.7V, N-channel MOS transistor 61 and diode 5 are rendered conductive, and therefore, the voltage between wells NW, PW is maintained at a level not higher than (V-VDD)−(V-GND)+0.7V.

As the voltage between wells NW, PW is maintained at a level not higher than (V-VDD)−(V-GND)+0.7V in Embodiment 10, damage to the gate oxide film in the MOS transistor within logic circuits 10 to 15 is prevented. During a period in which logic circuits 10 to 15 are not operated, control signals φ1 and φ2 are controlled so as to turn off at least one of MOS transistors 55, 56, thereby cutting off the leakage current.

It is noted that solely one of the antenna ratio countermeasure circuit constituted of P-channel MOS transistor 60 and diode 2 and the antenna ratio countermeasure circuit constituted of N-channel MOS transistor 61 and diode 5 may be provided. Alternatively, one set of antenna ratio countermeasure circuits may be provided in common to a plurality of sets of N type well NW and P type well PW.

Embodiment 11

Figure 56:
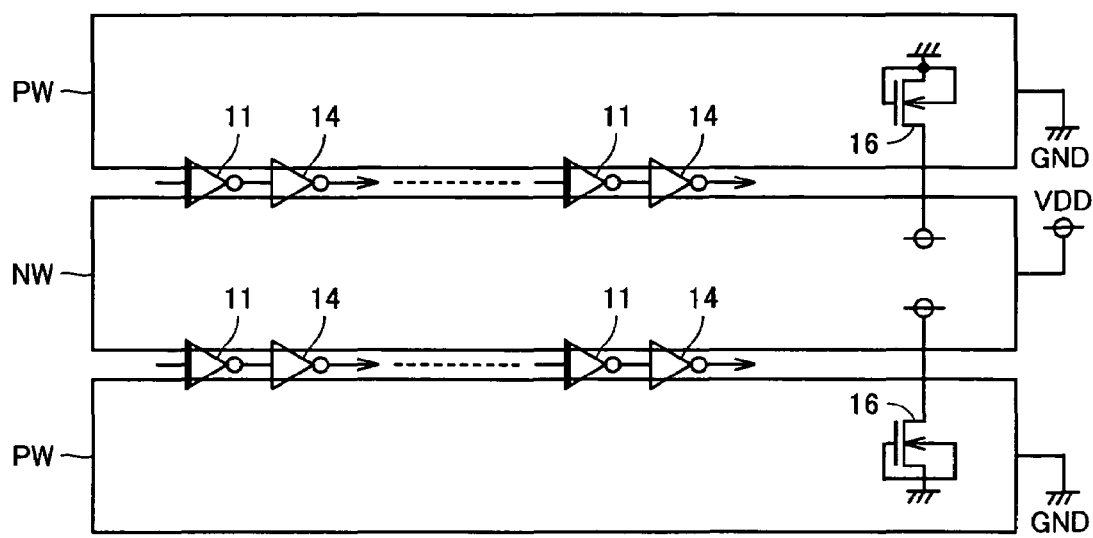
FIG. 56 illustrates a configuration of a CMOS LSI according to Embodiment 11 of the present invention.

FIG. 56 illustrates a configuration of a CMOS LSI according to Embodiment 11 of the present invention. In the CMOS LSI shown in FIG. 56, two P type wells PW are formed on the surface of the semiconductor substrate, with N type well NW being formed therebetween. A plurality of sets of inverters 11, 14 connected in series and N-channel MOS transistor 16 serving as the second antenna ratio countermeasure are provided between one P type well PW and N type well NW. A plurality of sets of inverters 11, 14 connected in series and N-channel MOS transistor 16 serving as the second antenna ratio countermeasure are provided also between the other P type well PW and N type well NW.

Inverter 11 serves as the inverter provided with the diode serving as antenna ratio countermeasure shown in FIGS. 7A and 7B, and includes P-channel MOS transistor 20 and N-channel MOS transistor 21 implementing the inverter and diodes 22, 23 serving as antenna ratio countermeasure. Inverter 14 is a normal inverter shown in FIG. 1, and includes P-channel MOS transistor 1 and N-channel MOS transistor 4.

Figure 57:
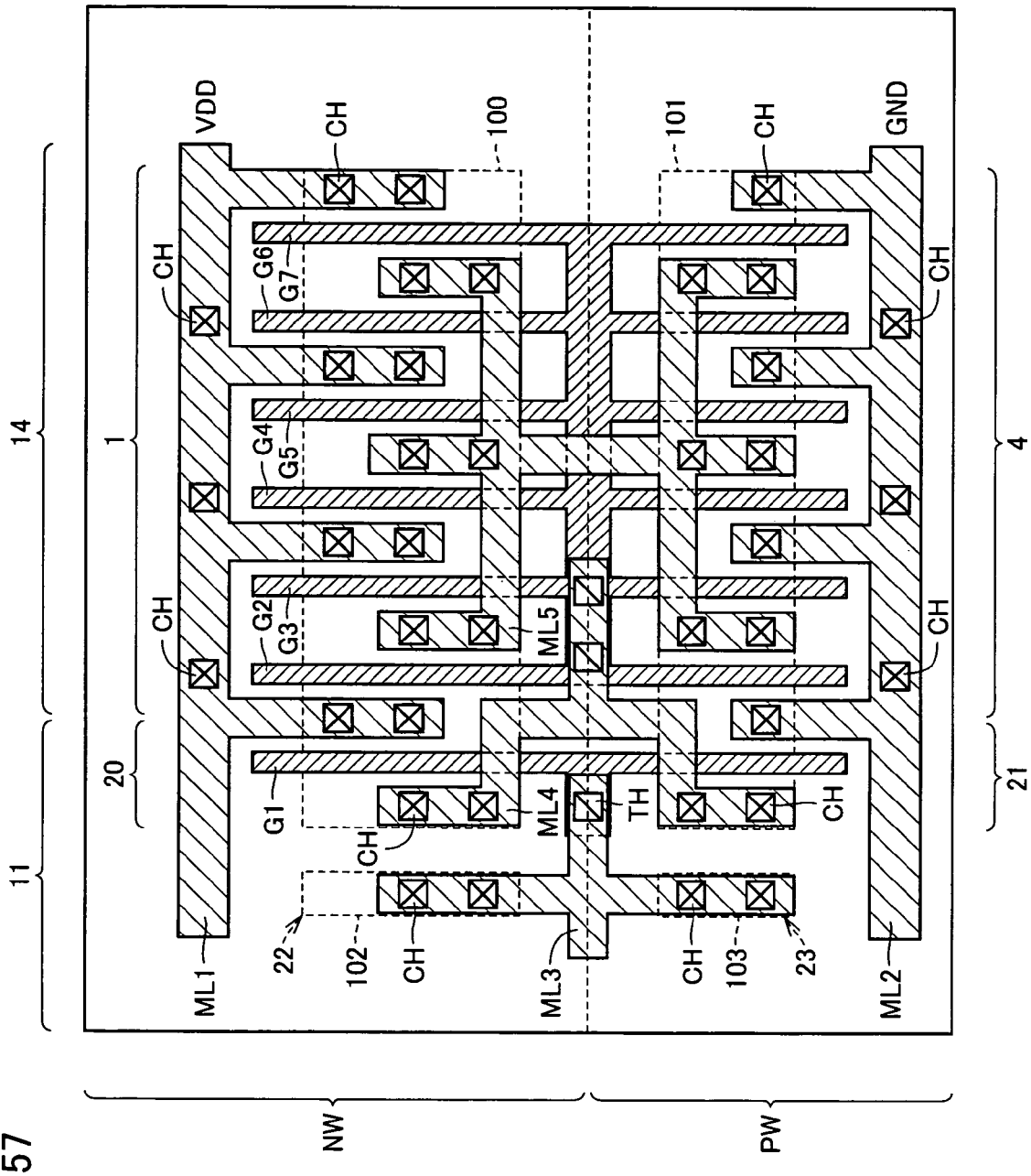
FIG. 57 illustrates a layout of an inverter shown in FIG. 56.

FIG. 57 illustrates a layout of a set of inverters 11, 14. In FIG. 57, N type well NW and P type well PW are formed adjacent to each other on the surface of the semiconductor substrate. A plurality of (seven in FIG. 57) gate electrodes G1 to G7 orthogonal to a boundary between N type well NW and P type well PW are formed at prescribed pitches, and central portions of gate electrodes G2 to G7 are commonly connected. A p+ type diffusion layer 100 is formed on the surface of N type well NW using gate electrodes G1 to G7 as a mask, and an N+ type diffusion layer 101 is formed on the surface of P type well PW using gate electrodes G1 to G7 as a mask.

Gate electrode G1, P+ type diffusion layer 100 on opposing sides thereof, and N type well NW implement P-channel MOS transistor 20, while gate electrode G1, N+ type diffusion layer 101 on opposing sides thereof, and P type well PW implement N-channel MOS transistor 21. Gate electrodes G2 to G7, P+ type diffusion layer 100 on opposing sides of each of the former, and N type well NW implement P-channel MOS transistor 1, while gate electrodes G2 to G7, N+ type diffusion layer 101 on opposing sides of each of the former, and P type well PW implement N-channel MOS transistor 4.

A P+ type diffusion layer 102 is formed adjacent to an end portion of P+ type diffusion layer 100 on the gate electrode G1 side, and an N+ type diffusion layer 103 is formed adjacent to an end portion of N+ type diffusion layer 101 on gate electrode G1 side. P+ type diffusion layer 102 implements the anode of diode 22, while N+ type diffusion layer 103 implements the cathode of diode 23. N type well NW implements the cathode of diode 22 and the back gates of P-channel MOS transistors 1, 20. P type well PW implements the anode of diode 23 and the back gates of N-channel MOS transistors 4, 21.

Metal interconnection ML1 is formed above N type well NW, which is connected to metal interconnection ML1 through a contact hole CH, and metal interconnection ML1 receives power supply voltage VDD. Metal interconnection ML2 is formed above P type well PW, which is connected to metal interconnection ML2 through contact hole CH, and metal interconnection ML2 receives ground voltage GND. Metal interconnections ML3 to ML5 are formed above a boundary portion between N type well NW and P type well PW.

P+ type diffusion layer 102 serving as the anode of diode 22 is connected to metal interconnection ML3 through contact hole CH, while N+ type diffusion layer 103 serving as the cathode of diode 23 is connected to metal interconnection ML3 through contact hole CH. Metal interconnection ML3 is connected to gate electrode G1 through a through hole TH, to implement an input node of inverter 11. Charges born by metal interconnection ML3 are released to wells NW, PW through diodes 22, 23.

The source of P-channel MOS transistor 20, that is, P+ type diffusion layer 100 on one side of gate electrode G1, is connected to metal interconnection ML1 through contact hole CH. The drain of P-channel MOS transistor 20, that is, P+ type diffusion layer 100 on the other side of gate electrode G1 is connected to metal interconnection ML4 through contact hole CH.

The source of N-channel MOS transistor 21, that is, N+ type diffusion layer 101 on one side of gate electrode G1, is connected to metal interconnection ML2 through contact hole CH. The drain of N-channel MOS transistor 21, that is, N+ type diffusion layer 101 on the other side of gate electrode G1 is connected to metal interconnection ML4 through contact hole CH. Metal interconnection ML4 is connected to gate electrodes G2 to G7 through hole TH, to implement an output node of inverter 11 and an input node of inverter 14.

The source of P-channel MOS transistor 1, that is, P+ type diffusion layer 100 between gate electrodes G1 and G2, between gate electrodes G3 and G4 and between gate electrodes G5 and G6, and on one side of gate electrode G7 is connected to metal interconnection ML1 through contact hole CH. The drain of P-channel MOS transistor 1, that is, P+ type diffusion layer 100 between gate electrodes G2 and G3, between gate electrodes G4 and G5 and between gate electrodes G6 and G7 is connected to metal interconnection ML5 through contact hole CH.

The source of N-channel MOS transistor 4, that is, N+ type diffusion layer 101 between gate electrodes G1 and G2, between gate electrodes G3 and G4 and between gate electrodes G5 and G6, and on one side of gate electrode G7 is connected to metal interconnection ML2 through contact hole CH. The drain of N-channel MOS transistor 4, that is, N+ type diffusion layer 101 between gate electrodes G2 and G3, between gate electrodes G4 and G5 and between gate electrodes G6 and G7 is connected to metal interconnection ML5 through contact hole CH. Metal interconnection ML5 implements an output node of inverter 14.

Figure 58:
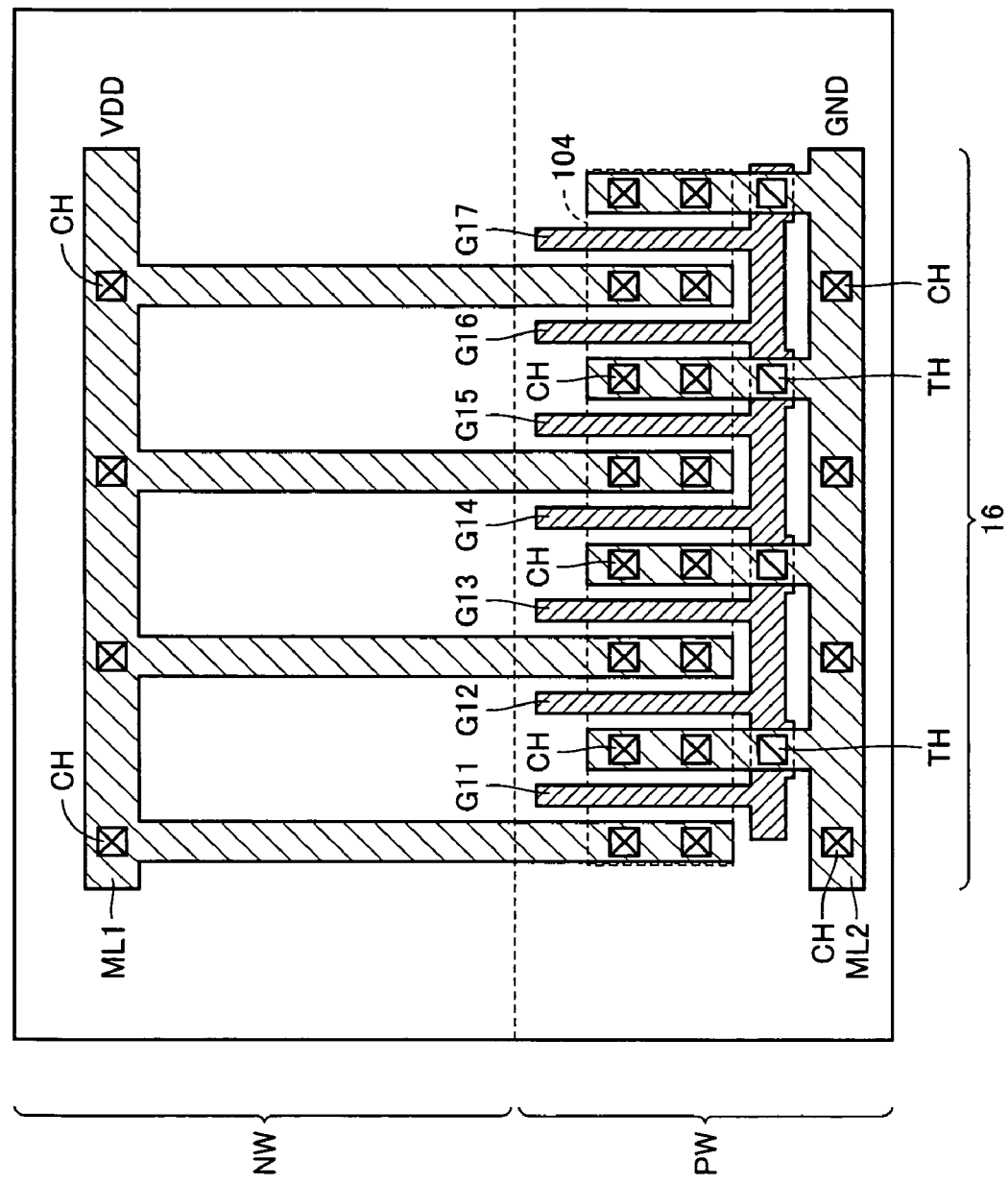
FIG. 58 illustrates a layout of an N-channel MOS transistor shown in FIG. 56.

FIG. 58 illustrates a layout of N-channel MOS transistor 16 serving as the second antenna ratio countermeasure. In FIG. 58, N type well NW and P type well PW are formed adjacent to each other on the surface of the semiconductor substrate. N type well NW and P type well PW in FIG. 58 are formed in a manner continuous to N type well NW and P type well PW in FIG. 57 respectively. A plurality of (seven in FIG. 58) gate electrodes G11 to G17 are formed along the boundary between N type well NW and P type well PW at prescribed pitches on the surface of P type well PW, and end portions of gate electrodes G11 to G17 are commonly connected. An N+ type diffusion layer 104 is formed on the surface of P type well PW using gate electrodes G11 to G17 as a mask. Gate electrodes G11 to G17, N+ type diffusion layer 104 on opposing sides of each of the former, and P type well PW implement N-channel MOS transistor 16. P type well PW implements the back gate of N-channel MOS transistor 16.

Metal interconnection ML1 is formed above N type well NW, which is connected to metal interconnection ML1 through contact hole CH, and metal interconnection ML1 receives power supply voltage VDD. Metal interconnection ML2 is formed above P type well PW, which is connected to metal interconnection ML2 through contact hole CH, and metal interconnection ML2 receives ground voltage GND. Metal interconnections ML1, ML2 in FIG. 58 are connected in a manner continuous to metal interconnections ML1, ML2 in FIG. 57 respectively.

The source of N-channel MOS transistor 16, that is, N+ type diffusion layer 104 on one side of gate electrode G11 and between gate electrodes G12 and G13, between gate electrodes G14 and G15 and between gate electrodes G16 and G17 is connected to metal interconnection ML1 through contact hole CH. The drain of N-channel MOS transistor 16, that is, N+ type diffusion layer 104 between gate electrodes G11 and G12, between gate electrodes G13 and G14 and between gate electrodes G15 and G16, and on one side of gate electrode G17 is connected to metal interconnection ML2 through contact hole CH. End portions of gate electrodes G11 to G17 are connected to metal interconnection ML2 through hole TH.

When wells NW, PW are electrically charged during the plasma process and the voltage between wells NW, PW exceeds a prescribed voltage, N-channel MOS transistor 16 serving as the pull-down off transistor is rendered conductive by punchthrough or breakdown. Accordingly, the voltage between wells NW, PW is lowered, and damage to the gate oxide film in MOS transistors 1, 4, 20, and 21 is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors; and
a switching element connected between said first and second wells and rendered conductive in response to a voltage between said first and second wells exceeding a predetermined voltage,
wherein said switching element includes:
a third transistor of the second conductivity type formed on the surface of said first well, having its gate and first electrode connected to said first well, and having its second electrode connected to said second well, and
a third diode formed on the surface of said first well and interposed between said first well and the first electrode of said third transistor.

2. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors; and
a switching element connected between said first and second wells and rendered conductive in response to a voltage between said first and second wells exceeding a predetermined voltage,
wherein said switching element includes:
a fourth transistor of the first conductivity type formed on the surface of said second well, having its gate and first electrode connected to said second well, and having its second electrode connected to said first well, and
a fourth diode formed on the surface of said second well and interposed between the first electrode of said fourth transistor and said second well.

3. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors; and
a switching element connected between said first and second wells and rendered conductive in response to a voltage between said first and second wells exceeding a predetermined voltage, wherein
a first electrode of said first transistor receives a power supply voltage and a back gate thereof is connected to said first well,
a first electrode of said second transistor receives a ground voltage and a back gate thereof is connected to said second well, and
said first voltage is a first substrate voltage higher than said power supply voltage and said second voltage is a second substrate voltage lower than said ground voltage.

4. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors; and
a switching element connected between said first and second wells and rendered conductive in response to a voltage between said first and second wells exceeding a predetermined voltage, wherein
said first voltage is a power supply voltage and said second voltage is a ground voltage,
a first electrode of said first transistor receives a pseudo power supply voltage lower than said power supply voltage and a back gate thereof is connected to said first well, and
a first electrode of said second transistor receives a pseudo ground voltage higher than said ground voltage and a back gate thereof is connected to said second well.

5. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors; and
a switching element connected between said first and second wells and rendered conductive in response to a voltage between said first and second wells exceeding a predetermined voltage, wherein
said first voltage is a pseudo power supply voltage lower than a power supply voltage,
said second voltage is a pseudo ground voltage higher than a ground voltage, and
a first electrode and a back gate of said first transistor are connected to said first well, and a first electrode and a back gate of said second transistor are connected to said second well.

6. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors;
a switching element connected between said first and second wells and rendered conductive in response to a voltage between said first and second wells exceeding a predetermined voltage; and
a plurality of sets of first and second wells, wherein
a plurality of first wells are electrically connected to each other,
a plurality of second wells are electrically connected to each other, and
said switching element is connected between any one first well out of said plurality of first wells and any one second well out of said plurality of second wells.

7. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a third transistor formed on the surface of said first well, having its first electrode connected to the gates of said first and second transistors, receiving a third voltage equal to or lower than said first voltage at its gate, having its back gate connected to said first well, and having its second electrode connected to said second well;
a first diode formed on the surface of said first well and connected between the first electrode and the back gate of said third transistor;
a fourth transistor formed on the surface of said second well, having its first electrode connected to the gates of said first and second transistors, receiving a fourth voltage equal to or higher than said second voltage at its gate, having its back gate connected to said second well, and having its second electrode connected to said first well; and
a second diode formed on the surface of said second well and connected between the back gate and the second electrode of said fourth transistor.

8. The semiconductor device according to claim 7, wherein
each of said first and third voltages is a power supply voltage and each of said second and fourth voltages is a ground voltage,
a first electrode and a back gate of said first transistor are connected to said first well, and a first electrode and a back gate of said second transistor are connected to said second well.

9. The semiconductor device according to claim 7, wherein
a first electrode of said first transistor receives a power supply voltage and a back gate thereof is connected to said first well,
a first electrode of said second transistor receives a ground voltage and a back gate thereof is connected to said second well, and
said first voltage is a first substrate voltage higher than said power supply voltage, said second voltage is a second substrate voltage lower than said ground voltage, said third voltage is said power supply voltage, and said fourth voltage is said ground voltage.

10. The semiconductor device according to claim 7, wherein
each of said first and third voltages is a power supply voltage and each of said second and fourth voltages is a ground voltage,
a first electrode of said first transistor receives a pseudo power supply voltage lower than said power supply voltage and a back gate thereof is connected to said first well, and
a first electrode of said second transistor receives a pseudo ground voltage higher than said ground voltage and a back gate thereof is connected to said second well.

11. The semiconductor device according to claim 7, wherein
each of said first and third voltages is a pseudo power supply voltage lower than a power supply voltage and each of said second and fourth voltages is a pseudo ground voltage higher than a ground voltage, and a first electrode and a back gate of said first transistor are connected to said first well, and a first electrode and a back gate of said second transistor are connected to said second well.

12. The semiconductor device according to claim 7, wherein
a plurality of sets of said logic circuit, said third transistor, said first diode, said fourth transistor, and said second diode are provided.

13. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a third well of the first conductivity type formed on the surface of said semiconductor substrate and receiving said first voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors;
a third transistor formed on a surface of said third well, having its first electrode connected to said first well, having its gate and back gate connected to said third well, and having its second electrode connected to said second well; and
a third diode formed on the surface of said third well and connected between the first electrode and the back gate of said third transistor.

14. The semiconductor device according to claim 13, further comprising:
a fourth well of the second conductivity type formed on the surface of said semiconductor substrate and receiving said second voltage;
a fourth transistor formed on a surface of said fourth well, having its first electrode connected to said first well, having its gate and back gate connected to said fourth well, and having its second electrode connected to said second well; and
a fourth diode formed on the surface of said fourth well and connected between the back gate and the second electrode of said third transistor.

15. The semiconductor device according to claim 13, wherein
said first voltage is a power supply voltage and said second voltage is a ground voltage, and
a first electrode and a back gate of said first transistor are connected to said first well, and a first electrode and a back gate of said second transistor are connected to said second well.

16. The semiconductor device according to claim 13, wherein
a first electrode of said first transistor receives a power supply voltage and a back gate thereof is connected to said first well,
a first electrode of said second transistor receives the ground voltage and a back gate thereof is connected to said second well, and
said first voltage is a first substrate voltage higher than said power supply voltage and said second voltage is a second substrate voltage lower than said ground voltage.

17. The semiconductor device according to claim 13, wherein
said first voltage is a power supply voltage and said second voltage is a ground voltage,
a first electrode of said first transistor receives a pseudo power supply voltage lower than said power supply voltage and a back gate thereof is connected to said first well, and
a first electrode of said second transistor receives a pseudo ground voltage higher than said ground voltage and a back gate thereof is connected to said second well.

18. The semiconductor device according to claim 13, wherein
said first voltage is a pseudo power supply voltage lower than a power supply voltage,
said second voltage is a pseudo ground voltage higher than a ground voltage, and
a first electrode and a back gate of said first transistor are connected to said first well, and a first electrode and a back gate of said second transistor are connected to said second well.

19. The semiconductor device according to claim 13, wherein
said first and second wells are electrically isolated from said third well until a metal layer is stacked.

20. The semiconductor device according to claim 13, wherein
said third well is connected to a metal interconnection above said first and second wells.

21. The semiconductor device according to claim 13, wherein
a plurality of sets of said logic circuit, said first diode and said second diode are provided.

22. A semiconductor device comprising:
a first well of a first conductivity type formed on a surface of a semiconductor substrate and receiving a first voltage;
a second well of a second conductivity type formed on the surface of said semiconductor substrate and receiving a second voltage;
a third well of the second conductivity type formed on the surface of said semiconductor substrate and receiving said second voltage;
a logic circuit including a first transistor of the second conductivity type formed on a surface of said first well and receiving an input signal at its gate and a second transistor of the first conductivity type formed on a surface of said second well and having its gate connected to the gate of said first transistor;
a first diode formed on the surface of said first well and connected between the gates of said first and second transistors and said first well;
a second diode formed on the surface of said second well and connected between said second well and the gates of said first and second transistors;
a third transistor formed on a surface of said third well, having its first electrode connected to said first well, having its gate and back gate connected to said third well, and having its second electrode connected to said second well; and a third diode formed on the surface of said third well and connected between the back gate and the second electrode of said third transistor.

23. The semiconductor device according to claim 22, wherein
said first voltage is a power supply voltage and said second voltage is a ground voltage, and
a first electrode and a back gate of said first transistor are connected to said first well, and a first electrode and a back gate of said second transistor are connected to said second well.

24. The semiconductor device according to claim 22, wherein
a first electrode of said first transistor receives a power supply voltage and a back gate thereof is connected to said first well,
a first electrode of said second transistor receives a ground voltage and a back gate thereof is connected to said second well, and
said first voltage is a first substrate voltage higher than said power supply voltage and said second voltage is a second substrate voltage lower than said ground voltage.

25. The semiconductor device according to claim 22, wherein
said first voltage is a power supply voltage and said second voltage is a ground voltage,
a first electrode of said first transistor receives a pseudo power supply voltage lower than said power supply voltage and a back gate thereof is connected to said first well, and
a first electrode of said second transistor receives a pseudo ground voltage higher than said ground voltage and a back gate thereof is connected to said second well.

26. The semiconductor device according to claim 22, wherein
said first voltage is a pseudo power supply voltage lower than a power supply voltage,
said second voltage is a pseudo ground voltage higher than a ground voltage, and
a first electrode and a back gate of said first transistor are connected to said first well, and a first electrode and a back gate of said second transistor are connected to said second well.

27. The semiconductor device according to claim 22, wherein
said first and second wells are electrically isolated from said third well until a metal layer is stacked.

28. The semiconductor device according to claim 22, wherein
said third well is connected to a metal interconnection above said first and second wells.

29. The semiconductor device according to claim 22, wherein
a plurality of sets of said logic circuit, said first diode and said second diode are provided.

* * * * *